(12) United States Patent
Yamazaki

(10) Patent No.: US 11,081,502 B2
(45) Date of Patent: Aug. 3, 2021

(54) SEMICONDUCTOR DEVICE AND METHOD FOR MANUFACTURING THE SAME

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/676,641

(22) Filed: Nov. 7, 2019

(65) Prior Publication Data

US 2020/0075637 A1    Mar. 5, 2020

Related U.S. Application Data

(60) Continuation of application No. 15/235,642, filed on Aug. 12, 2016, now abandoned, which is a division of
(Continued)

(30) Foreign Application Priority Data

Jan. 26, 2012 (JP) ................................ 2012-013730
Jan. 26, 2012 (JP) ................................ 2012-014507

(51) Int. Cl.
  *H01L 27/12*    (2006.01)
  *H01L 29/786*   (2006.01)
  (Continued)

(52) U.S. Cl.
  CPC .... *H01L 27/1229* (2013.01); *H01L 21/02565* (2013.01); *H01L 21/02672* (2013.01);
  (Continued)

(58) Field of Classification Search
  CPC ................................................. H01L 27/1255
  See application file for complete search history.

(56) References Cited

U.S. PATENT DOCUMENTS 5,477,073 A   12/1995  Wakai et al.
5,528,032 A    6/1996  Uchiyama
(Continued)

FOREIGN PATENT DOCUMENTS

CN   102315277 A    1/2012
EP     1737044 A   12/2006
(Continued)

OTHER PUBLICATIONS

Yamazaki et al., "Development of 4.0-in. AMOLED Display with Driver Circuit using Amorphous In—Ga—Zn-Oxide TFTs", IDW'09: Proceedings of the 16th International Display Workshops, 2009, pp. 689-692 (Year: 2009).*

(Continued)

*Primary Examiner* — Vincent Wall
(74) *Attorney, Agent, or Firm* — Robinson Intellectual Property Law Office; Eric J. Robinson

(57) ABSTRACT

A region containing a high proportion of crystal components and a region containing a high proportion of amorphous components are formed separately in one oxide semiconductor film. The region containing a high proportion of crystal components is formed so as to serve as a channel formation region and the other region is formed so as to contain a high proportion of amorphous components. It is preferable that an oxide semiconductor film in which a region containing a high proportion of crystal components and a region containing a high proportion of amorphous components are mixed in a self-aligned manner be formed. To separately form the regions which differ in crystallinity in the oxide semiconductor film, first, an oxide semiconductor film containing a high proportion of crystal components is formed and then process for performing amorphization on part of the oxide semiconductor film is conducted.

10 Claims, 24 Drawing Sheets

Related U.S. Application Data application No. 13/746,793, filed on Jan. 22, 2013, now Pat. No. 9,419,146.

(51) Int. Cl.
| | |
|---|---|
| *H01L 29/66* | (2006.01) |
| *H01L 27/146* | (2006.01) |
| *H01L 29/417* | (2006.01) |
| *H01L 21/02* | (2006.01) |
| *H01L 29/04* | (2006.01) |
| *H01L 29/08* | (2006.01) |
| *H01L 29/24* | (2006.01) |
| *H01L 27/1156* | (2017.01) |

(52) U.S. Cl.
CPC .... *H01L 27/1225* (2013.01); *H01L 27/14632* (2013.01); *H01L 27/14687* (2013.01); *H01L 29/04* (2013.01); *H01L 29/0847* (2013.01); *H01L 29/24* (2013.01); *H01L 29/41733* (2013.01); *H01L 29/66742* (2013.01); *H01L 29/66969* (2013.01); *H01L 29/7869* (2013.01); *H01L 29/78693* (2013.01); *H01L 27/1156* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,322,849 B2 | 11/2001 | Joshi et al. |
| 6,563,174 B2 | 5/2003 | Kawasaki et al. |
| 6,674,106 B2 | 1/2004 | Tanaka et al. |
| 6,727,522 B1 | 4/2004 | Kawasaki et al. |
| 6,762,802 B2 | 7/2004 | Ono et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,445,953 B2 | 11/2008 | Lu et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,674,650 B2 | 3/2010 | Akimoto et al. |
| 7,692,194 B2 | 4/2010 | Yamazaki et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 7,993,964 B2 | 8/2011 | Hirao et al. |
| 8,003,981 B2 | 8/2011 | Iwasaki et al. |
| 8,237,166 B2 | 8/2012 | Kumomi et al. |
| 8,242,837 B2 | 8/2012 | Yamazaki et al. |
| 8,253,135 B2 | 8/2012 | Uochi et al. |
| 8,274,077 B2 | 9/2012 | Akimoto et al. |
| 8,293,661 B2 | 10/2012 | Yamazaki |
| 8,319,218 B2 | 11/2012 | Yamazaki et al. |
| 8,338,827 B2 | 12/2012 | Yamazaki et al. |
| 8,350,261 B2 | 1/2013 | Sakata et al. |
| 8,384,076 B2 | 2/2013 | Park et al. |
| 8,421,083 B2 | 4/2013 | Yamazaki et al. |
| 8,441,425 B2 | 5/2013 | Ishitani et al. |
| 8,476,719 B2 | 7/2013 | Endo et al. |
| 8,492,764 B2 | 7/2013 | Yamazaki et al. |
| 8,502,225 B2 | 8/2013 | Yamazaki et al. |
| 8,546,225 B2 | 10/2013 | Yamazaki |
| 8,558,233 B2 | 10/2013 | Yamazaki |
| 8,624,650 B2 | 1/2014 | Ishii |
| 8,629,438 B2 | 1/2014 | Yamazaki |
| 8,669,556 B2 | 3/2014 | Yamazaki et al. |
| 8,680,529 B2 | 3/2014 | Kimura |
| 8,685,803 B2 | 4/2014 | Chikama et al. |
| 8,759,829 B2 | 6/2014 | Uochi et al. |
| 8,760,046 B2 | 6/2014 | Seo et al. |
| 8,772,768 B2 | 7/2014 | Yamazaki |
| 8,795,554 B2 | 8/2014 | Yano et al. |
| 8,803,768 B2 | 8/2014 | Kimura et al. |
| 8,872,171 B2 | 10/2014 | Yamazaki et al. |
| 8,937,306 B2 | 1/2015 | Yamazaki et al. |
| 9,029,191 B2 | 5/2015 | Yamazaki et al. |
| 9,040,989 B2 | 5/2015 | Yamazaki |
| 9,059,694 B2 | 6/2015 | Ishii |
| 9,099,498 B2 | 8/2015 | Yamazaki |
| 9,142,648 B2 | 9/2015 | Yamazaki |
| 9,184,189 B2 | 11/2015 | Uochi et al. |
| 9,287,407 B2 | 3/2016 | Koezuka et al. |
| 9,306,072 B2 | 4/2016 | Yamazaki et al. |
| 9,478,597 B2 | 10/2016 | Yamazaki et al. |
| 9,595,600 B2 | 3/2017 | Yamazaki et al. |
| 9,601,602 B2 | 3/2017 | Yamazaki |
| 9,947,797 B2 | 4/2018 | Yamazaki et al. |
| 10,418,466 B2 | 9/2019 | Yamazaki et al. |
| 10,546,529 B2 | 1/2020 | Kimura et al. |
| 2001/0046027 A1 | 11/2001 | Tai et al. |
| 2002/0045302 A1 | 4/2002 | Zhang et al. |
| 2002/0056838 A1 | 5/2002 | Ogawa |
| 2002/0132454 A1 | 9/2002 | Ohtsu et al. |
| 2003/0124821 A1 | 7/2003 | Robertson |
| 2003/0132900 A1* | 7/2003 | Yamauchi .......... H01L 27/1251 345/76 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0232421 A1 | 11/2004 | Ono et al. |
| 2005/0007507 A1 | 1/2005 | Ono et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152921 A1 | 7/2007 | Osame |
| 2007/0159568 A1 | 7/2007 | Ono et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |

(56) References Cited

U.S. PATENT DOCUMENTS

| | | |
|---|---|---|
| 2007/0272922 A1 | 11/2007 | Kim et al. |
| 2007/0278490 A1 | 12/2007 | Hirao et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0119018 A1 | 5/2008 | Toyota et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0057674 A1 | 3/2009 | Jeong et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0102312 A1* | 4/2010 | Yamazaki ............ H01L 29/7869 257/43 |
| 2010/0109002 A1 | 5/2010 | Itagaki et al. |
| 2010/0134397 A1* | 6/2010 | Ishitani ............. G02F 1/133514 345/92 |
| 2010/0136743 A1 | 6/2010 | Akimoto et al. |
| 2010/0224880 A1* | 9/2010 | Kimura ............... H01L 27/1225 257/59 |
| 2010/0295042 A1 | 11/2010 | Yano et al. |
| 2011/0012117 A1* | 1/2011 | Yamazaki ............ H01L 29/7869 257/59 |
| 2011/0057918 A1 | 3/2011 | Kimura et al. |
| 2011/0062436 A1 | 3/2011 | Yamazaki et al. |
| 2011/0095288 A1 | 4/2011 | Morosawa et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0127521 A1 | 6/2011 | Yamazaki |
| 2011/0127523 A1 | 6/2011 | Yamazaki |
| 2011/0133191 A1 | 6/2011 | Yamazaki |
| 2011/0163311 A1 | 7/2011 | Akimoto et al. |
| 2011/0180392 A1 | 7/2011 | Yano et al. |
| 2011/0182110 A1 | 7/2011 | Yamazaki et al. |
| 2011/0210355 A1 | 9/2011 | Yamazaki et al. |
| 2011/0215328 A1 | 9/2011 | Morosawa et al. |
| 2011/0256684 A1 | 10/2011 | Iwasaki et al. |
| 2011/0263083 A1 | 10/2011 | Yamazaki |
| 2011/0284846 A1 | 11/2011 | Endo et al. |
| 2011/0284848 A1 | 11/2011 | Yamazaki |
| 2012/0001167 A1 | 1/2012 | Morosawa |
| 2012/0132905 A1 | 5/2012 | Yamazaki |
| 2012/0161121 A1 | 6/2012 | Yamazaki |
| 2012/0161122 A1 | 6/2012 | Yamazaki |
| 2012/0161124 A1 | 6/2012 | Yamazaki |
| 2012/0194262 A1 | 8/2012 | Uochi |
| 2012/0235137 A1 | 9/2012 | Koezuka et al. |
| 2012/0241737 A1 | 9/2012 | Imoto et al. |
| 2012/0241738 A1 | 9/2012 | Imoto et al. |
| 2012/0256177 A1 | 10/2012 | Yamazaki |
| 2012/0256178 A1 | 10/2012 | Yamazaki |
| 2012/0256179 A1 | 10/2012 | Yamazaki et al. |
| 2013/0193432 A1 | 8/2013 | Yamazaki |
| 2014/0346506 A1 | 11/2014 | Kimura et al. |
| 2015/0295093 A1 | 10/2015 | Yamazaki |
| 2017/0040409 A1 | 2/2017 | Yamazaki et al. |
| 2020/0006534 A1 | 1/2020 | Yamazaki et al. |
| 2020/0160786 A1 | 5/2020 | Kimura et al. |

FOREIGN PATENT DOCUMENTS

| | | |
|---|---|---|
| EP | 1918904 A | 5/2008 |
| EP | 2120267 A | 11/2009 |
| EP | 2226847 A | 9/2010 |
| EP | 2256814 A | 12/2010 |
| EP | 2408011 A | 1/2012 |
| EP | 2511896 A | 10/2012 |
| EP | 2544237 A | 1/2013 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-324725 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2007-250983 A | 9/2007 |
| JP | 2008-129314 A | 6/2008 |
| JP | 2008-134625 A | 6/2008 |
| JP | 2009-278115 A | 11/2009 |
| JP | 2010-073881 A | 4/2010 |
| JP | 2010-098304 A | 4/2010 |
| JP | 2010-212673 A | 9/2010 |
| JP | 2010-258348 A | 11/2010 |
| JP | 2011-009719 A | 1/2011 |
| JP | 2011-049539 A | 3/2011 |
| JP | 2011-086923 A | 4/2011 |
| JP | 2011-091379 A | 5/2011 |
| JP | 2011-100979 A | 5/2011 |
| JP | 2011-135066 A | 7/2011 |
| JP | 2011-142310 A | 7/2011 |
| JP | 2011-151791 A | 8/2011 |
| JP | 2011-187506 A | 9/2011 |
| JP | 2011-243975 A | 12/2011 |
| JP | 2012-009838 A | 1/2012 |
| JP | 2012-009843 A | 1/2012 |
| JP | 2012-235139 A | 11/2012 |
| KR | 2010-0092882 A | 8/2010 |
| KR | 2010-0108215 A | 10/2010 |
| KR | 2011-0015380 A | 2/2011 |
| TW | 434750 | 5/2001 |
| TW | 200802736 | 1/2008 |
| TW | 200840028 | 10/2008 |
| TW | 201301520 | 1/2013 |
| WO | WO-2000/030161 | 5/2000 |
| WO | WO-2004/114391 | 12/2004 |
| WO | WO-2007/142167 | 12/2007 |
| WO | WO-2009/034953 | 3/2009 |
| WO | WO-2009/093625 | 7/2009 |
| WO | WO-2009/157535 | 12/2009 |

(56) References Cited

FOREIGN PATENT DOCUMENTS

| WO | WO-2010/001783 | 1/2010 |
|---|---|---|
| WO | WO-2010/032629 | 3/2010 |
| WO | WO-2011/013596 | 2/2011 |
| WO | WO-2011/033936 | 3/2011 |
| WO | WO-2011/037213 | 3/2011 |
| WO | WO-2011/043176 | 4/2011 |
| WO | WO-2011/070900 | 6/2011 |
| WO | WO-2011/070981 | 6/2011 |
| WO | WO-2011/077908 | 6/2011 |
| WO | WO-2011/132591 | 10/2011 |
| WO | WO-2011/145632 | 11/2011 |
| WO | WO-2012/090799 | 7/2012 |

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Kamiya.T et al., "Material Characteristics and Applications of Transparent Amorphous Oxide Semiconductors", NPG Asia Materials, 2010, vol. 2, No. 1, pp. 15-22.

Kamiya.T et al., "Origins of High Mobility and Low Operation Voltage of Amorphous Oxide TFTs: Electronic Structure, Electron Transport, Defects and Doping", Journal of Display Technology, Jul. 1, 2009, vol. 5, No. 7, pp. 273-288.

Omura.H et al., "First-principles study of native point defects in crystalline indium gallium zinc oxide", J. Appl. Phys. (Journal of Applied Physics) , 2009, vol. 105, pp. 093712-1-093712-8.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Taiwanese Office Action (Application No. 102102650) dated Dec. 30, 2016.

Sugisawa.N et al., "49.4: High-definition Top-emitting AMOLED Display with Highly Reliable Oxide Semiconductor Field Transistors", SID Digest '11 : SID International Symposium Digest of Technical Papers, Jun. 1, 2011, vol. 42, No. 1, pp. 722-725, John Wiley & Sons.

(56) References Cited

OTHER PUBLICATIONS

Taiwanese Office Action (Application No. 106122057) dated Feb. 7, 2018.
Taiwanese Office Action (Application No. 109116573) dated Sep. 28, 2020.

* cited by examiner

FIG. 9A
Model A
FIG. 9B
Model B
FIG. 9C
Model C
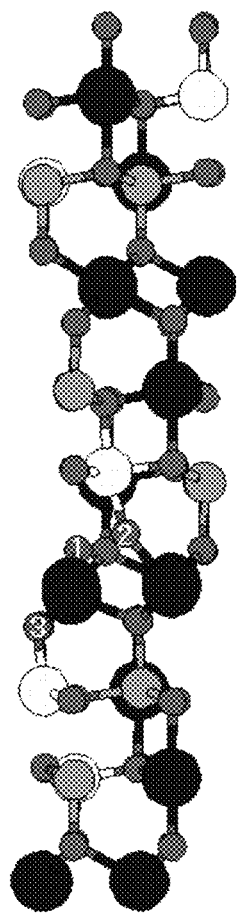
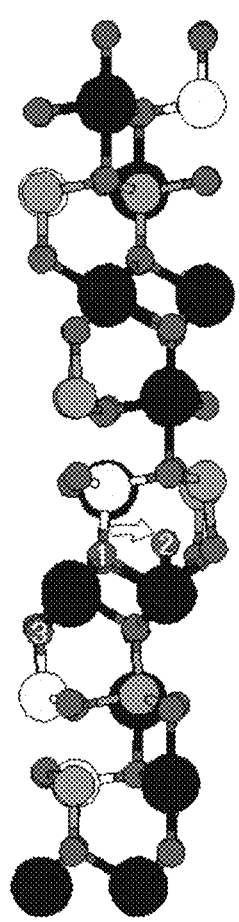
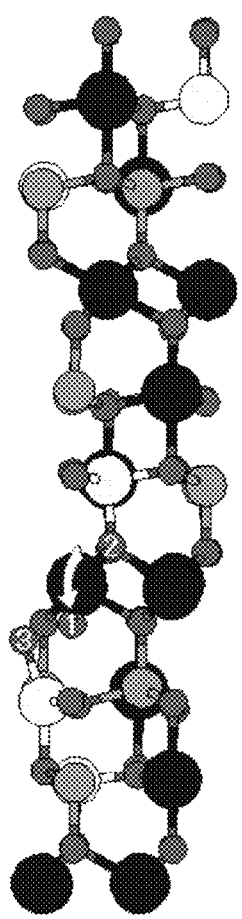
In: ● Ga: ○ Zn: ● O: ●

FIG. 11A Model A 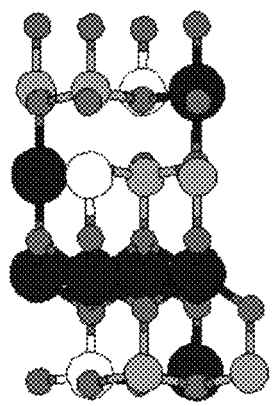
FIG. 11B Model B 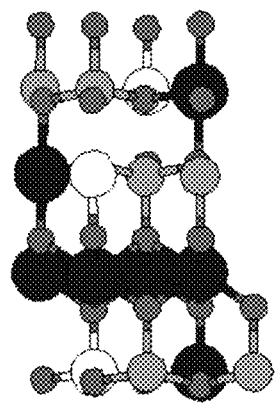
FIG. 11C Model C 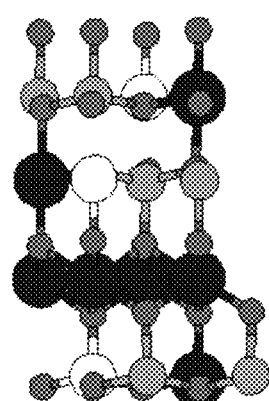
In: ● Ga: ○ Zn: ● O: ●

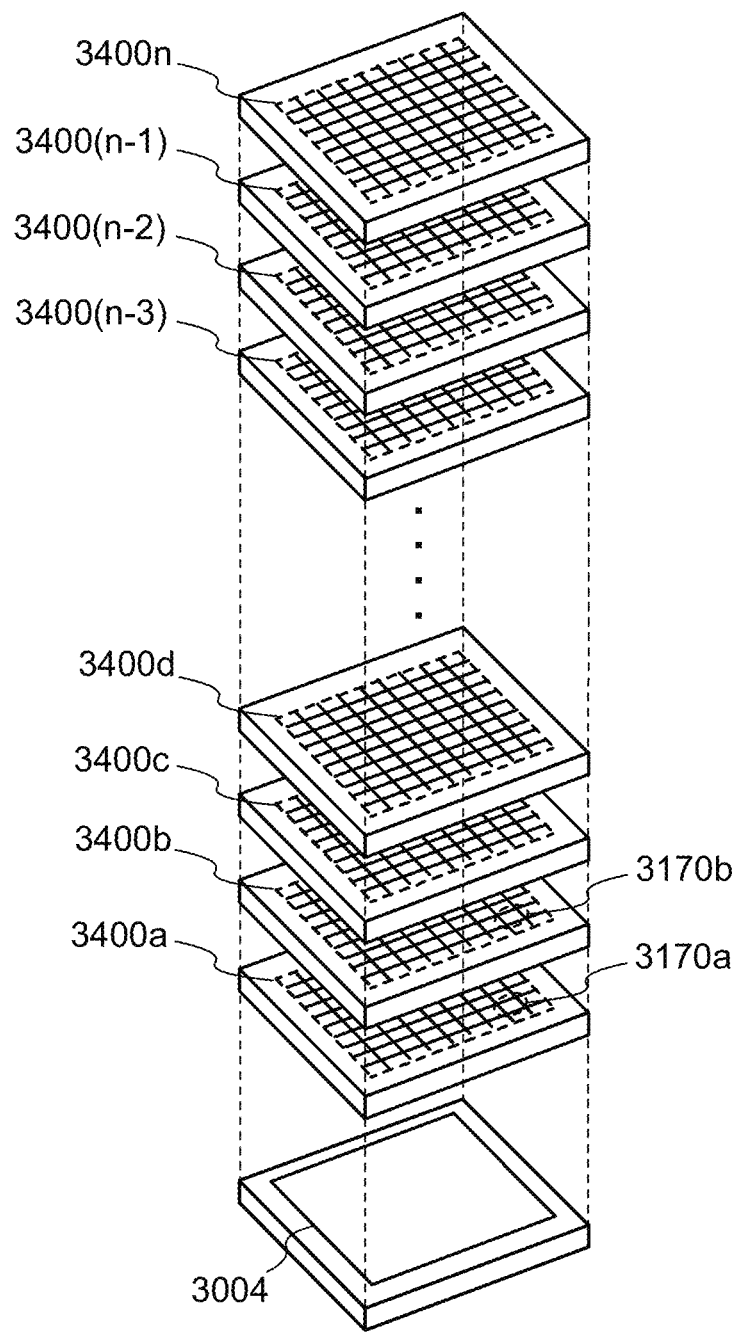

SEMICONDUCTOR DEVICE AND METHOD FOR MANUFACTURING THE SAME

BACKGROUND OF THE INVENTION

1. Field of the Invention

The present invention relates to a transistor and a method for manufacturing the transistor. In particular, the present invention relates to a transistor in which a channel is formed in an oxide semiconductor layer and a method for manufacturing the transistor. In addition, the present invention relates to a semiconductor device including the transistor.

The invention disclosed in this specification includes in its scope an element formed using a compound semiconductor, in addition to that formed using a silicon semiconductor, as a component of a semiconductor integrated circuit, and discloses an element formed using a wide-gap semiconductor as an example.

In this specification, a semiconductor device generally means a device which can function by utilizing semiconductor characteristics, and an electrooptic device, a semiconductor circuit, and electronic equipment are all semiconductor devices.

2. Description of the Related Art

Electronic devices and optical devices are manufactured using transistors including silicon. Other than a transistor formed using silicon, in recent years, a technique in which a transistor is formed using an oxide semiconductor and applied to an electronic device or an optical device has attracted attention.

In an active matrix liquid crystal display device, a transistor is provided in each pixel. Such transistors are mostly formed using amorphous silicon, polycrystalline silicon, or the like. Note that a transistor formed using amorphous silicon can be applied to a large-sized liquid crystal display device although the transistor has low field-effect mobility. In contrast, it is difficult to apply a transistor formed using polycrystalline silicon to a large-sized liquid crystal display device although the transistor has high field-effect mobility.

As an alternative material of a transistor to a silicon-based material, an oxide semiconductor has attracted attention. This is because a transistor which is formed using an oxide semiconductor has higher field-effect mobility than a transistor which is formed using amorphous silicon and is applicable to a large-sized liquid crystal display device. For example, Patent Document 1 and Patent Document 2 disclose a technique by which a transistor is manufactured using zinc oxide or an In—Ga—Zn—O-based oxide, which is an oxide semiconductor, and is used as a switching element of a pixel or the like of a display device.

Patent Document 3 discloses a transistor including a stack of oxide semiconductor films in which an amorphous component remains at an interface with a base.

Note that it is difficult to control the threshold voltage of the transistor formed using an oxide semiconductor. Specifically, in an oxide semiconductor, part of hydrogen serves as a donor to release electrons as carriers. Then, the carrier density of the oxide semiconductor is increased, so that a channel is formed in the oxide semiconductor even without application of voltage between the gate and the source of the transistor. In other words, the threshold voltage of the transistor shifts in the negative direction.

When the threshold voltage of the transistor is high or negative even when the field effect mobility is high, it is difficult to control a circuit including the transistor. In the case where a transistor has a large threshold voltage value and a large absolute value of the threshold voltage, the transistor cannot perform a switching function as a transistor and might be a load when a transistor is driven at low voltage. Further, when the threshold voltage value is on the minus side, current tends to flow between the source and drain electrodes even if the gate voltage is 0 V, that is, the transistor tends to be normally on.

In the case of an n-channel transistor, it is desirable that only after a positive voltage is applied to a gate electrode, a channel be formed and a drain current flows. A transistor in which a channel is not formed unless the driving voltage is increased and a transistor in which a channel is formed and drain current flows even in the case of the negative voltage state are unsuitable for a transistor used for a circuit.

Note that it is difficult to completely remove hydrogen contained in the oxide semiconductor. Therefore, the control of the threshold voltage of the transistor formed using an oxide semiconductor is more difficult than that of the threshold voltage of the transistor formed using a silicon-based material.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-135066

SUMMARY OF THE INVENTION

In view of the above problems, an object of one embodiment of the present invention is to reduce variations in the electrical characteristics of a transistor including an oxide semiconductor and stabilize the electrical characteristics. Another object of one embodiment of the present invention is to improve the reliability of a semiconductor device.

A main point of one embodiment of the present invention is to form a transistor using an oxide semiconductor layer including regions which differ in crystallinity. Specifically, a transistor is formed using an oxide semiconductor layer in which the proportion of a crystal region in a channel formation region is higher than that of a crystal region in the other region.

For example, one embodiment of the present invention is a transistor including a gate layer, a gate insulating layer provided over the gate layer, an oxide semiconductor layer provided over the gate insulating layer, a source electrode layer and a drain electrode layer which are provided over the oxide semiconductor layer to be apart from each other, and an etching-stop layer which is a region over the oxide semiconductor layer and provided between the source electrode layer and the drain electrode layer. The proportion of a crystal region in a first region of the oxide semiconductor layer which overlaps with an interface between the oxide semiconductor layer and the etching-stop layer is higher than the proportion of a crystal region of a second region of the oxide semiconductor layer which overlaps with an interface between the oxide semiconductor layer and the source electrode layer or the drain electrode layer.

In the transistor having the above structure, the proportion of the crystal region in the first region (channel formation region) is higher than that of the crystal region in the second region (the other region of the oxide semiconductor layer). In other words, the defect density of the first region is lower than that of the second region. A defect included in the oxide semiconductor layer is likely to become a trap site of an impurity contained in the oxide semiconductor layer. Therefore, in the transistor of one embodiment of the present invention, diffusion of an impurity such as hydrogen from the first region to the second region is likely to occur, whereas diffusion in the reverse direction (diffusion of an impurity such as hydrogen from the second region to the first region) is less likely to occur. As a result, in the transistor of one embodiment of the present invention, the concentration of the impurity such as hydrogen in the channel formation region is reduced, which makes it possible to stabilize electrical characteristics and improve reliability.

Another embodiment of the present invention is a semiconductor device including an oxide semiconductor layer, a gate insulating film over the oxide semiconductor layer, and a gate electrode layer over the gate insulating film. The oxide semiconductor layer includes a first region, a second region, and a third region; the first region overlaps with the gate electrode layer; the first region is positioned between the second region and the third region; the proportion of a crystal component is higher than the proportion of an amorphous component in the first region; the proportion of an amorphous component is higher than the proportion of a crystal portion in each of the second region and third region; and the hydrogen concentration of each of the second region and the third region is higher than the hydrogen concentration of the first region.

In the above structure, a region containing a high proportion of crystal components and a region containing a high proportion of amorphous components are formed separately in a pattern of one oxide semiconductor layer. The region containing a high proportion of crystal components is formed so as to serve as a channel formation region and the other region is formed so as to contain a high proportion of amorphous components. It is preferable that an oxide semiconductor film in which a region containing a high proportion of crystal components and a region containing a high proportion of amorphous components are mixed in a self-aligned manner be formed.

In the above structure, the second region or the third region is electrically connected to the source electrode layer or the drain electrode layer and has higher conductivity than the first region serving as the channel formation region.

It is preferable that the oxide semiconductor film in the region serving as the channel formation region contain a high proportion of crystal components and the c-axes of the crystal components be aligned in a direction which is parallel to a normal vector of a surface where the oxide semiconductor film is formed. When the oxide semiconductor film contains a high proportion of crystal components, the bonding state between a metal atom and an oxygen atom in the region serving as the channel formation region is ordered and generation of oxygen vacancies can be suppressed.

It is known that, besides the oxygen vacancies, electrons which are carriers are generated by hydrogen in the oxide semiconductor film. Therefore, it is preferable to also reduce the hydrogen in the oxide semiconductor film in the region serving as the channel formation region.

The region containing a high proportion of amorphous components is formed in at least part of the oxide semiconductor film containing crystal components, and hydrogen is attracted to and captured in the region containing a high proportion of amorphous components (such action can also be called intrinsic gettering), so that the hydrogen concentration of the region serving as the channel formation region is reduced to be lower than that of the region containing a high proportion of amorphous components. The hydrogen is stabilized by being diffused to and captured in the region containing a high proportion of amorphous components.

The transistor including the oxide semiconductor film including the channel formation region whose minor carrier density is extremely small and in which sources of the generation of carriers, such as oxygen vacancies and hydrogen, are reduced can have extremely low off-state current.

Note that in this specification, "hydrogen" refers to a hydrogen atom, and, for example, includes hydrogen contained in a hydrogen molecule, hydrocarbon, hydroxyl, water, and the like in the expression "including hydrogen".

When hydrogen is added to the oxide semiconductor film, the conductivity of the oxide semiconductor film is increased. Therefore, since the region containing a high proportion of amorphous components contains a larger amount of hydrogen than the region containing a high proportion of crystal components, the region containing a high proportion of amorphous components has higher conductivity than the region containing a high proportion of crystal components.

To separately form the region containing a high proportion of crystal components and the region containing a high proportion of amorphous components in the oxide semiconductor film, first, an oxide semiconductor film containing a high proportion of crystal components is formed and then process for performing amorphization on part of the oxide semiconductor film is conducted.

The oxide semiconductor film containing a high proportion of crystal components can be formed under such a condition that, for example, a temperature of a deposition target substrate is set to 200° C. or higher. Even when the temperature of the deposition target substrate is set lower than 200° C., heat treatment at 200° C. or higher is performed after the formation of the oxide semiconductor film, whereby the oxide semiconductor film containing a high proportion of crystal components can be obtained. Note that shortly after the oxide semiconductor film is deposited, it is preferable that the oxide semiconductor film contain oxygen in a proportion higher than that of oxygen in the stoichiometric composition, i.e., the oxide semiconductor film be supersaturated. Therefore, the deposition is preferably performed in the state where the proportion of oxygen in the sputtering gas is large, and further preferably, the deposition is performed in an oxygen atmosphere (an oxygen gas: 100%).

In the process for forming the oxide semiconductor film containing a high proportion of crystal components, a process in which impurities such as copper, aluminum, and chlorine are not mixed or attached to the surface of the oxide semiconductor film is preferably selected as appropriate. In the case where these impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment).

A method for manufacturing a semiconductor device is one embodiment of the present invention. The method for manufacturing a semiconductor device includes the steps of forming an oxide semiconductor layer containing a crystal component having a c-axis substantially perpendicular to a top surface of the oxide semiconductor layer, forming a gate insulating film over the oxide semiconductor layer, forming a gate electrode layer over the gate insulating film, performing amorphization on part of the oxide semiconductor layer using the gate electrode layer as a mask, and forming a source electrode layer and a drain electrode layer in contact with the amorphized part.

As one kind of process for performing amorphization on part of the oxide semiconductor film, addition of an element, specifically, a rare gas such as argon, oxygen, or a dopant may be performed using an ion implantation apparatus or an ion plasma apparatus. With the use of an ion implantation apparatus or an ion plasma apparatus, even when an insulating layer or the like covers the oxide semiconductor film, argon, oxygen, or a dopant can be added to the oxide semiconductor film through the insulating layer, so that part of the oxide semiconductor film can be made amorphous.

As one kind of process for performing amorphization on part of the oxide semiconductor film, exposure to argon plasma or oxygen plasma may be performed. Another embodiment of the present invention is a method for manufacturing a semiconductor device, including the steps of forming an oxide semiconductor layer containing a crystal component having a c-axis substantially perpendicular to a top surface of the oxide semiconductor layer, forming a gate insulating film over the oxide semiconductor layer, forming a gate electrode layer over the gate insulating film, partly exposing a region of the oxide semiconductor layer which overlaps with the gate insulating film, performing amorphization on the exposed region of the oxide semiconductor layer, and forming a source electrode layer and a drain electrode layer in contact with the amorphized region.

In the case where part of the oxide semiconductor film is exposed to argon plasma or oxygen plasma to be made amorphous, only the vicinity of an exposed surface of the oxide semiconductor film is made amorphous, and crystal components remains under the region. When the thickness of the oxide semiconductor film is small, the exposed region becomes the region containing a high proportion of amorphous components, whereas in the case where the thickness of a part to be made amorphous is small and the thickness of the oxide semiconductor film is large, only a surface layer is made amorphous and the other region is a region containing a high proportion of crystal components. Note that the region exposed to the plasma has a higher proportion of amorphous components than the region which is not exposed to the plasma (e.g., the channel formation region), has a low proportion of crystal components, and can function as a source or a drain region.

In the case where heat treatment is performed after the process for performing amorphization on part of the oxide semiconductor film, recrystallization is performed and thus the crystallinity is increased. However, the recrystallized region has lower crystallinity than the channel formation region. This feature is one embodiment of the present invention. The embodiment of the present invention is a semiconductor device including an oxide semiconductor layer, a gate insulating film over the oxide semiconductor layer, and a gate electrode layer over the gate insulating film. The oxide semiconductor layer includes a first region, a second region, and a third region; the first region overlaps with the gate electrode layer; the first region is positioned between the second region and the third region; and the crystallinity of the first region is higher than the crystallinity of each of the second region and the third region.

In the above structure, the second region or the third region is electrically connected to the source electrode layer or the drain electrode layer, part of the second region or the third region in the vicinity of an interface between the second region or the third region and the source electrode layer or the drain electrode layer is amorphous, and the hydrogen concentration of the part of the second region or the third region in the vicinity of the interface is higher than that of the first region.

As one kind of process for performing amorphization on part of the oxide semiconductor film, sputtering with high electric power may be performed. For example, at the time of depositing a conductive film for forming a wiring over and in contact with the part of the oxide semiconductor film, sputtering is performed so that the part of the oxide semiconductor film is made amorphous. In this case, the part of the oxide semiconductor film can be made amorphous depending on deposition conditions of the conductive film, and thus the part of the oxide semiconductor film can be made amorphous without an increase in the number of steps.

In addition, by the process for performing amorphization on the part of the oxide semiconductor film, more oxygen vacancies exist in the region containing a high proportion of amorphous components than in the region containing a high proportion of crystal components. The oxygen vacancies are reduced in such a manner that an insulating layer containing an excess oxygen atom is provided over or under the oxide semiconductor film and oxygen is diffused into the oxide semiconductor film by heat treatment or the like.

In addition, the density of the region containing a high proportion of crystal components of the oxide semiconductor film is higher than 6.0 g/cm$^3$ and lower than 6.375 g/cm$^3$. In the film having low film density, a large amount of oxygen or hydrogen is diffused.

Note that a value of density of 6.375 g/cm$^3$ is a theoretical value of density of an In—Ga—Zn—O compound having composition where In$_2$O$_3$:Ga$_2$O$_3$:ZnO=1:1:2 [molar ratio] (In:Ga:Zn=1:1:1 [atomic ratio]). The composition of the oxide semiconductor film can be measured by X-ray photoelectron spectroscopy (XPS).

The film density of the oxide semiconductor film can be measured by Rutherford backscattering spectrometry (RBS) or X-ray reflection (XRR).

As a material of the oxide semiconductor film, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn, and there is no limitation on the composition ratio of In, Ga, and Zn. Further, the In—Ga—Zn-based oxide semiconductor may contain a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used. However, the materials are not limited thereto.

There is no particular limitation on the structure of the transistor in which the region containing a high proportion of crystal components serves as the channel formation region. For example, a top-gate transistor or a bottom-gate transistor can be applied as appropriate. In addition, a back gate electrode may be provided, and it is preferable that the transistor be surely a normally off transistor by application of the voltage to the back gate electrode.

One embodiment of the present invention relates to a semiconductor device including a transistor or a semiconductor device including a circuit which is formed using a transistor. For example, one embodiment of the present invention relates to a semiconductor device including a transistor in which a channel formation region is formed using an oxide semiconductor film or a semiconductor device including a circuit which is formed using such a transistor. For example, the present invention relates to an electronic device which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

Hydrogen in the channel formation region of the oxide semiconductor film is attracted and fixed to the region containing a higher proportion of amorphous components so that hydrogen in the channel formation region is removed as much as possible, whereby the channel formation region can be a highly purified i-type (intrinsic) semiconductor or a semiconductor close thereto. When the channel formation region is an i-type semiconductor, the threshold voltage value of the transistor can be made to be positive, whereby what is called a normally-off switching element can be achieved.

When a normally-off switching element can be obtained, a semiconductor device with low power consumption can be provided using the switching element.

BRIEF DESCRIPTION OF THE DRAWINGS

FIGS. 9A to 9C are diagrams of models used for computing the movement of an excess oxygen atom.

FIGS. 11A to 11C are diagrams of models used for computing the movement of an oxygen vacancy.

FIG. 19 is a perspective view illustrating one embodiment of a semiconductor device.

DETAILED DESCRIPTION OF THE INVENTION

The present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Embodiments of the present invention will be described below in detail.

<1. Transistor>

A structural example of a transistor according to one embodiment of the present invention and an example of a manufacturing process of the transistor will be described with reference to FIGS. 1A and 1B, FIGS. 2A to 2C, and FIGS. 3A to 3C.

<1-1. Structural Example of Transistor>

Figure 1A:
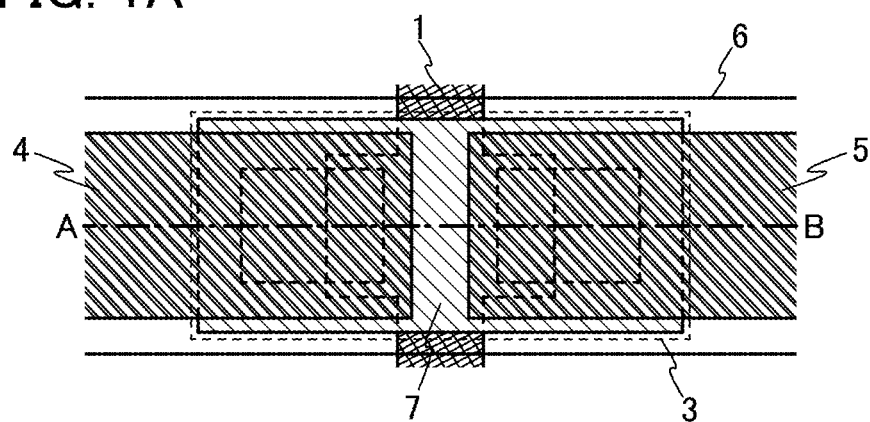
FIGS. 1A and 1B are a top view and a cross-sectional view illustrating a structural example of a transistor.
Figure 1B:
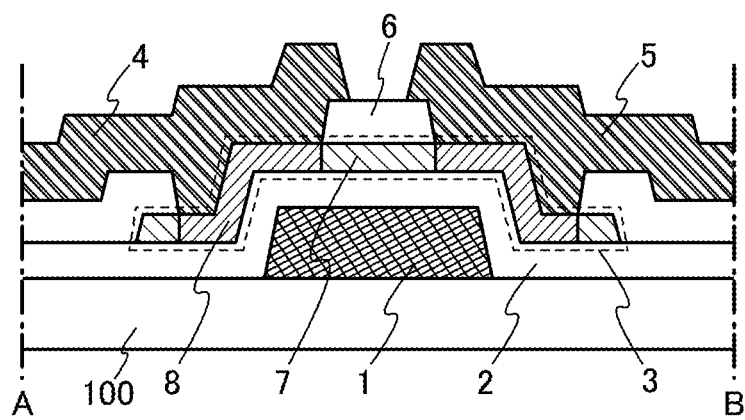
Figure 2A:
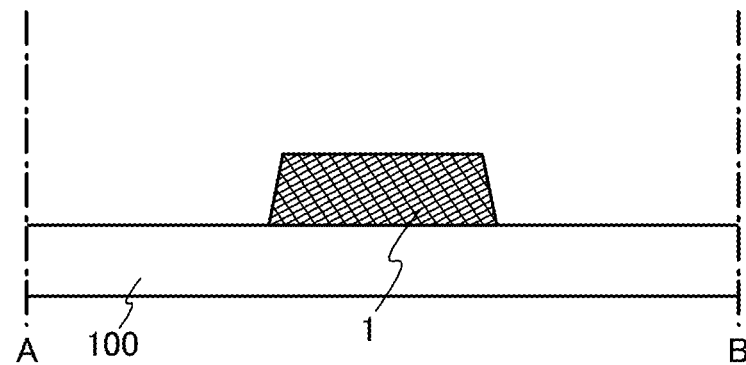
FIGS. 2A to 2C are cross-sectional views illustrating an example of a manufacturing process of a transistor.
Figure 2B:
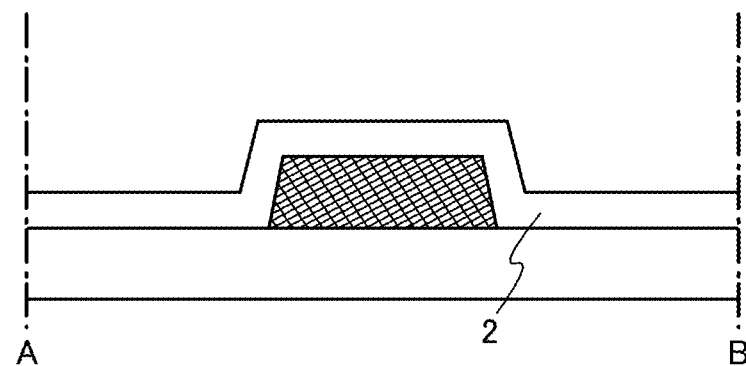
Figure 2C:
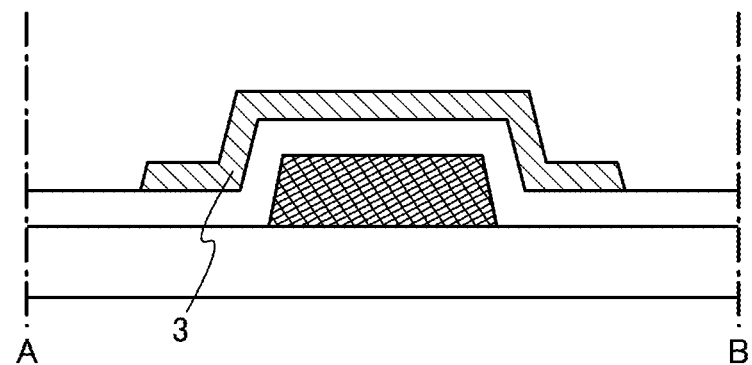
Figure 3A:
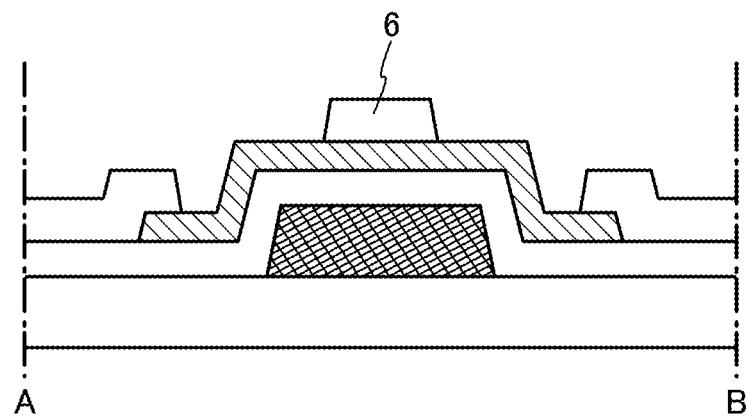
FIGS. 3A to 3C are cross-sectional views illustrating an example of a manufacturing process of a transistor.
Figure 3B:
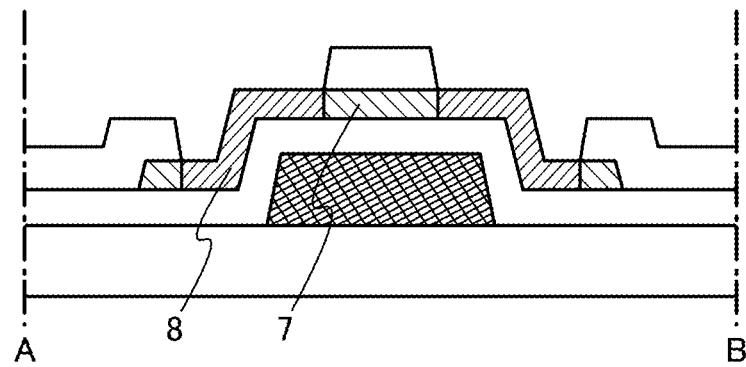
Figure 3C:
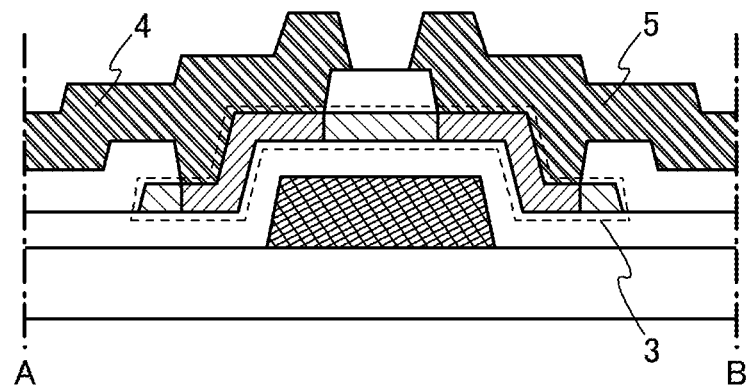

FIGS. 1A and 1B illustrate the structural example of the transistor according to one embodiment of the present invention. Specifically, FIG. 1A is a top view of the transistor and FIG. 1B is a cross-sectional view of the transistor which is taken along line A-B of FIG. 1A.

The transistor illustrated in FIGS. 1A and 1B includes a gate layer 1 which is provided over a substrate 100, a gate insulating layer 2 which is provided over the gate layer 1, an oxide semiconductor layer 3 which is provided over the gate insulating layer 2, a source electrode layer 4 and a drain electrode layer 5 which are provided over the oxide semiconductor layer 3 to be apart from each other, and an etching-stop layer 6 which is provided in a region over the oxide semiconductor layer 3 and between the source electrode layer 4 and the drain electrode layer 5. In short, the transistor illustrated in FIGS. 1A and 1B is an inverted staggered (etching-stop or channel-stop) transistor in which the etching-stop layer 6 is provided.

In the transistor illustrated in FIGS. 1A and 1B, the etching-stop layer 6 is provided not only in the region over the oxide semiconductor layer 3 and between the source electrode layer 4 and the drain electrode layer 5 but also in a region between an edge portion of the oxide semiconductor layer 3 and the source electrode layer 4 and a region between an edge portion of the oxide semiconductor layer 3 and the drain electrode layer 5. In short, the source electrode layer 4 and the drain electrode layer 5 are in contact with the oxide semiconductor layer 3 in openings provided in the etching-stop layer 6.

In the oxide semiconductor layer 3 of the transistor illustrated in FIGS. 1A and 1B, a region 7 which overlaps with an interface with the etching-stop layer 6 and a region 8 which overlaps with an interface with the source electrode layer 4 and the drain electrode layer 5 are different in crystallinity. Specifically, the proportion of a crystal region in the region 7 is higher than that of a crystal region in the region 8. Note that the region 7 includes part of or the whole region where a channel is formed depending on a voltage between the gate layer 1 and the source electrode layer 4.

In other words, defect density of the region 7 including part of or the whole channel is lower than that of the region 8 in the transistor illustrated in FIGS. 1A and 1B. Here, a defect which is included in the oxide semiconductor layer 3 is likely to become a trap site of an impurity such as hydrogen contained in the oxide semiconductor layer 3. Therefore, an impurity such as hydrogen is likely to be diffused from the region 8 to the region 7, whereas the impurity is less likely to be diffused from the region 7 to the region 8 in the transistor illustrated in FIGS. 1A and 1B. As a result, the concentration of the impurity such as hydrogen in the region 7 is reduced, which makes it possible to stabilize electrical characteristics and improve reliability of the transistor illustrated in FIGS. 1A and 1B.

In addition, it is possible to improve switching characteristics of the transistor in FIGS. 1A and 1B. Specific description is made below.

Electric characteristics of a transistor in which a channel is formed in an oxide semiconductor might change depending on processing conditions or heat treatment conditions. This change is caused by, for example, entry of an impurity (chlorine, fluorine, boron, hydrogen, or the like) in a step for forming the oxide semiconductor or release of oxygen from the oxide semiconductor. Such entry and release are likely to be significant at an edge portion of the oxide semiconductor. In other words, in the transistor in which the channel is formed in the oxide semiconductor, the edge portion of the oxide semiconductor is a low-resistance region, and a parasitic channel of the transistor is likely to be formed in the low-resistance region. Note that in the transistor, two kinds of channels, that is, a channel (also referred to as a former channel) which is an oxide semiconductor overlapping with a gate and is formed in a shortest path between a source and a drain depending on a voltage between the gate and the source and the parasitic channel (also referred to as a latter channel), can be formed.

In the transistor having a possibility that two kinds of channels are formed, the threshold voltage between the gate and the source at which the channel is formed differs between the two channels in many cases. Typically, the threshold voltage at which the former channel is formed is higher than the threshold voltage at which the latter channel is formed. The current drive capability of the former channel is higher than that of the latter channel. Thus, in the case where the voltage between the gate and the source of the transistor in an off state is increased, a current between the source and the drain changes in two stages. Specifically, a change in the first stage (an increase in the current between the source and the drain) is found in the vicinity of the threshold voltage at which the latter channel is formed, and further, a change in the second stage (an increase in the current between the source and the drain) is found in the vicinity of the threshold voltage at which the former channel is formed.

Here, the etching-stop layer 6 is provided between the edge portion of the oxide semiconductor layer 3 and the source electrode layer 4 and between the edge portion of the oxide semiconductor layer 3 and the drain electrode layer 5 in the transistor illustrated in FIGS. 1A and 1B. Therefore, if the edge portion of the oxide semiconductor layer 3 is a low-resistance region, a parasitic channel is not formed in the transistor illustrated in FIGS. 1A and 1B. That is, switching characteristics of the transistor in FIGS. 1A and 1B can be improved.

Note that a structure which can provide an improvement in switching characteristics is not limited to the structure illustrated in FIGS. 1A and 1B. The reason why the parasitic channel is formed at the edge portion of the oxide semiconductor layer is that the source and the drain of the transistor are electrically connected to the edge portion. Therefore, the switching characteristics of the transistor can be improved when at least one of the source electrode layer 4 and the drain electrode layer 5 is not electrically connected to the edge portion of the oxide semiconductor layer 3. For example, an improvement in switching characteristics is possible in a transistor in which at least one of the source electrode layer 4 and the drain electrode layer 5 is not in contact with a side surface of the oxide semiconductor layer 3.

<1-1-1. Specific Example of Substrate 100>

As the substrate 100, any substrate can be used as long as it has heat resistance high enough to withstand heat treatment in the manufacturing process of the transistor. For example, a substrate such as a glass substrate, a ceramic substrate, a quartz substrate, or a sapphire substrate can be used. A flexible substrate may alternatively be used as the substrate 100. An insulating layer can be formed over the substrate 100 to prevent an impurity contained in the substrate 100 from entering the oxide semiconductor layer to be formed later.

<1-1-2. Specific Example of Gate Layer 1>

A film containing an element selected from aluminum, copper, titanium, tantalum, tungsten, molybdenum, chrome, neodymium, and scandium or a film of an alloy containing any of these elements as its component can be used for the gate layer 1. Alternatively, the gate layer 1 can be formed with a stack of these films.

As the gate layer 1, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher, preferably 5.5 eV (electron volts) or higher, which enables the threshold voltage of the transistor to be positive when used as the gate, so that what is called a normally-off switching element can be achieved.

<1-1-3. Specific Example of Gate Insulating Layer 2>

A silicon oxide film, a silicon nitride film, a silicon oxynitride film, a silicon nitride oxide film, an aluminum oxide film, an aluminum oxynitride film, a gallium oxide film, or the like can be used as the gate insulating layer 2. Alternatively, a stack of layers of these materials can also be used. Note that silicon oxynitride and aluminum oxynitride refer to substances which contain more oxygen than nitrogen. A silicon nitride oxide refers to a substance which contains more nitrogen than oxygen.

In particular, a layer including an aluminum oxide film is preferably used as the gate insulating layer 2. An aluminum oxide film has a high shielding (blocking) effect of preventing penetration of oxygen and an impurity such as hydrogen. Therefore, when the layer including an aluminum oxide film is used as the gate insulating layer 2, it is possible to prevent release of oxygen from the oxide semiconductor layer 3 and the entry of an impurity such as hydrogen to the oxide semiconductor layer 3.

The gate insulating layer 2 can be formed using a film including a hafnium oxide film, a yttrium oxide film, a hafnium silicate ($HfSi_xO_y$, (x>0, y>0)) film, a hafnium silicate film to which nitrogen is added, a hafnium aluminate ($HfAl_xO_y$, (x>0, y>0)) film, or a lanthanum oxide film (i.e., a film formed of what is called a high-k material). By using such a film, gate leakage current can be reduced.

<1-1-4. Specific Example of Oxide Semiconductor Layer 3>

<(1) Material>

A film containing at least indium can be used as the oxide semiconductor layer 3. In particular, a film containing indium and zinc is preferably used. As a stabilizer for reducing variations in electric characteristics of the transistor, a film containing gallium (Ga) in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor layer 3.

As the oxide semiconductor layer 3, for example, a film of any of the following oxides can be used: indium oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide containing In, Ga, and Zn as its main components and there is no particular limitation on the ratio of In:Ga:Zn. The In—Ga—Zn-based oxide may contain a metal element other than the In, Ga, and Zn.

Note that nitrogen may be substituted for part of oxygen included in the oxide semiconductor layer 3.

<(2) Crystal Structure>

As described above, the oxide semiconductor layer 3 is an oxide semiconductor film in which regions which differ in the proportion of a crystal region are provided and for example, amorphous regions and the crystal regions are mixed. In the crystal region, the crystal structure of the oxide semiconductor is not limited to a specific structure.

The crystal region of an oxide semiconductor film is, for example, structured by at least one of c-axis aligned crystal (CAAC), polycrystal, and microcrystal. The density of defect states of microcrystal is higher than that of CAAC. Note that an oxide semiconductor including CAAC is referred to as a CAAC-OS (c-axis aligned crystalline oxide semiconductor).

For example, the crystal region of an oxide semiconductor film may include a CAAC-OS. In the CAAC-OS, for example, c-axes are aligned, and a-axes and/or b-axes are not macroscopically aligned.

For example, the crystal region of an oxide semiconductor film may include microcrystal. Note that an oxide semiconductor including microcrystal is referred to as a microcrystalline oxide semiconductor. The crystal region of an oxide semiconductor film including a microcrystalline oxide semiconductor includes microcrystal (also referred to as nanocrystal) with a size greater than or equal to 1 nm and less than 10 nm, for example. Alternatively, the crystal region of an oxide semiconductor film including a microcrystalline oxide semiconductor, for example, includes a crystal-amorphous mixed phase structure where crystal parts (each of which is greater than or equal to 1 nm and less than 10 nm) are distributed.

The amorphous region of an oxide semiconductor film includes at least an amorphous part. For example, the amorphous region of an oxide semiconductor film may include microcrystal. Note that an oxide semiconductor including an amorphous part is referred to as an amorphous oxide semiconductor. The density of defect states of an amorphous part is higher than those of microcrystal and CAAC. The amorphous region of an oxide semiconductor film including an amorphous oxide semiconductor, for example, has disordered atomic arrangement and no crystalline component. Alternatively, the amorphous region of an oxide semiconductor film including an amorphous oxide semiconductor is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS.

Note that the crystal region of an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film. The CAAC-OS film can be used as the crystal region of the oxide semiconductor. The CAAC-OS film is described below The CAAC-OS film is not absolutely amorphous. The CAAC-OS film, for example, includes an oxide semiconductor with a crystal-amorphous mixed phase structure where crystal parts and amorphous parts are intermingled.

Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that oxygen is likely to be released from the side surface (end surface) of the CAAC-OS film (detailed explanation regarding to this point is made in a section described below, <Supplementary Explanation: Release of Oxygen from Oxide Semiconductor Layer>). Therefore, in the case where the CAAC-OS film is used as the oxide semiconductor layer 3, the transistor is preferably formed such that the etching-stop layer 6 is provided between the edge portion of the oxide semiconductor layer 3 and the source electrode layer 4 and between the edge portion of the oxide semiconductor layer 3 and the drain electrode layer 5, as illustrated in FIGS. 1A and 1B. This is because formation of a parasitic channel in the transistor can be prevented.

<(3) Layer Structure>

As the oxide semiconductor layer 3, a single-layer oxide semiconductor film or a layer formed of a stack having plural kinds of oxide semiconductor films may be used. For example, a layer including at least two of an amorphous oxide semiconductor film, a polycrystalline oxide semiconductor film, and a CAAC-OS film can be used as the oxide semiconductor layer 3.

Alternatively, a layer formed of a stack of oxide semiconductor films having different compositions can be used as the oxide semiconductor layer 3. Specifically, a layer including a first oxide semiconductor film (also referred to as a lower layer) which is in contact with the gate insulating layer 2 and a second oxide semiconductor film (also referred to as an upper layer) which is in contact with the source electrode layer 4, the drain electrode layer 5, and the etching-stop layer 6 and has different composition from the first oxide semiconductor film can be used as the oxide semiconductor layer 3.

For example, in the case where the lower layer and the upper layer both contain indium, gallium, and zinc, it is preferable that the indium concentration of the lower layer be set to higher than that of the upper layer and the gallium concentration of the upper layer be set to higher than that of the lower layer, and/or the indium concentration of the lower layer be set to higher than the gallium concentration of the lower layer and the gallium concentration of the upper layer be set to higher than the indium concentration of the upper layer.

With this structure, the mobility of the transistor including the oxide semiconductor layer 3 can be improved and formation of a parasitic channel can be prevented. Specifically, a high indium concentration of the lower layer can cause an improvement in the mobility of the transistor. This is because an s orbital of heavy metal mainly contributes to carrier conduction in the oxide semiconductor, and when the In content is increased, overlap of the s orbital is increased. In addition, a high gallium concentration of the upper layer leads to prevention of release of oxygen, which can prevent formation of a parasitic channel in the upper layer. This is because Ga has larger energy for forming oxygen vacancies than In, so that oxygen vacancies are less likely to be generated.

<1-1-4. Specific Example of Source Electrode Layer 4 and Drain Electrode Layer 5>

For the source electrode layer 4 and the drain electrode layer 5, a film containing an element selected from aluminum, copper, titanium, tantalum, tungsten, molybdenum, chromium, neodymium, and scandium; a film of an alloy containing any of these elements; a film of a nitride containing any of these elements; or the like can be used. Alternatively, a stack of any of these films can be used.

Further alternatively, a light-transmitting conductive film can be used for the source electrode layer 4 and the drain electrode layer 5. For example, an indium oxide-tin oxide ($In_2O_3$—$SnO_2$) film, an indium oxide-zinc oxide ($In_2O_3$—ZnO) film, or any of these films containing silicon oxide can be used.

<1-1-5. Specific Example of Etching-Stop Layer 6>

As the etching-stop layer 6, a silicon oxide film, a silicon nitride film, a silicon oxynitride film, a silicon nitride oxide film, an aluminum oxide film, an aluminum oxynitride film, a gallium oxide film, or the like can be used. A stack of these materials can also be used.

Specifically, a layer including an aluminum oxide film is preferably used as the etching-stop layer 6. This is because the use of the layer including an aluminum oxide film as the etching-stop layer 6 makes it possible to prevent release of oxygen from the oxide semiconductor layer 3 and prevent the entry of an impurity such as hydrogen to the oxide semiconductor layer 3.

<1-2. Example of Manufacturing Process of Transistor>

FIGS. 2A to 2C and FIGS. 3A to 3C illustrate an example of a manufacturing process of the transistor in FIGS. 1A and 1B, and specifically are cross-sectional views thereof <(1) Formation of Gate Layer 1 (FIG. 2A)>

First, a conductive film is formed over the substrate 100. Next, a mask is formed over the conductive film by a photolithography method. Then, part of the conductive film which is not covered with the mask is removed by etching. As a result, the gate layer 1 is formed.

The conductive film can be formed using a sputtering method or the like. Heat treatment may be performed before or after the formation of the conductive film or after the formation of the gate layer 1. For example, the heat treatment may be performed at 650° C. for one minute to five minutes with a gas rapid thermal annealing (GRTA) apparatus which performs heat treatment using a high-temperature gas. Note that a rare gas such as argon or an inert gas such as nitrogen is used as the high-temperature gas in the GRTA. Alternatively, the heat treatment may be performed at 500° C. for 30 minutes to 1 hour with an electric furnace.

<(2) Formation of Gate Insulating Layer 2 (FIG. 2B)>

Next, the gate insulating layer 2 is formed over the substrate 100 and the gate layer 1.

The gate insulating layer 2 can be formed by a plasma CVD method, a sputtering method, or the like. Heat treatment for reducing the content of water or hydrogen may be performed after the formation of the gate insulating layer 2. For example, the heat treatment may be performed at a temperature higher than or equal to 300° C. and lower than or equal to 700° C. for a time shorter than or equal to one hour under reduced pressure or in an inert atmosphere. This heat treatment makes it possible to prevent the entry of hydrogen to the oxide semiconductor layer 3 to be formed later.

In the case where the gate insulating layer 2 includes an aluminum oxide film, the aluminum oxide film can be directly formed by a sputtering method or can be formed in such a manner that an aluminum film is formed and then subjected to oxidation treatment. Examples of the oxidation treatment include oxygen plasma treatment, oxygen doping treatment, and the like.

The aluminum oxide film has a high blocking property. Therefore, in the case where the gate insulating layer 2 including the aluminum oxide film is formed, the heat treatment for reducing the content of water or hydrogen is preferably performed before formation of the aluminum oxide film. Specifically, the heat treatment is preferably performed at timing which is after the formation of the insulating film(s) included in the gate insulating layer 2 except the aluminum oxide film before the formation of the aluminum oxide film, or timing which is after the formation of the aluminum film before the oxidation treatment performed on the aluminum film. Accordingly, the content of water or hydrogen in the gate insulating layer 2 to be formed can be reduced effectively.

<(3) Formation of Oxide Semiconductor Layer 3 (FIG. 2C)>

Next, an oxide semiconductor film is formed over the gate insulating layer 2. Then, a mask is formed over the oxide semiconductor film by a photolithography method. After that, part of the oxide semiconductor film which is not covered with the mask is removed by etching. As a result, the oxide semiconductor layer 3 is formed.

The oxide semiconductor film can be formed by a sputtering method or the like. Note that the formation of the oxide semiconductor film is preferably performed in conditions such that the oxide semiconductor film contains a large amount of oxygen (e.g., the formation is performed by a sputtering method in an atmosphere containing oxygen at 100%). Accordingly, the amount of oxygen contained in the oxide semiconductor film can be increased (preferably, the oxide semiconductor includes a region which contains oxygen in a proportion higher than that of oxygen in the stoichiometric composition of an oxide semiconductor in a crystal state). In addition, to increase the crystallinity of the oxide semiconductor film, the formation may be performed while the substrate 100 is heated.

Heat treatment for reducing the content of water or hydrogen may be performed after the formation of the oxide semiconductor film or the formation of the oxide semiconductor layer 3. For example, the heat treatment may be performed at a temperature higher than or equal to 300° C. and lower than or equal to 700° C. for a time shorter than or equal to one hour under reduced pressure or in an inert atmosphere. Further, in the case where the gate insulating layer 2 is an insulating layer containing oxygen, oxygen contained in the gate insulating layer 2 can be supplied to the oxide semiconductor film or the oxide semiconductor layer 3 by this heat treatment. Therefore, even when oxygen vacancies are generated in the oxide semiconductor film or the oxide semiconductor layer 3, the oxygen vacancies can be compensated by the supply of oxygen from the gate insulating layer 2 by this heat treatment.

<(4) Formation of Etching-Stop Layer 6 (FIG. 3A)>

Next, an insulating film is formed over the gate insulating layer 2 and the oxide semiconductor layer 3. Then, a mask is formed over the insulating film by a photolithography method. After that, part of the insulating film which is not covered with the mask is removed by etching. As a result, the etching-stop layer 6 is formed.

The insulating film can be formed by a plasma CVD method, a sputtering method, or the like. Heat treatment for reducing the content of water or hydrogen may be performed after the formation of the etching-stop layer 6. For example, the heat treatment may be performed at a temperature higher than or equal to 300° C. and lower than or equal to 700° C. for a time shorter than or equal to one hour under reduced pressure or in an inert atmosphere. This heat treatment makes it possible to prevent the entry of hydrogen to the oxide semiconductor layer 3 to be formed later.

In the case where the etching-stop layer 6 includes an aluminum oxide film, the aluminum oxide film can be directly formed by a sputtering method or can be formed in such a manner that an aluminum film is formed and then subjected to oxidation treatment. Examples of the oxidation treatment include oxygen plasma treatment, oxygen doping treatment, and the like.

The aluminum oxide film has a high blocking property. Therefore, in the case where the etching-stop layer 6 including the aluminum oxide film is formed, the heat treatment for reducing the content of water or hydrogen is preferably performed before formation of the aluminum oxide film. Specifically, the heat treatment is preferably performed at timing which is after the formation of the insulating film(s) included in the etching-stop layer 6 except the aluminum oxide film and before the formation of the aluminum oxide film, or timing which is after the formation of the aluminum film and before the oxidation treatment performed on the aluminum film. Accordingly, the content of water or hydrogen in the etching-stop layer 6 to be formed can be reduced effectively.

<(5) Control of Crystallinity of Oxide Semiconductor Layer 3 (FIG. 3B)>

Next, plasma treatment is performed. Note that argon, an inert gas such as nitrogen, an oxygen gas, or the like is used as a gas in the plasma treatment. By the plasma treatment, a crystal included in a certain region of the oxide semiconductor layer 3 is made amorphous. Specifically, a crystal included in the region 8, which is not covered with the etching-stop layer 6, is made amorphous. As a result, the proportion of the crystal region in the region 7, which is covered with the etching-stop layer 6, is higher than that of the crystal region in the region 8.

<(6) Formation of Source Electrode Layer 4 and Drain Electrode Layer 5 (FIG. 3C)>

Next, a conductive film is formed over the oxide semiconductor layer 3 and the etching-stop layer 6. Then, a mask is formed over the conductive film by a photolithography method. After that, part of the conductive film which is not covered with the mask is removed by etching. As a result, the source electrode layer 4 and the drain electrode layer 5 are formed.

The conductive film can be formed using a sputtering method, or the like. Note that in the case where the conductive film is formed using a sputtering method, the crystal included in the region 8 of the oxide semiconductor layer 3 can be made amorphous depending on conditions of the formation. For example, the use of high power in the sputtering promotes amorphization of the region 8. In this case, the process which is described in the above section <(5) Control of Crystallinity of Oxide Semiconductor Layer 3> can be skipped.

<2. Semiconductor Device>

Specific examples of a semiconductor device which is formed using the above transistor are described below with reference to FIGS. 4A to 4C, FIGS. 5A and 5B, FIGS. 6A and 6B, FIGS. 7A and 7B, and FIGS. 8A and 8B.

<2-1. Display Device>

Figure 4A:
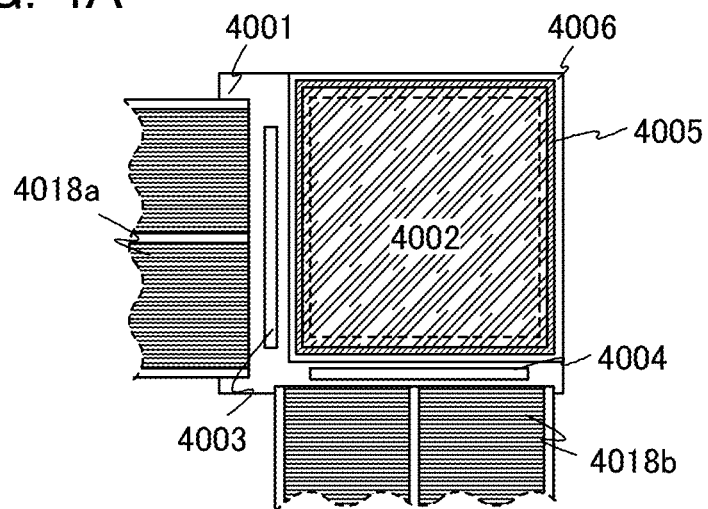
FIGS. 4A to 4C each illustrate an example of a display device.
Figure 4B:
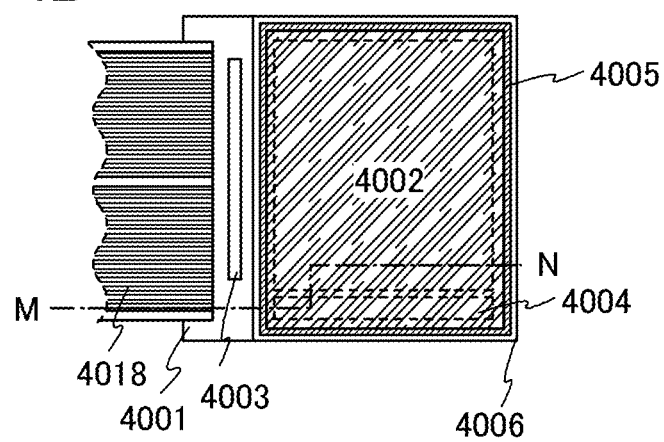
Figure 4C:
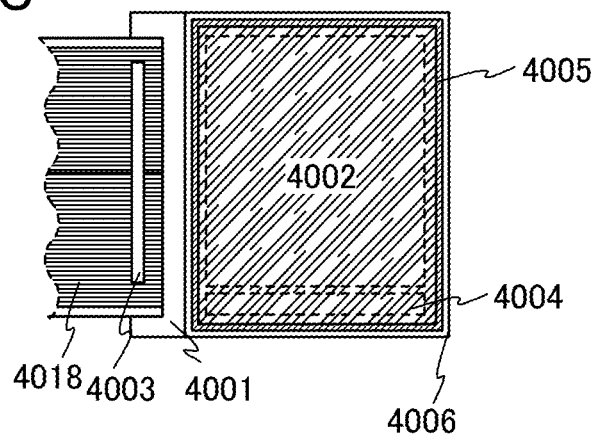

FIGS. 4A to 4C each illustrate an example of a display device formed using the above transistor. Specifically, the display devices illustrated in FIGS. 4A to 4C are each a display device in which part of or the whole driver circuit and a pixel portion are provided over the same substrate (what is called a system-on-panel display device). Note that the transistor described above can be used as any of transistors provided in the driver circuit and the pixel portion.

In FIG. 4A, a sealant 4005 is provided so as to surround a pixel portion 4002 provided over a substrate 4001, and the pixel portion 4002 is sealed with a substrate 4006. In FIG. 4A, a scan line driver circuit 4004 and a signal line driver circuit 4003 which are each formed using a single crystal semiconductor film or a polycrystalline semiconductor film over an IC chip or a substrate separately prepared are mounted on the substrate 4001, in a region that is different from the region surrounded by the sealant 4005. A variety of signals and potentials are supplied to the signal line driver circuit 4003 and the scan line driver circuit 4004 each of which is separately formed, and the pixel portion 4002 from flexible printed circuits (FPCs) 4018a and 4018b.

In FIGS. 4B and 4C, the sealant 4005 is provided to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 4B and 4C, the signal line driver circuit 4003 which is formed using a single crystal semiconductor film or a polycrystalline semiconductor film over an IC chip or a substrate separately prepared is mounted on the substrate 4001, in a region that is different from the region surrounded by the sealant 4005. In FIGS. 4B and 4C, a variety of signals and potentials are supplied to the signal line driver circuit 4003 that is separately formed, the scan line driver circuit 4004, and the pixel portion 4002 from a FPC 4018.

Although FIGS. 4B and 4C each illustrate an example in which the signal line driver circuit 4003 is formed separately and mounted on the substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 4A shows an example in which the signal line driver circuit 4003 and the scan line driver circuit 4004 are mounted by a COG method. FIG. 4B shows an example in which the signal line driver circuit 4003 is mounted by a COG method. FIG. 4C shows an example in which the signal line driver circuit 4003 is mounted by a TAB method.

The display device includes in its category a panel in which a display element is sealed and a module in which an IC including a controller or the like is mounted on the panel.

Note that a display device in this specification means an image display device, a display device, or a light source (including a lighting device). Further, the display device also includes the following modules in its category: a module to which a connector such as an FPC, or a TCP is attached; a module having a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

Figure 6A:
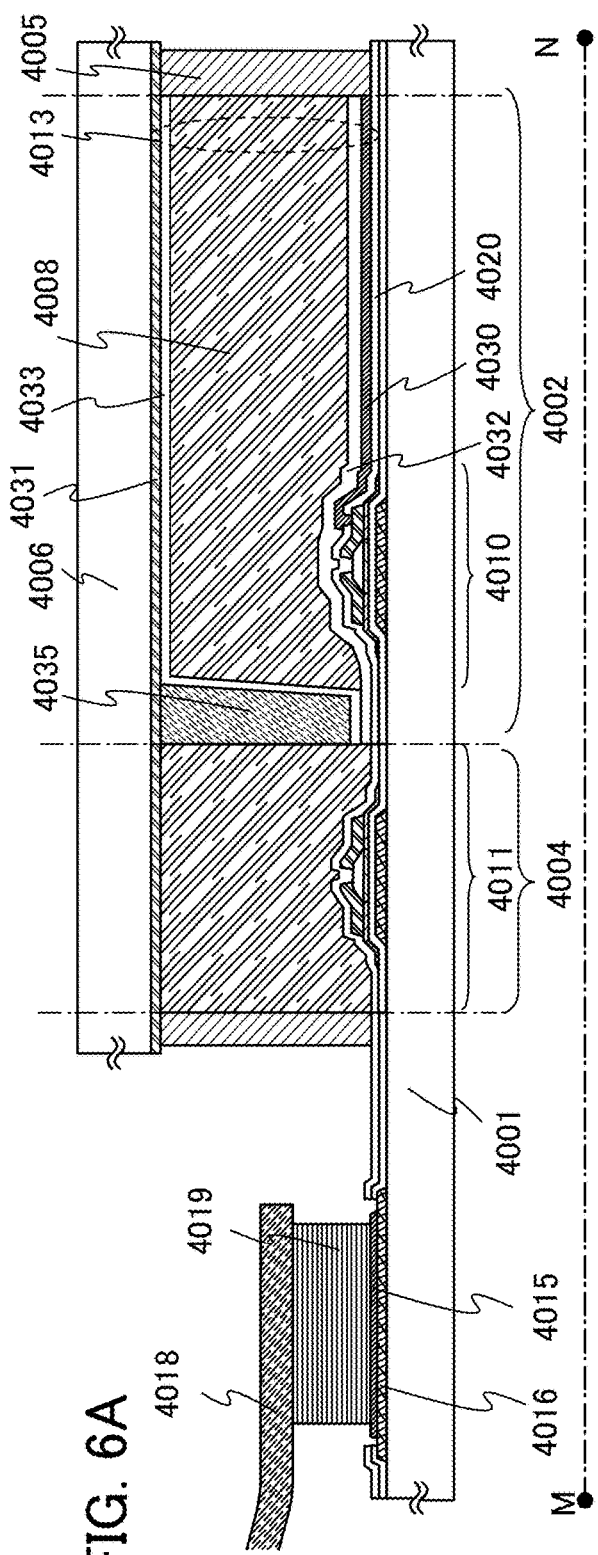
FIGS. 6A and 6B each illustrate an example of a display device.

One embodiment of the display device is described with reference to FIGS. 4A to 4C and FIGS. 6A and 6B. FIG. 6A corresponds to a cross-sectional view taken along line M-N in FIG. 4B.

As illustrated in FIGS. 4A to 4C and FIGS. 6A and 6B, the display device includes a connection terminal electrode 4015 and a terminal electrode 4016. The connection terminal electrode 4015 and the terminal electrode 4016 are electrically connected to a terminal included in the FPC 4018 through an anisotropic conductive layer 4019.

The connection terminal electrode 4015 is formed from the same conductive layer as a first electrode layer 4030, and the terminal electrode 4016 is formed from the same conductive layer as a source electrode layer and a drain electrode layer of transistors 4010 and 4011.

The pixel portion 4002 and the scan line driver circuit 4004 provided over the substrate 4001 include a plurality of transistors. FIGS. 4A to 4C and FIGS. 6A and 6B illustrates the transistor 4010 included in the pixel portion 4002 and the transistor 4011 included in the scan line driver circuit 4004. In FIG. 6A, an insulating layer 4020 is provided over the transistors 4010 and 4011, and in FIG. 6B, an insulating layer 4021 is further provided.

Figure 6B:
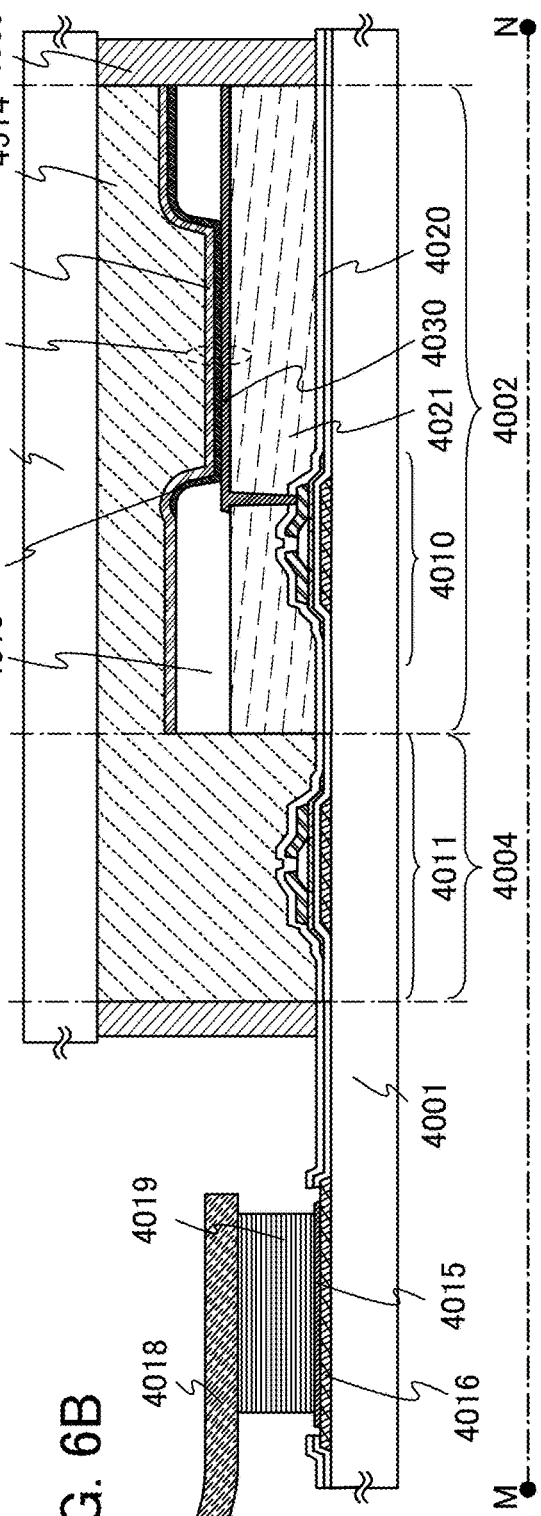

The transistor described above can be applied to the transistors 4010 and 4011. In FIGS. 6A and 6B, the transistor in which the outer edge portions of the oxide semiconductor layer extend beyond the outer edge portions of the source electrode layer and the drain electrode layer is illustrated. In the transistor having such a structure, formation of a parasitic channel can be prevented even when an etching-stop layer is not provided between an edge portion of the oxide semiconductor layer and the source electrode layer and between an edge portion of the oxide semiconductor layer and the drain electrode layer.

Moreover, a conductive layer may be provided so as to overlap with the oxide semiconductor layer of the transistor 4011 for the driver circuit. The conductive layer may have the same potential as or a potential different from that of a gate electrode layer of the transistor 4011 and can function as a second gate electrode layer. The potential of the conductive layer may be GND, 0V, or in a floating state. The conductive layer functions to block external electric field (particularly, block static electricity), that is, to prevent external electric field from acting the inside (a circuit portion including the transistor). A blocking function of the conductive layer can prevent the variation in electrical characteristics of the transistor due to the effect of external electric field such as static electricity.

The transistor 4010 included in the pixel portion 4002 is electrically connected to a display element to form a display panel. There is no particular limitation on the kind of the display element as long as display can be performed, and various kinds of display elements can be employed.

<2-1-1. Liquid Crystal Display Device>

An example of a liquid crystal display device using a liquid crystal element as the display element is described in FIG. 6A. In FIG. 6A, a liquid crystal element 4013 which is a display element includes the first electrode layer 4030, the second electrode layer 4031, and a liquid crystal layer 4008. Note that the insulating layers 4032 and 4033 serving as alignment films are provided so that the liquid crystal layer 4008 is positioned therebetween. The second electrode layer 4031 is provided on the substrate 4006 side, and the first electrode layer 4030 and the second electrode layer 4031 are stacked with the liquid crystal layer 4008 positioned therebetween.

A spacer 4035 is a columnar space obtained by selective etching of an insulating layer and is provided in order to control the thickness of the liquid crystal layer 4008 (a cell gap). Alternatively, a spherical spacer may be used. Further, a sealant 4005 is provided.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In that case, the liquid crystal layer 4008 is in contact with the first electrode layer 4030 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor which uses an oxide semiconductor layer particularly has a possibility that electrical characteristics of the transistor may change significantly by the influence of static electricity and deviate from the designed range. Therefore, it is more effective to use a liquid crystal composition exhibiting a blue phase for the liquid crystal display device including the transistor including an oxide semiconductor layer.

The specific resistivity of the liquid crystal material is greater than or equal to $1\times10^9$ $\Omega\cdot$cm, preferably greater than or equal to $1\times10^{11}$ $\Omega\cdot$cm, more preferably greater than or equal to $1\times10^{12}$ $\Omega\cdot$cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The transistor including an oxide semiconductor layer, which is disclosed in this specification, can have relatively high field-effect mobility; thus, the transistor can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

<2-1-2. EL Display Device>

As the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 5A:
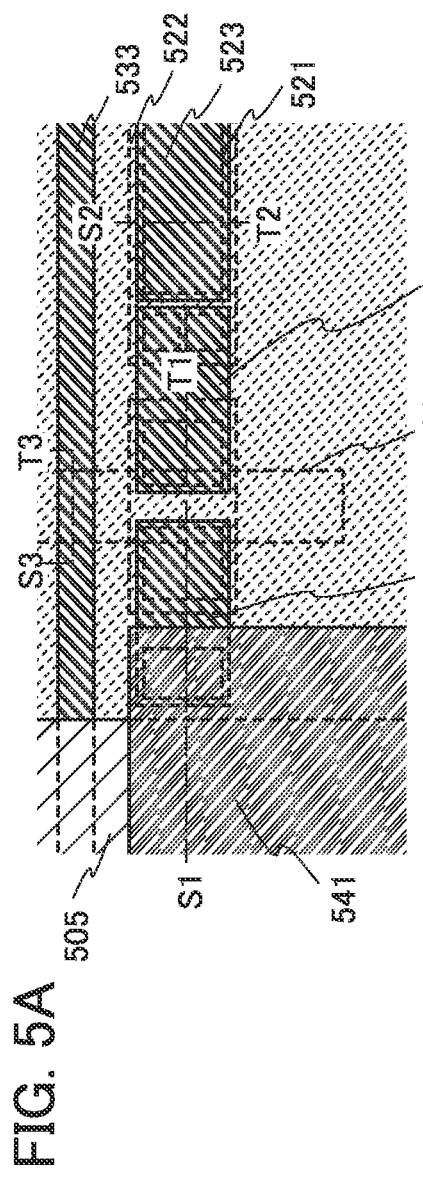
FIGS. 5A and 5B illustrate an example of a display device.
Figure 5B:
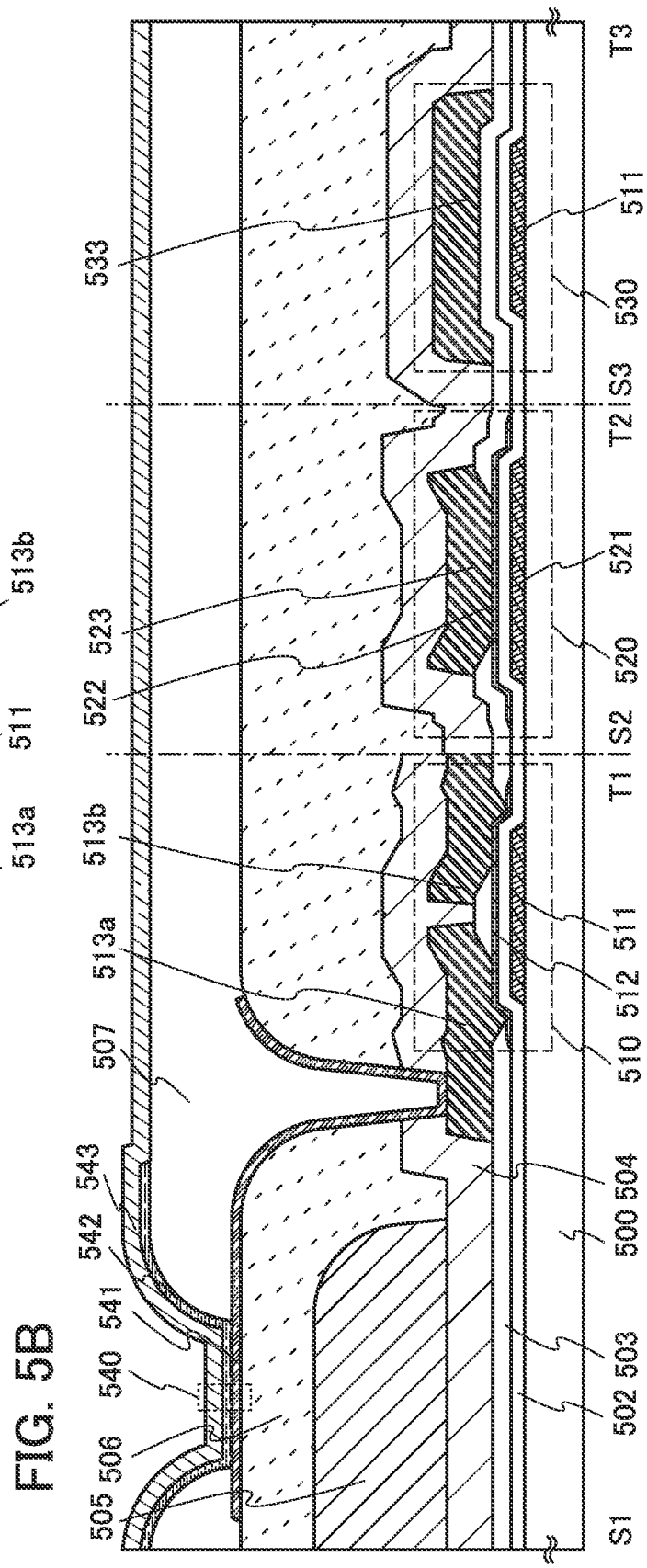

FIGS. 5A and 5B and FIG. 6B illustrate examples of a light-emitting device including a light-emitting element as a display element.

FIG. 5A is a plan view of the light-emitting device, and FIG. 5B is a cross-sectional view taken along the chain lines S1-T1, S2-T2, and S3-T3 in FIG. 5A. Note that, an electroluminescent layer 542 and a second electrode layer 543 are not illustrated in the plan view in FIG. 5A.

The light-emitting device illustrated in FIGS. 5A and 5B includes, over a substrate 500, a transistor 510, a capacitor 520, and an intersection 530 of wiring layers. The transistor 510 is electrically connected to a light-emitting element 540. Note that FIGS. 5A and 5B illustrate a bottom-emission light-emitting device in which light from the light-emitting element 540 is extracted through the substrate 500.

The above-described transistor can be applied to the transistor 510.

The transistor 510 includes a gate layer 511, a gate insulating layer 502, an oxide semiconductor layer 512, and conductive layers 513*a* and 513*b* functioning as a source electrode layer and a drain electrode layer.

The capacitor 520 includes a conductive layer 521, the gate insulating layer 502, an oxide semiconductor layer 522, and a conductive layer 523. The conductive layer 523 contacts oxide semiconductor layer 522 through an opening in an insulating layer 503. The gate insulating layer 502 and the oxide semiconductor layer 522 are sandwiched between the conductive layer 521 and the conductive layer 523, whereby the capacitor is formed.

The intersection 530 of wiring layers is an intersection of the gate layer 511 and the conductive layer 533. The gate layer 511 and the conductive layer 533 intersect with each other with the gate insulating layer 502 positioned therebetween.

An interlayer insulating layer 504 is formed over the transistor 510, the capacitor 520, and the intersection 530 of wiring layers. Over the interlayer insulating layer 504, a color filter layer 505 is provided in a region overlapping with the light-emitting element 540. An insulating layer 506 functioning as a planarization insulating layer is provided over the interlayer insulating layer 504 and the color filter layer 505.

The light-emitting element 540 having a stacked-layer structure in which a first electrode layer 541, the electroluminescent layer 542, and the second electrode layer 543 are stacked in that order is provided over the insulating layer 506. The first electrode layer 541 and the conductive layer 513*a* are in contact with each other in an opening formed in the insulating layer 506 and the interlayer insulating layer 504, which reaches the conductive layer 513*a*; thus the light-emitting element 540 and the transistor 510 are electrically connected to each other. Note that a partition 507 is provided so as to cover part of the first electrode layer 541 and the opening.

Further, a photosensitive acrylic film having a thickness of 1500 nm and a photosensitive polyimide film having a thickness of 1500 nm can be used as the insulating layer 506 and the partition 507, respectively.

As the color filter layer 505, for example, a chromatic light-transmitting resin can be used. As the chromatic color light-transmitting resin, a photosensitive organic resin or a non-photosensitive organic resin can be used. The photosensitive organic resin is preferably used, in which case the number of resist masks can be reduced, which results in the simplification of the process.

Chromatic colors are all colors except achromatic colors such as black, gray, and white. The color filter layer is formed using a material which transmits only light of the chromatic colors. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter layer 505 may have a thickness greater than or equal to 1500 nm and less than or equal to 2000 nm.

In the light-emitting device illustrated in FIG. 6B, a light-emitting element 4513 which is a display element is electrically connected to the transistor 4010 provided in the pixel portion 4002. The light-emitting element 4513 has a stacked-layer structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition 4510 (FIG. 6B) and a partition 507 (FIG. 5B) can be formed using an organic insulating material or an inorganic insulating material. It is particularly preferable that the partition 4510 and the partition 507 be formed using a photosensitive resin material to have openings over the first electrode layer 4030 (FIG. 6B) and the first electrode layer 541 (FIG. 5B), respectively. A sidewall of each opening is preferably formed as a tilted surface with continuous curvature.

The electroluminescent layer 4511 (FIG. 6B) and the electroluminescent layer 542 (FIG. 5B) may be formed using either a single layer or a plurality of layers stacked.

A protective film may be formed over the second electrode layer 4031 and the partition 4510 (FIG. 6B) and over the second electrode layer 543 and the partition 507 (FIG. 5B) in order to prevent entry of oxygen, hydrogen, moisture, carbon dioxide, or the like into the light-emitting element 4513 (FIG. 6B) and the light-emitting element 540 (FIG. 5B). As the protective film, a silicon nitride film, a silicon nitride oxide film, a diamond-like carbon (DLC) film, or the like can be formed.

Further, the light-emitting element 4513 (FIG. 6B) and the light-emitting element 540 (FIG. 5B) may be covered with respective layers containing an organic compound deposited by an evaporation method so that oxygen, hydrogen, moisture, carbon dioxide, or the like do not enter the light-emitting element 4513 (FIG. 6B) and the light-emitting element 540 (FIG. 5B).

In addition, in a space which is sealed with the substrate 4001, the substrate 4006, and the sealant 4005, a filler 4514 is provided. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

<2-1-3. Electrophoretic Display Device>

An electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

<2-2. Image Sensor>

Figure 7A:
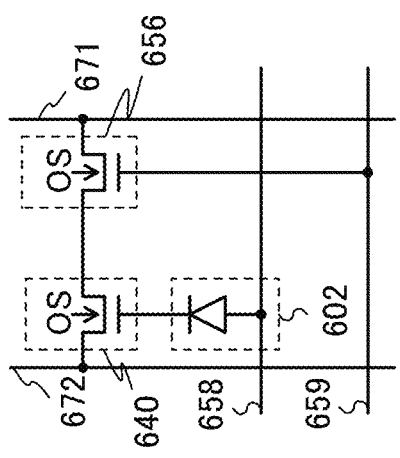
FIGS. 7A and 7B illustrate an example of an image sensor.

FIG. 7A illustrates an example of an image sensor. FIG. 7A is an equivalent circuit of a photo sensor, and FIG. 7B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor using an oxide semiconductor layer is denoted by a symbol "OS" so that it can be identified as a transistors including an oxide semiconductor layer. The above-described transistor can be used as any of the transistor 640 and the transistor 656 in FIG. 7A. Note that a transistor in which the outer edge portions of an oxide semiconductor layer extend beyond the outer edge portions of a source electrode and a drain electrode is used in FIG. 7B. In the transistor having such a structure, formation of a parasitic channel can be prevented even when an etching-stop layer is not provided between an edge portion of the oxide semiconductor layer and the source electrode layer and between an edge portion of the oxide semiconductor layer and the drain electrode layer.

Figure 7B:
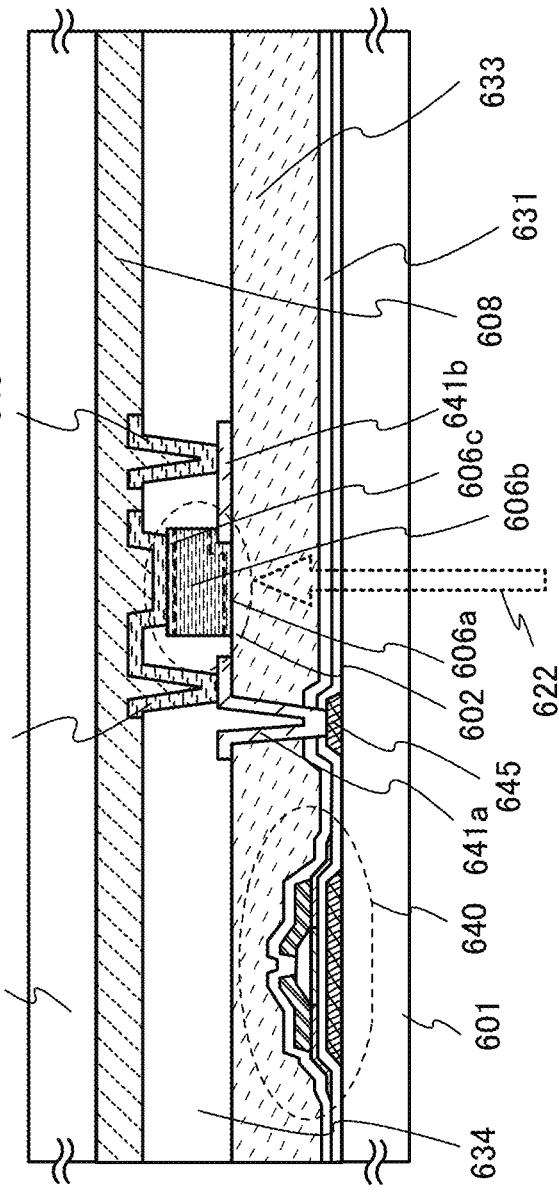

FIG. 7B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 provided therebetween.

An insulating layer 631, an interlayer insulating layer 633, and an interlayer insulating layer 634 are provided over the transistor 640. The photodiode 602 includes an electrode layer 641b which is formed over the interlayer insulating layer 633; a first semiconductor film 606a, a second semiconductor film 606b, and a third semiconductor film 606c which are stacked over the electrode layer 641b in this order; an electrode layer 642 which is provided over the interlayer insulating layer 634 and electrically connected to the electrode layer 641b through the first to third semiconductor films; and an electrode layer 641a which is provided in the same layer as the electrode layer 641b and electrically connected to the electrode layer 642.

The electrode layer 641b is electrically connected to a conductive layer 643 formed over the interlayer insulating layer 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity type. The first semiconductor film 606a is formed by a plasma CVD method with the use of a semiconductor source gas containing an impurity element belonging to Group 13 (e.g., boron (B)). As the semiconductor sourcegas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity type. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having the conductivity type opposite to that of the semiconductor film on the light-receiving plane is disturbance light; therefore, the electrode layer is preferably formed using a light-blocking conductive layer. Note that the n-type semiconductor film side may alternatively be a light-receiving plane.

The insulating layer 631, the interlayer insulating layer 633, and the interlayer insulating layer 634 can be formed using an insulating material by a sputtering method, a plasma CVD method, spin coating, dipping, spray coating, a droplet discharge method (such as an inkjet method), screen printing, offset printing, or the like depending on the material.

For example, the insulating layer 631 can be formed using an inorganic material and can be formed of a single layer of silicon oxynitride, a single layer of aluminum oxide, or a stacked layer thereof.

For reduction of surface roughness, an insulating layer functioning as a planarization insulating layer is preferably used as each of the interlayer insulating layers 633 and 634. For the interlayer insulating layers 633 and 634, an organic insulating material having heat resistance, such as polyimide, an acrylic resin, a benzocyclobutene resin, polyamide, or an epoxy resin can be used. Other than such organic insulating materials, it is possible to use a single layer or a stack of layers of a low-dielectric constant material (a low-k material), a siloxane-based resin, phosphosilicate glass (PSG), borophosphosilicate glass (BPSG), or the like.

By detecting light 622 entering the photodiode 602, data of an object can be read. Note that a light source such as a backlight can be used at the time of reading data on an object.

<2-3. Memory Device>

An example of a memory device which includes the transistor described in this specification, which can hold stored data even when not powered, and which has an unlimited number of write cycles will be described below with reference to drawings.

Figure 8A:
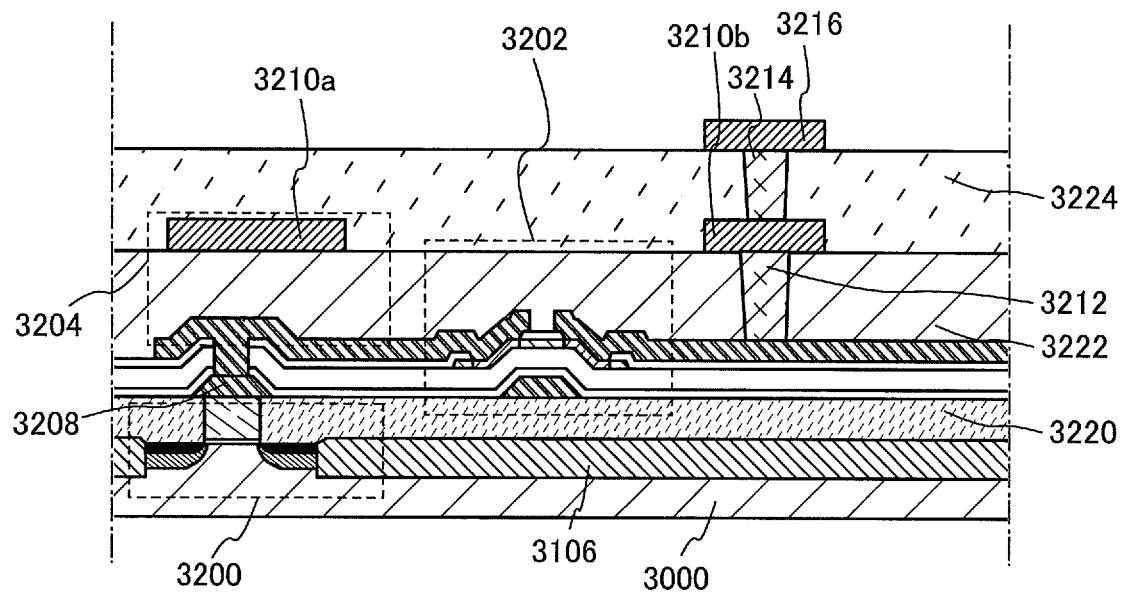
FIGS. 8A and 8B illustrate an example of a memory device.
Figure 8B:
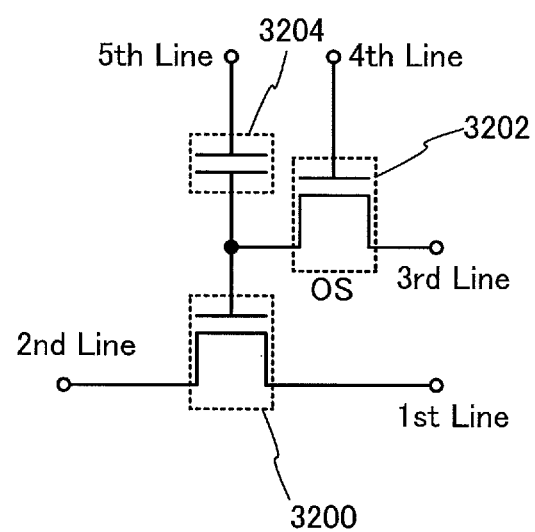

FIGS. 8A and 8B illustrate an example of a structure of the memory device. FIG. 8A is a cross-sectional view of the memory device, and FIG. 8B is a circuit diagram of the memory device.

In the memory device illustrated in FIGS. 8A and 8B, a transistor 3200 which is formed using a semiconductor material which is not an oxide semiconductor is provided in a lower portion, and a transistor 3202 which is formed using an oxide semiconductor and a capacitor 3204 are provided in an upper portion. The structure of the transistor 420 described in Embodiment 4 is applied to the transistor 3202.

Here, when polycrystalline silicon or single crystal silicon or the like is used as a semiconductor material which is not an oxide semiconductor, the transistor 3200 can operate at high speed. On the other hand, when an oxide semiconductor is used, charge can be held for a long time in the transistor 3200.

Although all the transistors are n-channel transistors here, it is needless to say that p-channel transistors can be used. Except that the above-described transistor is used as the transistor 3202, the specific structures such as the material and the structure of the memory device are not limited to those described in this embodiment.

The transistor 3200 in FIG. 8A includes a channel formation region provided in a substrate 3000 including a semiconductor material (such as silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3106 is formed on the substrate 3000 so as to surround the transistor 3200, and an insulating layer 3220 is formed so as to cover the transistor 3200. The element isolation insulating layer 3106 can be formed using a known element separation technique such as a LOCOS (local oxidation of silicon) method or an STI (shallow trench isolation) method.

When a single crystal semiconductor substrate is used as the substrate 3000, the transistor 3200 can operate at a high speed. Thus, when the transistor is used as a reading transistor, data can be read at a high speed. As treatment prior to formation of the transistor 3202 and a capacitor 3204, CMP treatment is performed on the insulating layer 3220 covering the transistor 3200, whereby the insulating layer 3220 is planarized and, at the same time, an upper surface of the gate electrode layer of the transistor 3200 is exposed.

Since the off-state current of the transistor 3202 is small, stored data can be held for a long time owing to such a transistor. In other words, a memory device in which refresh operation is not needed or the frequency of refresh operation is extremely low can be provided, which results in a sufficient reduction in power consumption.

One of a source electrode layer and a drain electrode layer of the transistor 3202 is electrically connected to an electrode 3208 through an opening provided in a gate insulating layer and an oxide semiconductor layer and is electrically connected to the gate electrode layer of the transistor 3200 through the electrode 3208. The electrode 3208 can be formed through the same process as a gate electrode layer of the transistor 3202.

An insulating layer 3222 formed of a single layer or a stack of layers is provided over the transistor 3202. In addition, a conductive layer 3210a is provided in a region overlapping with the one of the source electrode layer and the drain electrode layer of the transistor 3202 with the insulating layer 3222 positioned therebetween, and the one of the source electrode layer and the drain electrode layer of the transistor 3202, the insulating layer 3222, and the conductive layer 3210a form the capacitor 3204. That is, the one of the source electrode layer and the drain electrode layer of the transistor 3202 functions as one electrode of the capacitor 3204, and the conductive layer 3210a functions as the other electrode of the capacitor 3204. Note that in the case where no capacitor is needed, a structure in which the capacitor 3204 is not provided is also possible. Alternatively, the capacitor 3204 may be separately provided above the transistor 3202.

An insulating layer 3224 is provided over the capacitor 3204. In addition, a wiring 3216 is provided over the insulating layer 3224 for connecting the transistor 3202 to another transistor. The wiring 3216 is electrically connected to the other of the source electrode layer and the drain electrode layer of the transistor 3202 through an electrode 3214 provided in an opening formed in the insulating layer 3224, a conductive layer 3210b formed using the same layer as the conductive layer 3210a, and an electrode 3212 provided in an opening formed in the insulating layer 3222.

In FIG. 8A, the transistors 3200 and 3202 are provided so as to at least partly overlap each other, and the source region or the drain region of the transistor 3200 is preferably provided to partly overlap with the oxide semiconductor layer included in the transistor 3202. In addition, the transistor 3202 and the capacitor 3204 are provided so as to overlap with at least part of the transistor 3200. For example, the conductive layer 3210a of the capacitor 3204 is provided so as to at least partly overlap with the gate electrode layer of the transistor 3200. When such a planar layout is employed, the area occupied by the memory device can be reduced; thus, higher integration can be achieved.

Next, an example of a circuit configuration corresponding to FIG. 8A is illustrated in FIG. 8B.

In FIG. 8B, a first wiring (1st line) is electrically connected to a source electrode layer of the transistor 3200. A second wiring (2nd line) is electrically connected to a drain electrode layer of the transistor 3200. A third wiring (3rd line) and one of the source electrode layer and the drain electrode layer of the transistor 3202 are electrically connected to each other, and a fourth wiring (4th line) and the gate electrode layer of the transistor 3202 are electrically connected to each other. The gate electrode layer of the transistor 3200 and the other of the source electrode layer and the drain electrode layer of the transistor 3202 are electrically connected to one electrode of the capacitor 3204. A fifth wiring (5th line) and the other electrode of the capacitor 3204 are electrically connected to each other.

The memory device in FIG. 8B utilizes a characteristic in which the potential of the gate electrode layer of the transistor 3200 can be held, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is supplied to the gate electrode layer of the transistor 3200 (writing). Here, charge for supply of a potential level or charge for supply of a different potential level (hereinafter referred to as Low-level charge and High-level charge) is given. After that, the potential of the fourth wiring is set to a potential at which the transistor 3202 is turned off, so that the transistor 3202 is turned off Thus, the charge supplied to the gate electrode layer of the transistor 3200 is held (holding).

Since the off-state current of the transistor 3202 is significantly small, the charge of the gate electrode layer of the transistor 3200 is held for a long time.

Next, reading data is described. By supplying an appropriate potential (reading potential) to the fifth wiring while a predetermined potential (constant potential) is supplied to the first wiring, the potential of the second wiring varies depending on the amount of charge held in the gate electrode layer of the transistor 3200. This is because in general, when the transistor 3200 is an n-channel transistor, an apparent threshold voltage $V_{th\_H}$ in the case where High-level charge is given to the gate electrode layer of the transistor 3200 is lower than an apparent threshold voltage $V_{th\_L}$ in the case where Low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ between $V_{th\_H}$ and $V_{th\_L}$, whereby charge supplied to the gate electrode layer of the transistor 3200 can be determined. For example, in the case where High-level charge is supplied in writing, when the potential of the fifth wiring is set to $V_0$ ($>V_{th\_H}$), the transistor 3200 is turned on. In the case where Low-level charge is supplied in writing, even when the potential of the fifth wiring is set to $V_0$ ($<V_{th\_L}$), the transistor 3200 remains in an off state. Therefore, the held data can be read by recognizing the potential of the second line.

Note that in the case where memory cells are arrayed to be used, only data of desired memory cells needs to be read. In the case where such reading is not performed, a potential at which the transistor 3200 is turned off, that is, a potential smaller than $V_{th\_H}$ may be supplied to the fifth wiring regardless of the state of the gate electrode layer. Alternatively, a potential at which the transistor 3200 is turned on regardless of a state of the gate electrode layer, that is, a potential higher than $V_{th\_L}$ may be supplied to the fifth wiring.

The use of the transistor including an oxide semiconductor in the above memory device enables the memory device to hold stored data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

In the above-described memory device, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the above-described memory device does not have a limit on the number of times of rewriting data which is a problem in a conventional non-volatile memory, and reliability thereof is drastically improved. Furthermore, data is written depending on the on state and the off state of the transistor, whereby high-speed operation can be easily realized.

Note that the memory device which is formed using the transistor described in this specification is not limited to that illustrated in FIGS. 8A and 8B. For example, the transistor may be used as a transistor which is provided in a memory cell of a DRAM.

<Supplementary Explanation: Release of Oxygen from Oxide Semiconductor Layer>

Easiness of release of oxygen from the side surface (end surface) of the CAAC-OS film is described below.

Here, the mobility of an excess oxygen atom (an oxygen atom contained in a proportion higher than that of oxygen in the stoichiometric composition) and the mobility of an oxygen vacancy in an In—Ga—Zn-based oxide (hereinafter referred to as IGZO, which is an oxide of three-component metal) film which is given as an example of an oxide semiconductor film are described with reference to scientific computation results.

Note that the computation was performed in such a manner that models in which any one of an excess oxygen atom and an oxygen vacancy existed on an In—O plane of IGZO with an atomic ratio of In:Ga:Zn=3:1:2 were made by geometry optimization (see FIGS. 9A to 9C and FIGS. 11A to 11C), and energy to an intermediate structure along a minimum energy path in each model was computed by a nudged elastic band (NEB) method.

The computation was performed using computational program software "Open MX", which is based on the density functional theory (DFT). Parameters are described below.

As a basis function, a pseudo-atomic localized basis function was used. This basis function is categorized into polarized basis sets of slater type orbial (STO).

As a functional, Generalized-Gradient-Approximation/Perdew-Burke-Ernzerhof (GGA/PBE) was used.

Cut-off energy was set to 200 Ry.

The number of sampling k points was 5×5×3.

The number of atoms existing in the computation models for the computation of the mobility of the excess oxygen atom was 85; the number of atoms existing in the computation models for the computation of the mobility of the oxygen vacancy was 83.

The mobility of each of the excess oxygen atom and the oxygen vacancy is evaluated by computing an energy barrier height Eb which the excess oxygen atom or the oxygen vacancy needs to get over when the excess oxygen atom or the oxygen vacancy moves to a corresponding site. That is, when the energy barrier height Eb is large, it is difficult for the excess oxygen atom and the oxygen vacancy to move, whereas when the energy barrier height Eb is low, it is easy for the excess oxygen atom and the oxygen vacancy to move.

Figure 10:
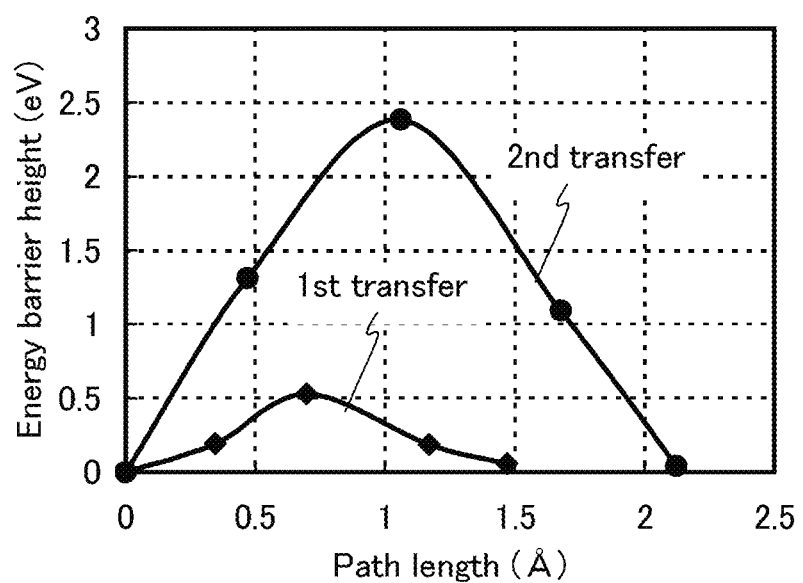
FIG. 10 shows computation results of the models of FIGS. 9A to 9C.

First, the movement of the excess oxygen atom is described. Models used for the computation for the movement of the excess oxygen atom are shown in FIGS. 9A to 9C. The computation was performed on the following two transfer patterns. Computation results are shown in FIG. 10. In FIG. 10, the horizontal axis represents a path length (for the movement of the excess oxygen atom) and the vertical axis represents energy (which is needed for the movement) against the energy in the state shown in Model A of FIG. 9A.

Of the two transfer patterns in the case of the movement of the excess oxygen atom, the first transfer is the one from Model A to Model B. The second transfer is the one from Model A to Model C.

An oxygen atom denoted by "1" in FIGS. 9A to 9C is referred to as a first oxygen atom of Model A. An oxygen atom denoted by "2" in FIGS. 9A to 9C is referred to as a second oxygen atom of Model A. An oxygen atom denoted by "3" in FIGS. 9A to 9C is referred to as a third oxygen atom of Model A.

As is apparent from FIG. 10, the maximum value of the energy barrier height Eb ($Eb_{max}$) of the first transfer is 0.53 eV, and the maximum value of the energy barrier height Eb ($Eb_{max}$) of the second transfer is 2.38 eV. Therefore, the maximum value of the energy barrier height Eb ($Eb_{max}$) of the first transfer is lower than that of the second transfer. For this reason, energy needed for the first transfer is smaller than that needed for the second transfer, which indicates that the first transfer more easily occurs than the second transfer.

In other words, the first oxygen atom of Model A moves more easily in a direction for pushing out the second oxygen atom of Model A than in a direction for pushing out the third oxygen atom of Model A. Accordingly, the oxygen atom moves more easily along a layer of indium atoms than across the layer of indium atoms.

Figure 12:
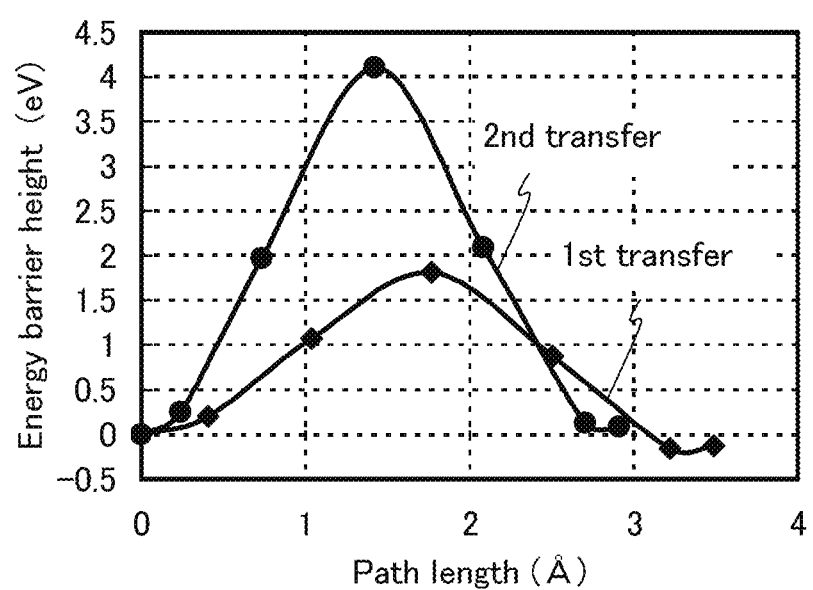
FIG. 12 shows computation results of the models of FIGS. 11A to 11C.

Next, the movement of the oxygen vacancy is described. Models used for the computation for the movement of the oxygen vacancy are shown in FIGS. 11A to 11C. The computation was performed on the following two transfer patterns. Computation results are shown in FIG. 12. In FIG. 12, the horizontal axis represents a path length (for the movement of the oxygen vacancy) and the vertical axis represents energy (which is needed for the movement) against the energy in the state shown in Model A of FIG. 11A.

Of the two transfer patterns in the case of the movement of the oxygen vacancy, the first transfer is the one from Model A to Model B. The second transfer is the one from Model A to Model C.

Note that a circle drawn with a dotted line in FIGS. 11A to 11C represents the oxygen vacancy.

As is apparent from FIG. 12, the maximum value of the energy barrier height Eb ($Eb_{max}$) of the first transfer is 1.81 eV, and the maximum value of the energy barrier height Eb ($Eb_{max}$) of the second transfer is 4.10 eV. Therefore, the maximum value of the energy barrier height Eb ($Eb_{max}$) of the first transfer is lower than that of the second transfer. For this reason, energy needed for the first transfer is smaller than that needed for the second transfer, which indicates that the first transfer more easily occurs than the second transfer.

In other words, the oxygen vacancy of Model A moves more easily toward the position of the oxygen vacancy of Model B than toward the position of the oxygen vacancy of Model C. Therefore, the oxygen vacancy also moves more easily along the layer of indium atoms than across the layer of indium atoms.

Next, to compare the occurrence probabilities of the four transfer patterns with each other from a different aspect, temperature dependency of each of these transfers is described. The following are the above-described four transfer patterns: (1) the first transfer of the excess oxygen atom, (2) the second transfer of the excess oxygen atom, (3) the first transfer of the oxygen vacancy, and (4) the second transfer of the oxygen vacancy.

Temperature dependences of these transfers are compared with one another by using frequency of movement per unit time. Here, frequency of movement Z (/second) at a certain temperature T (K) can be represented as Formula 1 described below using frequency Zo (/second) of an oxygen atom in a position where the oxygen atom is chemically stable.

[Formula 1]

$$Z = Zo \cdot \exp\left(-\frac{Eb_{max}}{kT}\right) \quad (1)$$

Note that $Eb_{max}$ represents the maximum value of the energy barrier height Eb in each transfer and k represents Boltzmann's constant in Formula 1. In addition, the equation, $Zo=1.0\times10^{13}$ (/second), is used for the computation.

In the case where the excess oxygen atom or the oxygen vacancy moves beyond the maximum value of the energy barrier height Eb ($Eb_{max}$) once every second (in the case of Z=1 (/second)), when Formula 1 is rearranged by isolation of T, the following are obtained:
(1) The first transfer of the excess oxygen atom: T=206 K (−67° C.) in the case of Z=1;
(2) The second transfer of the excess oxygen atom: T=923 K (650° C.) in the case of Z=1;
(3) The first transfer of the oxygen vacancy: T=701 K (428° C.) in the case of Z=1; and
(4) The second transfer of the oxygen vacancy: T=1590 K (1317° C.) in the case of Z=1.

On the other hand, Z is as follows in the case of T=300 K (27° C.):
(1) The first transfer of the excess oxygen atom: $Z=1.2\times10^{4}$ (/second) in the case of T=300 K;
(2) The second transfer of the excess oxygen atom: $Z=1.0\times10^{-27}$ (/second) in the case of T=300 K;
(3) The first transfer of the oxygen vacancy: $Z=4.3\times10^{-18}$ (/second) in the case of T=300 K; and
(4) The second transfer of the oxygen vacancy: $Z=1.4\times10^{-56}$ (/second) in the case of T=300 K.

Further, Z is as follows in the case of T=723 K (450° C.):
(1) The first transfer of the excess oxygen atom: $Z=2.0\times10^{9}$ (/second) in the case of T=723 K;
(2) The second transfer of the excess oxygen atom: $Z=2.5\times10^{-4}$ (/second) in the case of T=723 K;
(3) The first transfer of the oxygen vacancy: Z=2.5 (/second) in the case of T=723 K; and
(4) The second transfer of the oxygen vacancy: $Z=2.5\times10^{-16}$ (/second) in the case of T=723 K.

In view of the computation results, the excess oxygen atom moves more easily along the layer of indium atoms than across the layer of indium atoms in both the cases where T is 300 K and where T is 723 K. In addition, the oxygen vacancy also moves more easily along the layer of indium atoms than across the layer of indium atoms in both cases where T is 300 K and where T is 723 K.

In addition, in the case of T=300 K, the movement of the excess oxygen atom along the layer of indium atoms is very likely to occur, but the other transfer patterns are less likely to occur. In the case of T=723 K, not only the movement of the excess oxygen atom along the layer of indium atoms but also the movement of the oxygen vacancy along the layer of indium atoms is likely to occur, but the movement of each of the excess oxygen atom and the oxygen vacancy across the layer of indium atoms is difficult to occur.

Therefore, when the layer of indium atoms exists over a surface where a film is formed or a surface parallel to a surface of the film, like in the CAAC-OS film for example, both of the excess oxygen atom and the oxygen vacancy are likely to move along the surface where the film is formed or the surface of the film.

As described above, in the CAAC-OS film, the excess oxygen atom and the oxygen vacancy are likely to move along the surface where the CAAC-OS film is formed or the surface of the CAAC-OS film. Therefore, a problem arises in that oxygen is released from the side surface of the CAAC-OS film. When oxygen is released, the number of excess oxygen atoms is reduced, and thus it becomes difficult to compensate oxygen vacancies. When the oxygen vacancies exist, the conductivity of the CAAC-OS film might be increased to reach a level which is not favorable for use for a switching element.

Although the excess oxygen atom or the oxygen vacancy moves across the layer of indium atoms in the above description, the same applies to a case where another metal which is not indium is contained in the oxide semiconductor film.

Embodiment 2

In this embodiment, one embodiment of a method for manufacturing a semiconductor device will be described using FIGS. 13A and 13B, and one embodiment of a semiconductor device will be described using FIGS. 13C, 13D, and 13E.

Figure 13A:
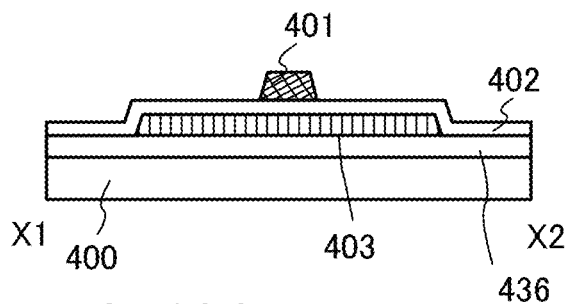
FIGS. 13A to 13E are process cross-sectional views and a top view illustrating one embodiment of the present invention.
Figure 13B:
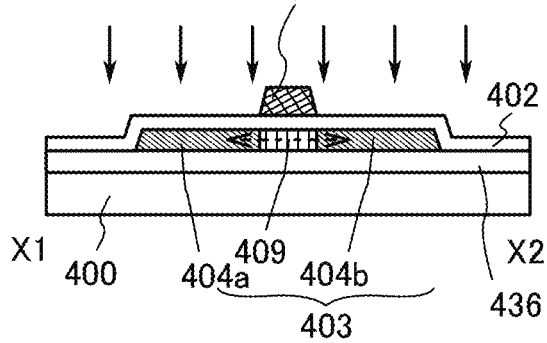
Figure 13C:
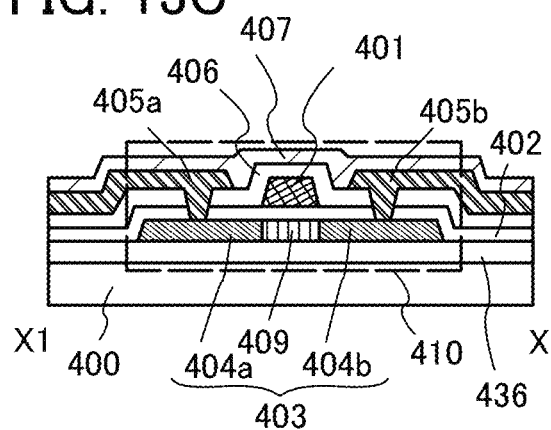
Figure 13D:
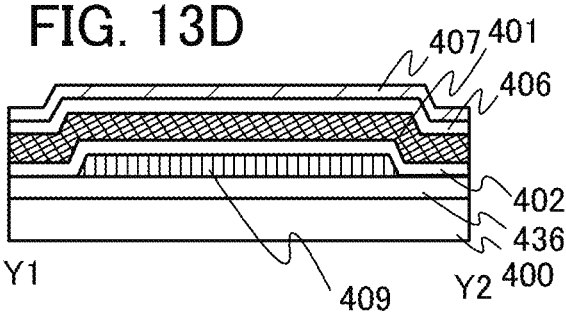
Figure 13E:
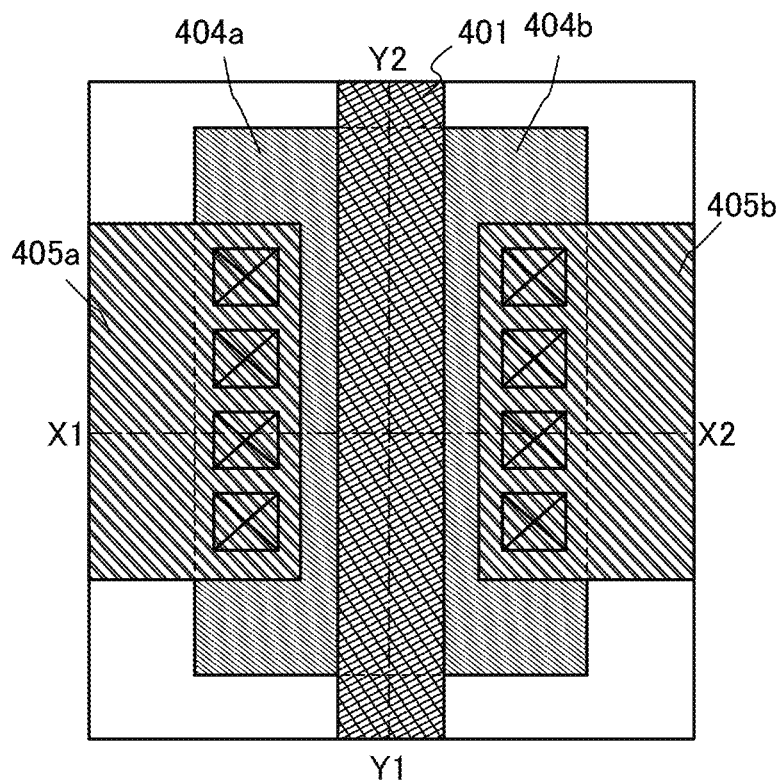

FIGS. 13C, 13D, and 13E illustrate cross-sectional views and a plan view of a transistor 410 which is an example of a semiconductor device. FIG. 13E is a plan view of the transistor 410, and FIG. 13C is a cross-sectional view taken along line X1-X2 of FIG. 13E. FIG. 13D is a cross-sectional view taken along line Y1-Y2 of FIG. 13E.

The transistor 410 illustrated in FIGS. 13C, 13D, and 13E includes a base insulating layer 436 over a substrate 400, an oxide semiconductor film 403 over the base insulating layer 436, a gate insulating film 402 which is provided over the oxide semiconductor film 403, a gate electrode layer 401 which is provided over the oxide semiconductor film 403 with the gate insulating film 402 positioned therebetween, an insulating film 406 which is provided over the gate electrode layer 401, a source electrode layer 405a and a drain electrode layer 405b which are electrically connected to the oxide semiconductor film 403 through openings formed in the gate insulating film 402 and the insulating film 406, and an insulating film 407 which is provided over the source electrode layer 405a and the drain electrode layer 405b.

Further, in the transistor 410, the oxide semiconductor film 403 preferably includes a channel formation region 409 which overlaps with the gate electrode layer 401, and a low-resistance region 404a and a low-resistance region 404b which have lower resistance than the channel formation region 409 and include a dopant and between which the channel formation region 409 is provided. The dopant is an element which causes a change in the conductivity of the oxide semiconductor film. One or more selected from the following can be used as the dopant: Group 15 elements (typical examples thereof are nitrogen (N), phosphorus (P), arsenic (As), and antimony (Sb)), boron (B), aluminum (Al), tungsten (W), molybdenum (Mo), indium (In), gallium (Ga), fluorine (F), chlorine (Cl), titanium (Ti), and zinc (Zn).

The oxide semiconductor film 403 can be in a single crystal state, a polycrystalline (also referred to as polycrystal) state, an amorphous state, or the like. In this embodiment, the low-resistance regions 404a and 404b to which the dopant is added are substantially amorphous regions or regions in which the proportion of amorphous components is higher than that of crystal components.

FIG. 13A is a cross-sectional view illustrating a step before introduction of an impurity element serving the dopant. The oxide semiconductor film 403 to which the impurity element serving as the dopant is not introduced is a single crystal film, a polycrystalline film (also referred to as a polycrystal film) or a CAAC-OS film.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

The single crystal film, the polycrystalline film, or the CAAC-OS film can be obtained by changing in deposition conditions of a deposition method, increasing the substrate temperature at the time of deposition, or performing heat treatment after the deposition as appropriate.

As illustrated in FIG. 13B, the low-resistance region 404a and the low-resistance region 404b can be formed in a self-aligned manner by introduction of the impurity element after the gate electrode layer 401 is formed, using the gate electrode layer 401 as a mask. As a method for introducing the impurity element, an ion implantation method or an ion doping method is used. The low-resistance regions can function as a source region and a drain region of the transistor 410.

With the low-resistance region 404a and the low-resistance region 404b, the electric field applied to the channel formation region 409 between the pair of low-resistance regions 404a and 404b can be relaxed. Further, the structure in which the source electrode layer 405a and the drain electrode layer 405b are in contact with the low-resistance region 404a and the low-resistance region 404b, respectively, leads to a reduction in contact resistance between the oxide semiconductor layer 403 and each of the source electrode layer 405a and the drain electrode layer 405b.

In this embodiment, the proportion of crystal components with respect to amorphous components in the channel formation region 409 is higher than the proportion of crystal components with respect to amorphous components in each of the low-resistance region 404a and the low-resistance region 404b. Hydrogen is attracted in a direction denoted by a dotted arrow in FIG. 13B, so that the channel formation region 409 has a lower hydrogen concentration than each of the low-resistance region 404a and the low-resistance region 404b.

The oxide semiconductor film 403 is preferably highly purified by sufficient removal of an impurity such as hydrogen or by supersaturation with oxygen by sufficient supply of oxygen. Specifically, the hydrogen concentration of the oxide semiconductor layer is lower than or equal to $5 \times 10^{19}$ atoms/cm$^3$, preferably lower than or equal to $5 \times 10^{18}$ atoms/cm$^3$, more preferably lower than or equal to $5 \times 10^{17}$ atoms/cm$^3$. Note that the above hydrogen concentration in the oxide semiconductor layer is measured by secondary ion mass spectrometry (SIMS). Further, for sufficient supply of oxygen to make the film in a supersaturated state, an insulating layer (e.g., SiO$_x$) containing an excess oxygen atom is preferably provided to be in contact with and covers the oxide semiconductor film 403.

The insulating layer containing the excess oxygen atom corresponds to the base insulating layer 436 and the gate insulating film 402 and is provided to cover and be in contact with the oxide semiconductor film 403. A SiO$_x$ or silicon oxynitride film containing a large amount of oxygen as a result of deposition under the conditions which are set as appropriate for a PCVD method or a sputtering method is used as the base insulating layer 436 and the gate insulating film 402. To make the insulating layer contain many more excess oxygen atoms, oxygen is added by oxygen doping treatment by an ion implantation method, an ion doping method, or plasma treatment.

Note that the above-described "oxygen doping" means that oxygen (which includes at least one of an oxygen radical, an oxygen atom, an oxygen molecule, an ozone, an oxygen ion (an oxygen molecule ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

For the oxygen doping treatment, a gas containing oxygen can be used. As the gas containing oxygen, oxygen, dinitrogen monoxide, nitrogen dioxide, carbon dioxide, carbon monoxide, or the like can be used. Further, a rare gas may be contained in the gas containing oxygen in the oxygen doping treatment.

By the above oxygen doping treatment, at least one oxygen excess region which contains oxygen in a proportion higher than that of oxygen in the stoichiometric composition of the insulating layer can be provided in a bulk of the insulating layer or at an interface between the insulating layer and the oxide semiconductor film.

The insulating film 406 is provided over the oxide semiconductor film 403, the gate insulating film 402, and the gate electrode layer 401. The insulating film 406 may be a planarization insulating film for reducing a surface roughness which is generated due to the transistor. As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

A blocking layer (e.g., AlO$_x$) that prevents release of oxygen from the oxide semiconductor film is preferably formed outside the insulating layer containing the excess oxygen atom to cover the oxide semiconductor film.

The insulating film 407 corresponds to the blocking layer. It is preferable that an aluminum film be stacked over the insulating layer containing the excess oxygen atom and oxygen doping treatment be performed on the insulating layer and the aluminum film from a position above the aluminum film so that a region containing oxygen in a proportion higher than that of oxygen in the stoichiometric composition is formed in the insulating layer and the aluminum film is oxidized to form an aluminum oxide film. Alternatively, it is preferable that a titanium oxide film, a tungsten oxide film, a nickel oxide film, a molybdenum oxide film, or a magnesium oxide film be stacked over an aluminum oxide film and the titanium oxide film, the tungsten oxide film, the nickel oxide film, the molybdenum oxide film, or the magnesium oxide film have a resistance higher than or equal to $1 \times 10^{10}$ Ωm and lower than or equal to $1 \times 10^{19}$ Ωm (more preferably higher than or equal to $1 \times 10^{10}$ Ωm and lower than or equal to $1 \times 10^{18}$ Ωm, further more preferably higher than or equal to $1 \times 10^{11}$ Ωm and lower than or equal to $1 \times 10^{15}$ Ωm). When the film has the above resistivity, electrostatic breakdown of the semiconductor device can be prevented.

When the insulating layer containing the excess oxygen atom or the blocking layer covers the oxide semiconductor film, the oxide semiconductor film can contain oxygen in a proportion which is substantially the same as that of oxygen in the stoichiometric composition, or in a proportion higher than that of oxygen in the stoichiometric composition i.e., the oxide semiconductor layer can be supersaturated with oxygen. For example, when the oxide semiconductor film is an IGZO film, an example of the stoichiometric composition is In:Ga:Zn:O=1:1:1:4 [atomic ratio]; thus, an atomic ratio of oxygen is four or more in the oxide semiconductor film.

Note that although the example in which the insulating film 406 and the insulating film 407 are stacked is described in this embodiment, one embodiment of the present invention is not limited thereto; for example, the insulating film 406 may be omitted.

The transistor 410 includes the oxide semiconductor film 403 in which a region containing a high proportion of crystal components (i.e., the channel formation region 409) and a region containing a high proportion of amorphous components (i.e., the low-resistance region 404a and the low-resistance region 404b) are mixed in a self-aligned manner, and the channel formation region 409 has a lower hydrogen concentration than the region containing a high proportion of amorphous components. Accordingly, hydrogen in the channel formation region of the transistor 410 is removed as much as possible and oxygen is supplied to the channel formation region, whereby the channel formation region can be highly purified to be intrinsic or substantially intrinsic. When the channel formation region is intrinsic, the threshold voltage value of the transistor can be made to be positive, whereby a so-called normally-off switching element can be achieved. In addition, the channel formation region of the transistor 410 has an extremely small minority carrier density and sources of carrier generation such as oxygen vacancy and hydrogen are reduced in the channel formation region; therefore, off-state current can be extremely small.

Embodiment 3

In this embodiment, an example of a method for manufacturing a semiconductor device in which sidewalls are provided on side surfaces of a gate electrode layer will be described using FIGS. 14A to 14E.

First, the base insulating layer 436 is formed over the substrate 400 having an insulation surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, a transistor 440a including the oxide semiconductor film 403 may be directly formed over a flexible substrate; or alternatively, the transistor 440a including the oxide semiconductor film 403 may be formed over a manufacturing substrate, and then may be separated and transferred to a flexible substrate. To separate the transistor 440a from the manufacturing substrate and transfer to the flexible substrate, a separation layer may be provided between the manufacturing substrate and the transistor 440a including the oxide semiconductor film 403.

The base insulating layer 436 can be formed by a plasma CVD method, a sputtering method, or the like, using silicon oxide, silicon oxynitride, aluminum oxide, aluminum oxynitride, hafnium oxide, gallium oxide, or a mixed material of any of these materials.

The base insulating layer 436 may be either a single layer or a stack of layers. For example, a silicon oxide film, an In—Hf—Zn-based oxide film, and the oxide semiconductor film 403 may be stacked in this order over the substrate 400; a silicon oxide film, an In—Zr—Zn-based oxide film with an atomic ratio of In:Zr:Zn=1:1:1, and the oxide semiconductor film 403 may be stacked in this order over the substrate 400; or a silicon oxide film, an In—Gd—Zn-based oxide film with an atomic ratio of In:Gd:Zn=1:1:1, and the oxide semiconductor film 403 may be stacked in this order over the substrate 400.

A silicon oxide film is formed by a sputtering method as the base insulating layer 436 in this embodiment.

Further, a nitride insulating film may be provided between the base insulating layer 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

The base insulating layer 436, which is in contact with the oxide semiconductor film 403, preferably contains oxygen which exceeds at least the stoichiometric composition in the film (bulk). For example, in the case where a silicon oxide film is used as the base insulating layer 436, the composition formula is $SiO_{2+\alpha}$ ($\alpha>0$). With such a film as the base insulating layer 436, oxygen can be supplied to the oxide semiconductor film 403, leading to favorable characteristics. By a supply of oxygen to the oxide semiconductor film 403, oxygen vacancies in the film can be filled.

For example, when the base insulating layer 436 containing a large amount (excessive) oxygen, which serves as an oxygen supply source, is provided so as to be in contact with the oxide semiconductor film 403, oxygen can be supplied from the base insulating layer 436 to the oxide semiconductor film 403. The oxide semiconductor film 403 and the base insulating layer 436 may be subjected to heating treatment in a state where the oxide semiconductor film 403 and the base insulating layer 436 are at least partly in contact with each other, so that oxygen may be supplied to the oxide semiconductor film 403.

Planarization treatment may be performed on a region of the base insulating layer 436 which is in contact with the oxide semiconductor film 403. The planarization treatment may be, but not particularly limited to, a polishing treatment (such as chemical mechanical polishing (CMP)), a dry etching treatment, or a plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the base insulating layer 436.

As the planarization treatment, polishing treatment, dry etching treatment, or plasma treatment may be performed plural times, or these treatments may be performed in combination. In the case where the treatments are performed in combination, the order of steps is not particularly limited and may be set as appropriate depending on the unevenness of the surface of the base insulating layer 436.

Planarization treatment may be performed on a surface of the silicon oxide film used as the base insulating layer 436 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness (Ra) of the surface of the silicon oxide film is preferably approximately 0.15 nm.

Then, the oxide semiconductor film 403 is formed over the base insulating layer 436.

In order that hydrogen or water is not contained in the oxide semiconductor film 403 as much as possible in the formation process of the oxide semiconductor film 403, it is preferable to heat the substrate provided with the base insulating layer 436 in a preheating chamber in a sputtering apparatus as a pretreatment for formation of the oxide semiconductor film 403 so that impurities such as hydrogen and moisture adsorbed to the substrate and the base insulating layer 436 are eliminated and evacuated. As an exhaustion unit provided in the preheating chamber, a cryopump is preferable.

In order to reduce impurities such as hydrogen (including water and a hydroxyl group) and make the base insulating layer 436 an oxygen-excess film, heat treatment (dehydration or dehydrogenation) to remove hydrogen including water and a hydroxyl group and/or oxygen doping treatment may be performed on the base insulating layer 436. The dehydration or dehydrogenation and the oxygen doping treatment each may be performed plural times, and may be combined and repeated.

It is preferable that the oxide semiconductor film 403 contain oxygen in a proportion higher than that in the stoichiometric composition to be supersaturated shortly after the oxide semiconductor film 403 is deposited. For example, in the case where the oxide semiconductor film 403 is formed by a sputtering method, deposition is preferably performed under such a condition that the ratio of oxygen to a deposition gas is high. In particular, deposition is preferably performed in an oxygen atmosphere (100% oxygen gas). When the formation is performed in the state where the proportion of oxygen in the deposition gas is large, particularly in a 100% oxygen gas atmosphere, release of zinc from the film can be reduced even at a deposition temperature higher than or equal to 300° C., for example.

In addition, the oxide semiconductor film 403 is supersaturated with oxygen by being supplied with enough oxygen; thus, the insulating films in contact with the oxide semiconductor film 403 (the plurality of insulating films provided so as to surround the oxide semiconductor film 403) preferably contain an excess oxygen atom.

Note that in this embodiment, a target used for forming the oxide semiconductor film 403 by a sputtering method is, for example, an oxide target having a composition of In:Ga:Zn=3:1:2 [atomic percentage], so that an In—Ga—Zn-based oxide film (IGZO film) is formed.

The relative density (the fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas from which impurities such as hydrogen, water, a hydroxyl group, or hydride are removed be used as a sputtering gas for the formation of the oxide semiconductor film 403.

The substrate is held in a deposition chamber kept under reduced pressure. Then, a sputtering gas in which impurities such as hydrogen and moisture are sufficiently removed is introduced into the deposition chamber from which remaining moisture is being removed, and the oxide semiconductor film 403 is formed over the substrate 400 with the use of the target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition chamber can be reduced.

The base insulating layer 436 and the oxide semiconductor film 403 are preferably formed in succession without exposure to the air. When the insulating layer 436 and the oxide semiconductor film 403 are formed in succession without exposure to the air, impurities such as hydrogen and moisture can be prevented from being adsorbed onto a top surface of the base insulating layer 436.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, Or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas of $BCL_3$ and $Cl_2$ ($BCL_3$: $Cl_2$=60 sccm: 20 sccm), a power of 450 W, a bias power of 100 W, and a pressure of 1.9 Pa), so that the IGZO film is processed into an island shape.

It is preferable that the oxide semiconductor film 403 be highly purified to contain few impurities such as copper, aluminum, and chlorine. In the process for manufacturing the transistor 440a, steps in which these impurities are not mixed or attached to the surface of the oxide semiconductor film 403 are preferably selected as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ atoms/cm$^3$, preferably lower than or equal to $1\times10^{17}$ atoms/cm$^3$. Further, the concentration of aluminum in the oxide semiconductor film 403 is lower than or equal to $1\times10^{18}$ atoms/cm$^3$. Further, the concentration of chlorine in the oxide semiconductor film 403 is lower than or equal to $2\times10^{18}$ atoms/cm$^3$.

Further, heat treatment may be performed on the oxide semiconductor film 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. for one hour in a nitrogen atmosphere.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity N$_2$O gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the N$_2$O gas acts to supply oxygen that is a main constituent material of the oxide semiconductor and that is reduced by the step for removing an impurity for dehydration or dehydrogenation, so that the oxide semiconductor film 403 can be a high-purified, electrically i-type (intrinsic) oxide semiconductor film.

The heat treatment for dehydration or dehydrogenation may be performed after a film-shaped oxide semiconductor film is formed or after the island-shaped oxide semiconductor film 403 is formed.

The heat treatment for dehydration or dehydrogenation may be performed plural times and may be combined with another heat treatment.

When the heat treatment for dehydration or dehydrogenation is performed in the state where the base insulating layer 436 is covered with the film-shaped oxide semiconductor film 403 which has not been processed into the island-shaped oxide semiconductor film 403, oxygen contained in the oxide insulating layer 436 can be prevented from being released by the heat treatment, which is preferable.

Next, a gate insulating film 442 is formed to cover the oxide semiconductor film 403.

To improve the coverage with the gate insulating film 442, the above-described planarizing treatment may be performed also on the surface of the oxide semiconductor film 403. It is preferable that the flatness of the surface of the oxide semiconductor film 403 be good particularly when the thickness of the gate insulating film 442 is small.

The gate insulating film 442 has a thickness greater than or equal to 1 nm and less than or equal to 20 nm and can be formed by a sputtering method, an MBE method, a CVD method, a pulse laser deposition method, an ALD method, or the like as appropriate.

The gate insulating film 442 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 442 include oxygen in a portion which is in contact with the oxide semiconductor film 403. In particular, the gate insulating film 442 preferably contains oxygen at least in a proportion higher than that of oxygen in the stoichiometric ratio in the film (bulk). For example, in the case where a silicon oxide film is used as the gate insulating film 442, the composition formula is SiO$_{2+\alpha}$ ($\alpha>0$). In this embodiment, a silicon oxide film of SiO$_{2+\alpha}$ ($\alpha>0$) is used as the gate insulating film 442. By using the silicon oxide film as the gate insulating film 442, oxygen can be supplied to the oxide semiconductor film 403, leading to favorable characteristics. Further, the gate insulating film 442 is preferably formed in consideration of the size of a transistor to be formed and the step coverage with the gate insulating film 442.

The gate insulating film 442 can be formed using a high-k material such as hafnium oxide, yttrium oxide, hafnium silicate (HfSi$_x$O$_y$ ($x>0$, $y>0$)), hafnium silicate to which nitrogen is added, hafnium aluminate (HfAl$_x$O$_y$ ($x>0$, $y>0$)), or lanthanum oxide, whereby gate leakage current can be reduced. Further, the gate insulating film 442 has either a single-layer structure or a stacked-layer structure.

In order to reduce impurities such as hydrogen including water and a hydroxyl group and make the gate insulating film 442 an oxygen-excess film, heat treatment (dehydration or dehydrogenation) to remove hydrogen including water and a hydroxyl group and/or oxygen doping treatment may be performed on the gate insulating film 442. The dehydration or dehydrogenation and the oxygen doping treatment each may be performed plural times, and may be combined and repeated.

In this embodiment, the gate insulating film 442 is subjected to oxygen plasma treatment with microwaves while being heated at a temperature higher than or equal to 200° C. and lower than or equal to 400° C. By this treatment, the density of the gate insulating film 442 is increased and dehydration or dehydrogenation treatment and oxygen doping treatment can be performed on the gate insulating film 442.

Next, a stack of the conductive film and the insulating film is formed over the gate insulating film 442 and etched, so that a stack of the gate electrode layer 401 and the insulating film 413 is formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV (electron volts) or higher, preferably 5.5 eV (electron volts) or higher, which enables the threshold voltage of the transistor to take a positive value when used as the gate electrode layer, so that a switching element of so-called normally-off type can be realized.

The insulating film 413 can be formed using an inorganic insulating film such as a silicon nitride film, an aluminum nitride film, a silicon nitride oxide film, an aluminum nitride oxide film, a silicon oxide film, a silicon oxynitride film, an aluminum oxide film, an aluminum oxynitride film. The insulating film 413 can be formed by a plasma CVD method, a sputtering method, or the like.

Figure 14A:
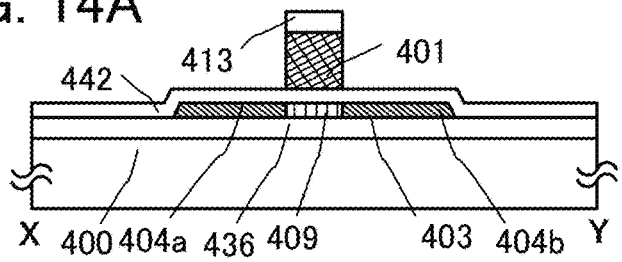
FIGS. 14A to 14E are cross-sectional views illustrating one embodiment of the present invention.

Next, a dopant is introduced into the oxide semiconductor film 403 with the use of the gate electrode layer 401 and the insulating film 413 as masks, so that the low-resistance regions 404a and 404b are formed (see FIG. 14A).

The introduction of the dopant may be controlled by setting the introduction conditions such as the accelerated voltage and the dosage, or the thickness of the films through which the dopant passes as appropriate. In this embodiment, phosphorus is used as the dopant, and phosphorus ions are implanted by an ion implantation method. The dosage of the dopant can be set to be greater than or equal to $1 \times 10^{13}$ ions/cm$^2$ and less than or equal to $5 \times 10^{16}$ ions/cm$^2$.

The concentration of the dopant in the low-resistance regions is preferably higher than or equal to $5 \times 10^{18}$/cm$^3$ and lower than or equal to $1 \times 10^{22}$/cm$^3$.

The substrate 400 may be heated in adding the dopant.

The introduction of the dopant to the oxide semiconductor film 403 may be performed plural times, and the number of kinds of dopant may be plural.

Heat treatment may be performed thereon after the dopant addition. The heat treatment is preferably performed at a temperature higher than or equal to 300° C. and lower than or equal to 700° C. (further preferably higher than or equal to 300° C. and lower than or equal to 450° C.) for one hour in an oxygen atmosphere. The heat treatment may be performed in a nitrogen atmosphere, reduced pressure, or the air (ultra-dry air).

In this embodiment, phosphorus (P) ions are implanted into the oxide semiconductor film 403 by an ion implantation method. Note that the conditions of the phosphorus (P) ion implantation are as follows: the acceleration voltage is 30 kV and the dosage is $1.0 \times 10^{15}$ ions/cm$^2$.

The oxide semiconductor film 403 is a CAAC-OS film, a polycrystalline film, or a single crystal film. When a dopant is introduced to the oxide semiconductor film 403, part of the oxide semiconductor film 403 might be made amorphous although depending on conditions of the dopant introduction or the kind of the dopant. For example, by the dopant introduction, an upper layer of the oxide semiconductor film which does not overlap with the gate electrode layer 401 is made amorphous, but a lower layer thereof is not doped with the dopant and keeps the crystal components as they are in some cases. In the case where part of the oxide semiconductor film is made amorphous as described above, it is preferable that the amorphized region be recrystallized by the heat treatment to increase the crystallinity of the oxide semiconductor film 403.

Through the above-described steps, the oxide semiconductor film 403 which has high crystallinity and in which the low-resistance regions 404a and 404b are provided with the channel formation region 409 provided therebetween can be formed.

Figure 14B:
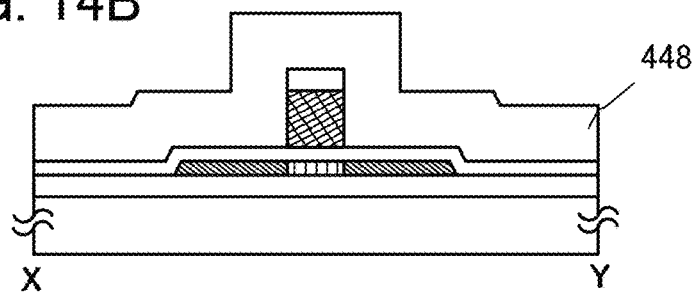

Next, to form sidewall insulating layers (hereinafter also referred to as sidewalls), an insulating film 448 is formed (see FIG. 14B).

The insulating film 448 can be typically formed using an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film, and may be a single layer or a stack of layers. The insulating film 448 can be formed by a plasma CVD method, a sputtering method, or a CVD method using a deposition gas. As a CVD method, an LPCVD method, a plasma CVD method, or the like can be used, and as another method, a coating method or the like can also be used.

Then, anisotropic etching is performed on the insulating film 448 to form sidewall insulating layers 414a and 414b.

Figure 14C:
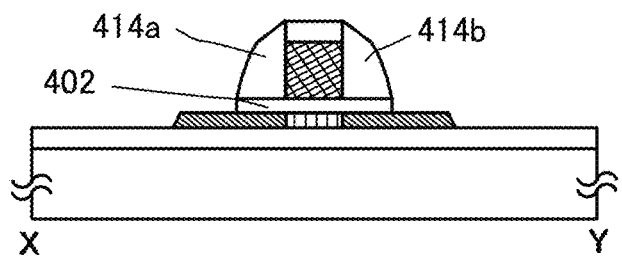
Figure 14D:
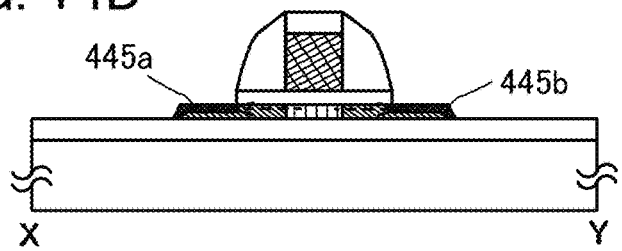

The gate insulating film 442 is etched using the gate electrode layer 401, the insulating film 413, and the sidewall insulating layers 414a and 414b as masks, whereby the gate insulating film 402 is formed (see FIG. 14C). In addition, a portion of the low-resistance region 404a and a portion of the low-resistance region 404b are exposed by the etching of the gate insulating film 442.

Next, the exposed portions of the low-resistance regions 404a and 404b are subjected to treatment for amorphization. As one way to perform amorphization on the exposed portions, the exposed portions may be subjected to argon plasma or oxygen plasma. Alternatively, the exposed portions may be subjected to plasma containing a dopant. In the case where the thickness of the oxide semiconductor film 403 is sufficiently larger than a depth from a surface of the oxide semiconductor film 403 to which oxygen, argon, or the dopant is added by plasma, only surface layers of the exposed portions of the low-resistance regions 404a and 404b become amorphous regions 445a and 445b by the exposure to the plasma and the other regions keep their crystal components as they are (see FIG. 14D). When the amorphous regions 445a and 445b are provided, hydrogen is attracted in directions denoted by dotted arrows in FIG. 14D and the hydrogen is attracted and fixed to the amorphous regions 445a and 445b, so that hydrogen in a channel formation region can be removed as much as possible.

In addition, in the treatment for performing amorphization on the exposed portions of the low-resistance regions 404a and 404b, the insulating film 413 and the sidewall insulating layers 414a and 414b are important for protection of the gate electrode layer 401 against the plasma.

As another way to perform amorphization on the exposed portions of the low-resistance regions 404a and 404b, argon, oxygen, or a dopant may be added using an ion implantation apparatus or an ion plasma apparatus.

Next, as a dense inorganic insulating film (typically an aluminum oxide film) serving as a protective insulating film, the insulating film 407 is formed over the oxide semiconductor film 403, the gate insulating film 402, and the gate electrode layer 401.

The insulating film 407 may be a single layer or a stack of layers and preferably includes at least an aluminum oxide film.

Providing an aluminum oxide film having high density (the film density higher than or equal to 3.2 g/cm$^3$, preferably higher than or equal to 3.6 g/cm$^3$) can stabilize the electric characteristics of the transistor 440a. The film density can be measured by Rutherford backscattering spectrometry or X-ray reflectometry. The aluminum oxide film preferably contains oxygen at least in a proportion higher than that of oxygen in the stoichiometric composition in the film (bulk). For example, in the case of using the aluminum oxide film, the composition may be AlOx (x>1.5).

An aluminum oxide film which is used as the insulating film 407 has a high shielding effect (blocking effect), which is not permeable to either oxygen or impurities such as hydrogen or moisture.

Therefore, during the manufacturing process and after the manufacture, the insulating film 407 functions as a protective film for preventing entry of impurities such as hydrogen and moisture which might cause variation in characteristics into the oxide semiconductor film 403 and release of oxygen which is a main component of the oxide semiconductor from the oxide semiconductor film 403. Further, the aluminum oxide film can supply oxygen to the oxide semiconductor film 403 which is in contact with the aluminum oxide film.

The insulating film 407 can be formed by a plasma CVD method, a sputtering method, an evaporation method, or the like. As the insulating film 407, a metal oxide film which is obtained by oxidation of a metal film may be used. An aluminum oxide film which is obtained by oxygen doping treatment performed on an aluminum film is used in this embodiment.

As the insulating film 407, an inorganic insulating film such as a silicon oxide film, a silicon oxynitride film, an aluminum oxynitride film, or a gallium oxide film can be typically used as well as the aluminum oxide film. Furthermore, as the insulating film 407, a hafnium oxide film, a magnesium oxide film, a zirconium oxide film, a lanthanum oxide film, a barium oxide film, or a metal nitride film (e.g., an aluminum nitride film) can be used.

An interlayer insulating film 415 is formed over the insulating film 407. The interlayer insulating film 415 can be formed using the same material and method as the insulating film 407. The interlayer insulating film 415 is formed to a thickness which is large enough to planarize unevenness caused by the transistor 440a. As the interlayer insulating film 415, a silicon oxynitride film formed by a CVD method or a silicon oxide film formed by a sputtering method can be used.

In addition, a planarization insulating film may be formed as the interlayer insulating film 415 to reduce surface unevenness caused by the transistor. As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like.

Openings reaching the oxide semiconductor film 403 are formed in the interlayer insulating film 415 and the insulating film 407, and the source electrode layer 405a and the drain electrode layer 405b are formed in the openings. The transistor is connected to another transistor or an element with the use of the source electrode layer 405a and the drain electrode layer 405b, so that a variety of circuits can be formed.

As the conductive film used for the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the source electrode layer 405a and the drain electrode layer 405b, a single layer of a molybdenum film, a stack of a tantalum nitride film and a copper film, a stack of a tantalum nitride film and a tungsten film, or the like can be used.

To reduce the number of steps, as another method of the treatment for performing amorphization on the exposed portions of the low-resistance regions 404a and 404b, a process for forming a conductive film by sputtering with a high electric power may be used for formation of a conductive film used for the source electrode layer 405a and the drain electrode layer 405b. In this case, the exposed portions of the low-resistance regions 404a and 404b can be made amorphous depending on the deposition conditions of the conductive film, and thus the part of the oxide semiconductor film can be made amorphous without an increase in the number of steps.

Figure 14E:
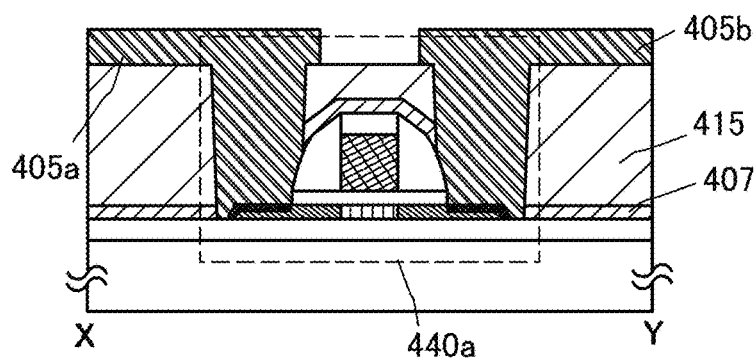

Through the above process, a semiconductor device including the transistor 440a of this embodiment can be manufactured (see FIG. 14E).

FIGS. 15A to 15D and FIGS. 16A and 16B respectively illustrate transistors 440b, 440c, 440d, 440e, 440f, and 440g which have different structures from the transistor 440a.

In each of the transistors 440b, 440c, 440d, and 440e, the source electrode layer 405a and the drain electrode layer 405b are provided in contact with the exposed top surface of the oxide semiconductor film 403 and the sidewall insulating layers 414a and 414b. Therefore, a distance between the gate electrode layer 401 and each of the amorphous regions 445a and 445b where the oxide semiconductor film 403 is in contact with the source electrode layer 405a and the drain electrode layer 405b corresponds to the width of the sidewall insulating layer in the channel length direction, whereby the further miniaturization can be achieved and variation in the manufacturing process can be suppressed.

As described above, the distance between the gate electrode layer 401 and each of the amorphous regions 445a and 445b where the oxide semiconductor film 403 is in contact with the source electrode layer 405a and the drain electrode layer 405b can be short; thus, the resistance between the gate electrode layer 401 and each of the regions (the amorphous regions 445a and 445b) where the oxide semiconductor film 403 is in contact with the source electrode layer 405a and the drain electrode layer 405b is reduced. As a result, on-state characteristics of the transistors 440b, 440c, 440d, and 440e can be improved.

Figure 15A:
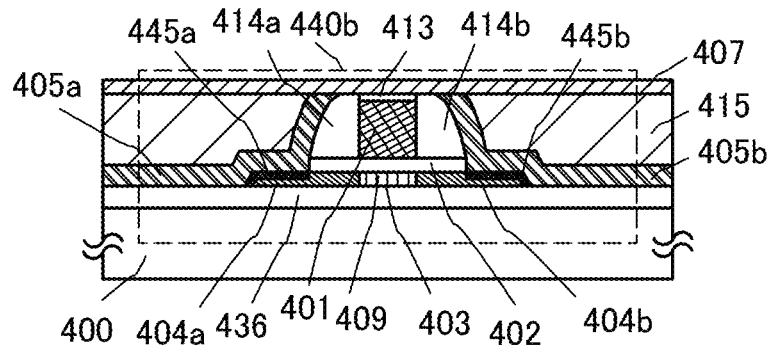
FIGS. 15A to 15D are cross-sectional views each illustrating one embodiment of the present invention.
Figure 15B:
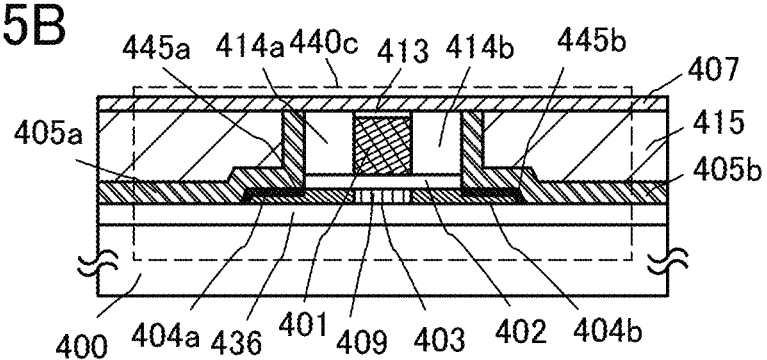
Figure 15C:
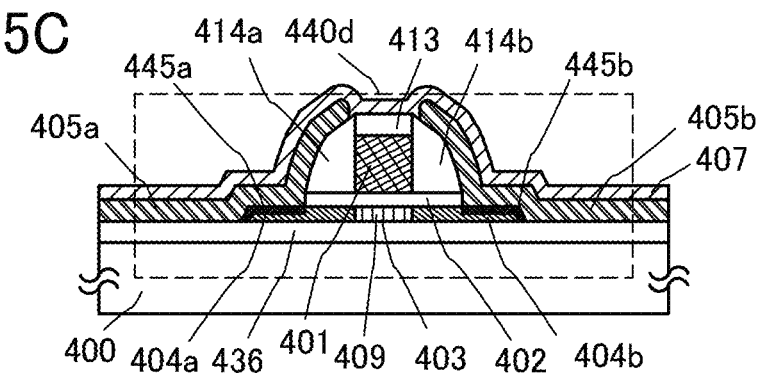
Figure 15D:
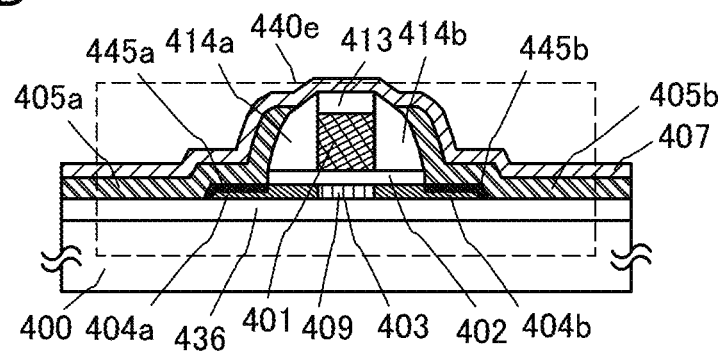
Figure 16A:
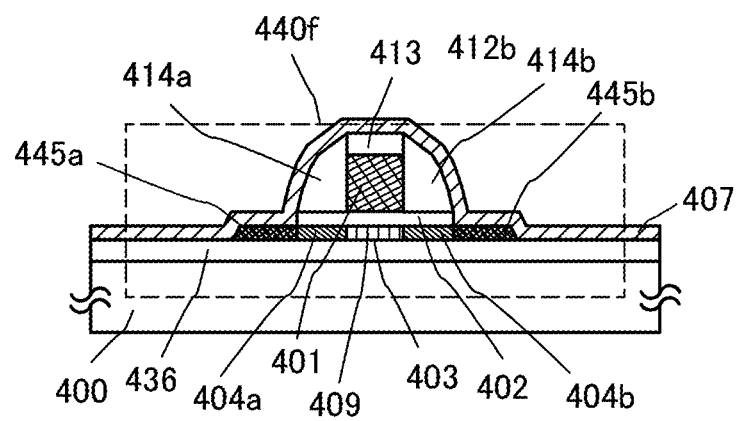
FIGS. 16A and 16B are cross-sectional views each illustrating one embodiment of the present invention.
Figure 16B:
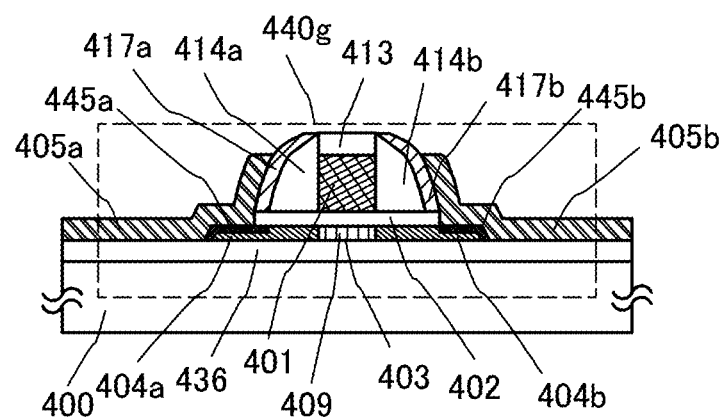

Further, in FIGS. 15A and 15B, the insulating film 407 is provided in contact with the interlayer insulating film 415, the source electrode layer 405a, the drain electrode layer 405b, the sidewall insulating layers 414a and 414b, and the insulating film 413.

In the manufacturing process of each of the transistor 440b and the transistor 440c, a conductive film provided over the gate electrode layer 401, the insulating film 413, and the sidewall insulating layers 414a and 414b is cut (ground or polished) so that the conductive film is removed and divided, whereby the source electrode layer 405a and the drain electrode layer 405b are formed. As the cutting (grinding or polishing) method, a chemical mechanical polishing (CMP) method can be preferably used.

In the manufacturing process of the transistor 440d, a conductive film provided over the gate electrode layer 401, the insulating film 413, and the sidewall insulating layers 414a and 414b is etched using a resist mask formed through a photolithography process, whereby the source electrode layer 405a and the drain electrode layer 405b are formed.

In the manufacturing process of the transistor 440e, a conductive film provided over the gate electrode layer 401, the insulating film 413, and the sidewall insulating layers 414a and 414b is made to recede by etching using a resist mask formed through a photolithography process, whereby the source electrode layer 405a and the drain electrode layer 405b are formed.

In the transistor 440f, the source electrode layer and the drain electrode layer are provided in regions of the oxide semiconductor film 403 which do not overlap with the gate insulating film 402. Sputtering with high power is performed on the oxide semiconductor film 403, and a metal film (e.g., an aluminum film or a titanium film) is formed and made amorphous. Then, heat treatment is performed so that a metal element is diffused into the oxide semiconductor film 403 to reduce resistance, whereby the amorphous region 445a functioning as a source electrode layer and the amorphous region 445b functioning as a drain electrode layer are formed. Note that the metal film is removed after the formation of the amorphous regions 445a and 445b.

In the transistor 440g, the sidewall insulating layers include barrier films. Insulating films serving as the barrier films are formed to cover the sidewall insulating layers 414a and 414b. After the insulating film 448 is formed, anisotropic etching is performed on the insulating film 448 to form the sidewall insulating layers 414a and 414b. Then, the insulating film to be the barrier films is deposited and is subjected to anisotropic etching, so that insulating films 417a and 417b are formed. For example, as the barrier film, an aluminum film may be formed and oxygen doping treatment may be performed on the aluminum film to form an aluminum oxide film. Anisotropic etching is performed on the insulating film 448 and another step of anisotropic etching is performed on the barrier film, whereby the sidewall insulating layers including the sidewall insulating layers 414a and 414b and the insulating films 417a and 417b as provided in the transistor 440g can be formed.

As described above, any of the transistors 440a to 440g including the oxide semiconductor film including the channel formation region which keeps its crystal component and the amorphous region containing a high proportion of amorphous components is included in a semiconductor device, whereby stable electrical characteristics and high reliability can be achieved in the semiconductor device.

Accordingly, a structure of a semiconductor device including a transistor including an oxide semiconductor film, which enables high-speed response and high-speed driving, and a method for manufacturing the semiconductor device can be provided.

Embodiment 4

An example in which a transistor and a capacitor are formed over the same substrate without an increase in the number of steps will be described in this embodiment using FIGS. 17A and 17B.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

Figure 17A:
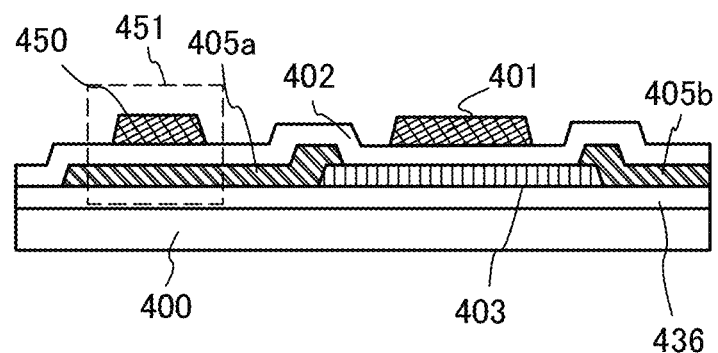
FIGS. 17A and 17B are cross-sectional views illustrating one embodiment of the present invention.
Figure 17B:
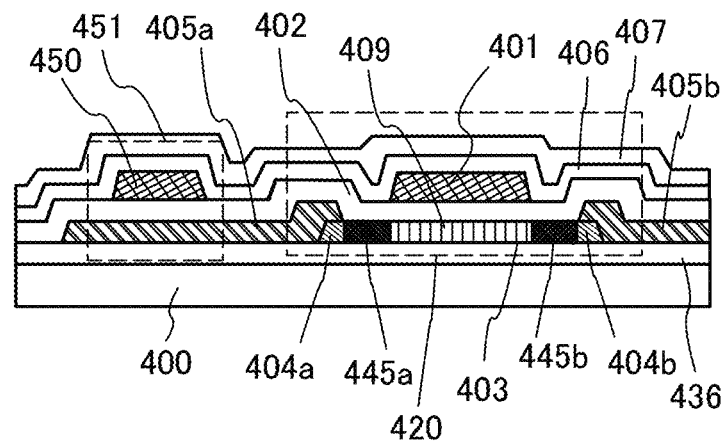

A transistor 420 which is illustrated in FIG. 17B is an example of a planar transistor having a top-gate structure.

The transistor 420 illustrated in FIG. 17B includes, over the substrate 400 having an insulating surface over which the base insulating layer 436 is provided, the oxide semiconductor film 403 including the channel formation region 409, the low-resistance regions 404a and 404b, and the amorphous regions 445a and 445b; the source electrode layer 405a; the drain electrode layer 405b; the gate insulating film 402; and the gate electrode layer 401. The insulating films 406 and 407 are formed over the transistor 420. A capacitor wiring 450 which is formed using the same material as the gate electrode layer 401 overlaps with the source electrode layer 405a with the gate insulating film 402 positioned therebetween to form a capacitor 451 using the gate insulating film 402 as a dielectric.

An example of a method for manufacturing a semiconductor device is described using FIG. 17A. Note that steps for forming the base insulating layer 436 and the oxide semiconductor film 403 containing a crystal component are the same as those described in Embodiment 2, and thus detailed description thereof is omitted here.

After the oxide semiconductor film 403 containing the crystal component is formed, a conductive film to be a source electrode layer and a drain electrode layer (including a wiring formed using the same layer) is formed over the oxide semiconductor film 403. As the conductive film, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used.

Next, a resist mask is formed over the conductive film through a photolithography step and selective etching is performed, so that the source electrode layer 405a and the drain electrode layer 405b are formed. Then, the resist mask is removed.

Note that in the case where plasma is used for the formation of the conductive film by sputtering or the etching for forming the source electrode layer 405a and the drain electrode layer 405b, a surface of the oxide semiconductor film 403 might be made amorphous or impurities might be attached thereto. In such cases, it is preferable that the amorphized surface be exposed to oxalic acid, dilute hydrofluoric acid, or the like or subjected to plasma treatment (e.g., $N_2O$ plasma treatment) so that the amorphized surface is removed to expose the crystal component or the impurities on the surface of the oxide semiconductor film are removed. The thickness of the exposed portions of the oxide semiconductor film 403 is reduced when the amorphized surface is exposed to oxalic acid, dilute hydrofluoric acid, or the like or subjected to plasma treatment (e.g., $N_2O$ plasma treatment), which is not shown in FIGS. 17A and 17B.

Next, the gate insulating film 402 is formed to cover the oxide semiconductor film 403, the source electrode layer 405a, and the drain electrode layer 405b.

Then, the gate electrode layer 401 is formed over the gate insulating film 402 by a plasma CVD method, a sputtering method, or the like (see FIG. 17A). In the case where an insulating film with a small thickness is used as the gate insulating film 402, planarization treatment may be performed before the gate insulating film 402 is formed. The capacitor wiring 450 is formed also over the gate insulating film 402 using the same material as the gate electrode layer 401 in this embodiment. The capacitor 451 is formed using, as a dielectric, part of the gate insulating film 402 sandwiched between the source electrode layer 405a and the capacitor wiring 450.

Next, a rare gas or a dopant is introduced into the oxide semiconductor film 403 using the gate electrode layer 401, the source electrode layer 405a, and the drain electrode layer 405b as masks to cause amorphization, whereby the amorphous regions 445a and 445b are formed.

In some cases, the rare gas or the dopant is also introduced to regions of the oxide semiconductor film 403 which are located under the source electrode layer 405a and the drain electrode layer 405b and the regions are made amorphous, depending on the thickness of each of the source electrode layer 405a and the drain electrode layer 405b and the conditions of the introduction of the rare gas or the dopant.

When the amorphous regions 445a and 445b are provided, hydrogen can be attracted and fixed to the amorphous regions 445a and 445b so that hydrogen in the channel formation region 409 can be removed as much as possible.

Although regions reaching the interface between the oxide semiconductor film 403 and the base insulating layer 436 are illustrated as the amorphous regions 445a and 445b in this embodiment, the rare gas or the dopant may be introduced to only the vicinity of the surface so that only an upper layer becomes an amorphous region, depending on conditions for amorphization by the introduction of the rare gas or the dopant. Even in such a case, hydrogen can be attracted and fixed to the amorphous region so that hydrogen of the channel formation region 409 can be removed as much as possible.

Next, the insulating film 406 is formed over the oxide semiconductor film 403, the gate insulating film 402, and the gate electrode layer 401.

Then, the insulating film 407 is formed as a dense inorganic insulating film (typically an aluminum oxide film) serving as a protective insulating film over the insulating film 406 (see FIG. 17B). Although the insulating films 406 and 407 are stacked in this embodiment, this embodiment is not limited thereto, and the insulating film 406 may be omitted.

In addition, to efficiently introduce the rare gas or the dopant, the gate insulating film 402 may be etched using the gate electrode layer 401 and the capacitor wiring 450 as masks before the introduction so that part of the oxide semiconductor film 403 is exposed. In addition, after the part of the oxide semiconductor film 403 is exposed, argon plasma treatment or oxygen plasma treatment may be performed so that the exposed part of the oxide semiconductor film 403 may be made amorphous.

Note that in FIG. 17B, regions which overlap and are in contact with the source electrode layer 405a and the drain electrode layer 405b are illustrated as the low-resistance regions 404a and 404b, and the amorphous region 445a is provided between the channel formation region 409 and the low-resistance region 404a. Further, the amorphous region 445b is provided between the channel formation region 409 and the low-resistance region 404b. The amorphous regions 445a and 445b have a higher hydrogen concentration than the channel formation region 409 and the low-resistance regions 404a and 404b.

As described above, the transistor 420 which includes the oxide semiconductor film including the channel formation region 409 which keeps its crystal component and the amorphous regions 445a and 445b containing a high proportion of amorphous components is provided in the semiconductor device, so that stable electrical characteristics and high reliability can be achieved in the semiconductor device.

This embodiment can be freely combined with Embodiment 2 or Embodiment 3. For example, in the case where this embodiment is combined with Embodiment 3, a sidewall insulating layer may be provided in contact with the side surface of the gate electrode layer. In this case, the sidewall insulating layer is provided in contact with the side surface of the capacitor wiring 450.

Embodiment 5

In this embodiment, an example of a semiconductor device (memory device) which is different from that described in Embodiment 1 will be described with reference to drawings.

Figure 18A:
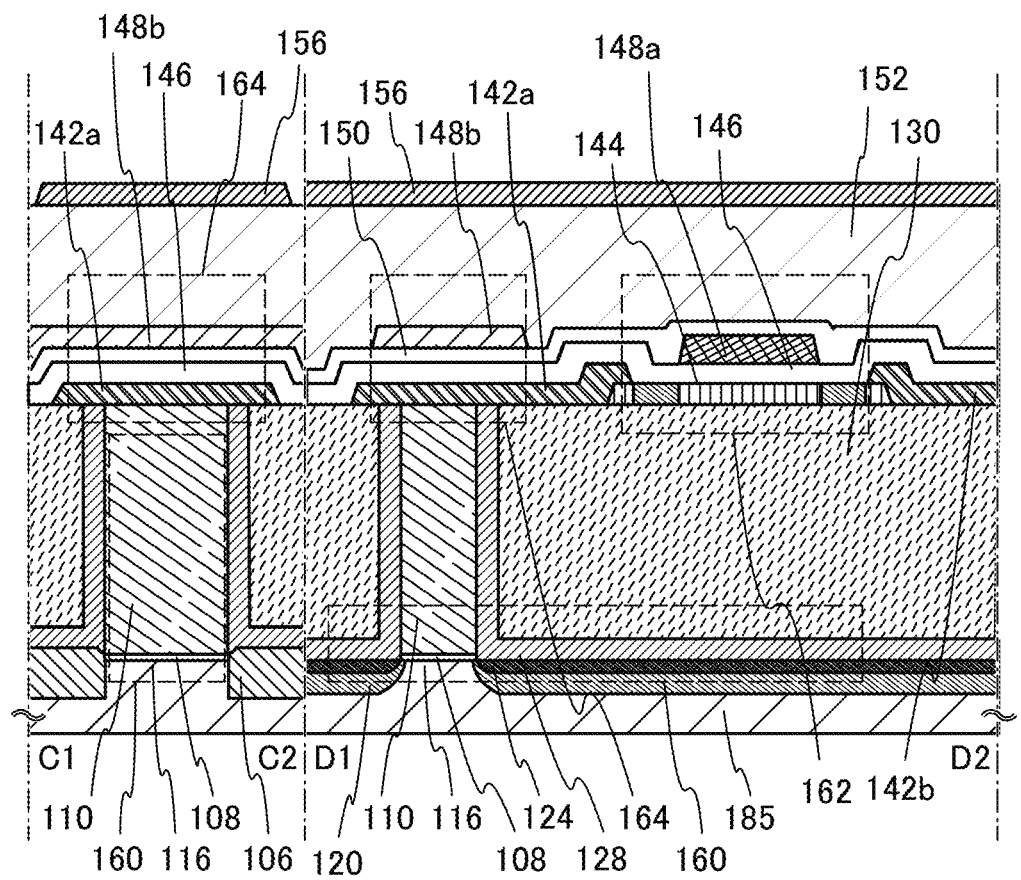
FIGS. 18A to 18C are a cross-sectional view, a top view, and a circuit diagram illustrating one embodiment of a semiconductor device.
Figure 18B:
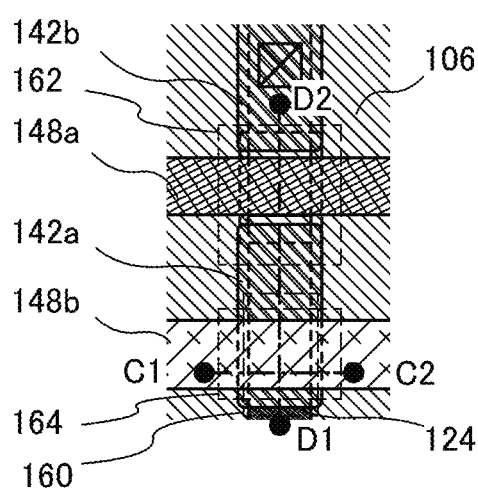
Figure 18C:
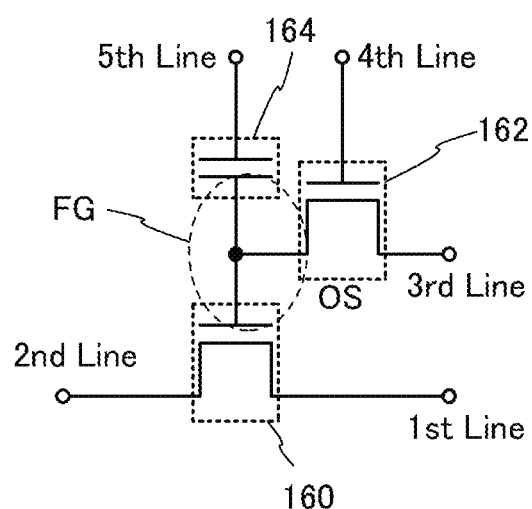

In FIGS. 18A and 18B, an example of the structure of the semiconductor device is illustrated. FIG. 18A is a cross-sectional view of the semiconductor device, FIG. 18B is a plan view of the semiconductor device, and FIG. 18C is a circuit diagram of the semiconductor device. Here, FIG. 18A corresponds to cross sections taken along line C1-C2 and line D1-D2 in FIG. 18B.

The semiconductor device illustrated in FIGS. 18A and 18B includes a transistor 160 using a first semiconductor material in its lower portion, and a transistor 162 using a second semiconductor material in its upper portion. The transistor 162 has the structure of the transistor 420 described in Embodiment 3 as an example.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although the above-described transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, 2, or 3, which is formed using an oxide semiconductor for holding data.

The transistor 160 in FIG. 18A includes a channel formation region 116 provided in a substrate 185 containing a semiconductor material (e.g., silicon), impurity regions 120 provided so that the channel formation region 116 is sandwiched therebetween, intermetallic regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 185 to surround the transistor 160. An insulating layer 128 and an insulating layer 130 are provided to cover the transistor 160.

The transistor 160 formed using a single crystal semiconductor substrate can operate at high speed. Thus, when the transistor is used as a reading transistor, data can be read at a high speed. As treatment prior to formation of the transistor 162 and a capacitor 164, CMP treatment is performed on the insulating layer covering the transistor 160, whereby the insulating layer 128 and the insulating layer 130 are planarized and, at the same time, an upper surface of the gate electrode layer of the transistor 160 is exposed.

The transistor 162 illustrated in FIG. 18A is a top-gate transistor in which an oxide semiconductor is used for a channel formation region. The oxide semiconductor film included in the transistor 162 includes the channel formation region which keeps its crystal component and an amorphous region. Hydrogen is attracted by the amorphous region so that the hydrogen concentration of the channel formation region is reduced. The use of the oxide semiconductor film including such a channel formation region makes it possible to obtain the transistor 162 having extremely small off-state current characteristics Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

An insulating layer 150 formed of a single layer or a stacked of layers is provided over the transistor 162. In addition, a conductive layer 148*b* is provided in a region overlapping with an electrode layer 142*a* of the transistor 162 with the insulating layer 150 positioned therebetween, and the electrode layer 142*a*, the insulating layer 150, and the conductive layer 148*b* form the capacitor 164. That is, the electrode layer 142*a* of the transistor 162 functions as one electrode of the capacitor 164, and the conductive layer 148*b* functions as the other electrode of the capacitor 164. Note that the capacitor 164 may be omitted if a capacitor is not needed. Alternatively, the capacitor 164 may be separately provided above the transistor 162. The conductive layer 148*b* may be formed through the same step as the gate electrode 148*a* of the transistor 162.

An insulating layer 152 is provided over the transistor 162 and the capacitor 164. Further, a wiring 156 is provided over the insulating layer 152 for connecting the transistor 162 to another transistor. Although not illustrated in FIG. 18A, the wiring 156 is electrically connected to an electrode layer 142*b* through an electrode formed in an opening provided in the insulating layer 150, the insulating layer 152, a gate insulating film 146, and the like. Here, the electrode is preferably provided so as to partly overlap with at least an oxide semiconductor layer 144 of the transistor 162.

In FIGS. 18A and 18B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 148*b* of the capacitor 164 is provided to at least partly overlap with the gate electrode 110 of the transistor 160. With such a planar layout, the area occupied by the semiconductor device can be reduced; thus, higher integration can be achieved.

Next, an example of a circuit configuration corresponding to FIGS. 18A and 18B is illustrated in FIG. 18C.

In FIG. 18C, a first wiring (1st line) is electrically connected to a source electrode of the transistor 160. A second wiring (2nd line) is electrically connected to a drain electrode of the transistor 160. A third wiring (3rd line) and one of source and drain electrodes of the transistor 162 are electrically connected to each other, and a fourth wiring (4th line) and the gate electrode of the transistor 162 are electrically connected to each other. The gate electrode of the transistor 160 and the other of the source electrode and the drain electrode of the transistor 162 are electrically connected to one electrode of the capacitor 164. A fifth wiring (5th line) and the other electrode of the capacitor 164 are electrically connected to each other.

The semiconductor device in FIG. 18C utilizes a characteristic in which the potential of the gate electrode of the transistor 160 can be held, and thus enables data writing, holding, and reading of data as follows.

Writing and holding of data are described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as Low-level charge and High-level charge) is given. After that, the potential of the fourth wiring is set to a potential at which the transistor 162 is turned off, so that the transistor 162 is turned off Thus, the charge given to the gate electrode of the transistor 160 is held (storing).

Since the off-state current of the transistor 162 is extremely low, the charge of the gate electrode of the transistor 160 is held for a long time.

Next, reading data is described. By supplying an appropriate potential (reading potential) to the fifth wiring while a predetermined potential (constant potential) is supplied to the first wiring, the potential of the second line varies depending on the amount of charge held in the gate electrode of the transistor 160. This is because in general, when the transistor 160 is an n-channel transistor, an apparent threshold voltage $V_{th\_H}$ in the case where High-level charge is given to the gate electrode of the transistor 160 is lower than an apparent threshold voltage $V_{th\_L}$ in the case where Low-level charge is given to the gate electrode of the transistor 160. Here, an apparent threshold voltage refers to the potential of the fifth wiring which is needed to turn on the transistor 160. Thus, the potential of the fifth wiring is set to a potential $V_0$ between $V_{th\_H}$ and $V_{th\_L}$, whereby charge supplied to the gate electrode of the transistor 160 can be determined. For example, in the case where High-level charge is supplied in writing, when the potential of the fifth wiring is set to $V_0$ ($>V_{th\_H}$), the transistor 160 is turned on. In the case where Low-level charge is supplied in writing, even when the potential of the fifth wiring is set to $V_0$ ($<V_{th\_L}$), the transistor 160 remains in an off state. Therefore, the held data can be read by recognizing the potential of the second wiring.

Note that in the case where memory cells are arrayed to be used, only data of desired memory cells needs to be read. In the case where such reading is not performed, a potential at which the transistor 160 is turned off, that is, a potential smaller than $V_{th\_H}$ may be supplied to the fifth wiring regardless of the state of the gate electrode of the transistor 160. Alternatively, a potential at which the transistor 160 is turned on regardless of a state of the gate electrode, that is, a potential higher than $V_{th\_L}$ may be supplied to the fifth wiring.

The use of a transistor having a channel formation region formed using an oxide semiconductor and having extremely small off-state current in the semiconductor device of this embodiment enables the semiconductor device to hold stored data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

In the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of rewriting data which is a problem in a conventional non-volatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

Embodiment 6

In this embodiment, one embodiment of a structure of a memory device which is different from that of Embodiment 5 will be described.

FIG. 19 is a perspective view of a memory device. The memory device illustrated in FIG. 19 includes a plurality of layers of memory cell arrays (memory cell arrays 3400a to 3400n (n is an integer greater than or equal to 2)) each including a plurality of memory cells as memory circuits in the upper portion, and a logic circuit 3004 in the lower portion which is necessary for operating the memory cell arrays 3400a to 3400n.

FIG. 19 illustrates the logic circuit 3004, the memory cell array 3400a, and the memory cell array 3400b, and illustrates a memory cell 3170a and a memory cell 3170b as typical examples among the plurality of memory cells included in the memory cell array 3400a and the memory cell array 3400b. The memory cell 3170a and the memory cell 3170b can have a configuration similar to the circuit configuration described in the above embodiment, for example.

Figure 20:
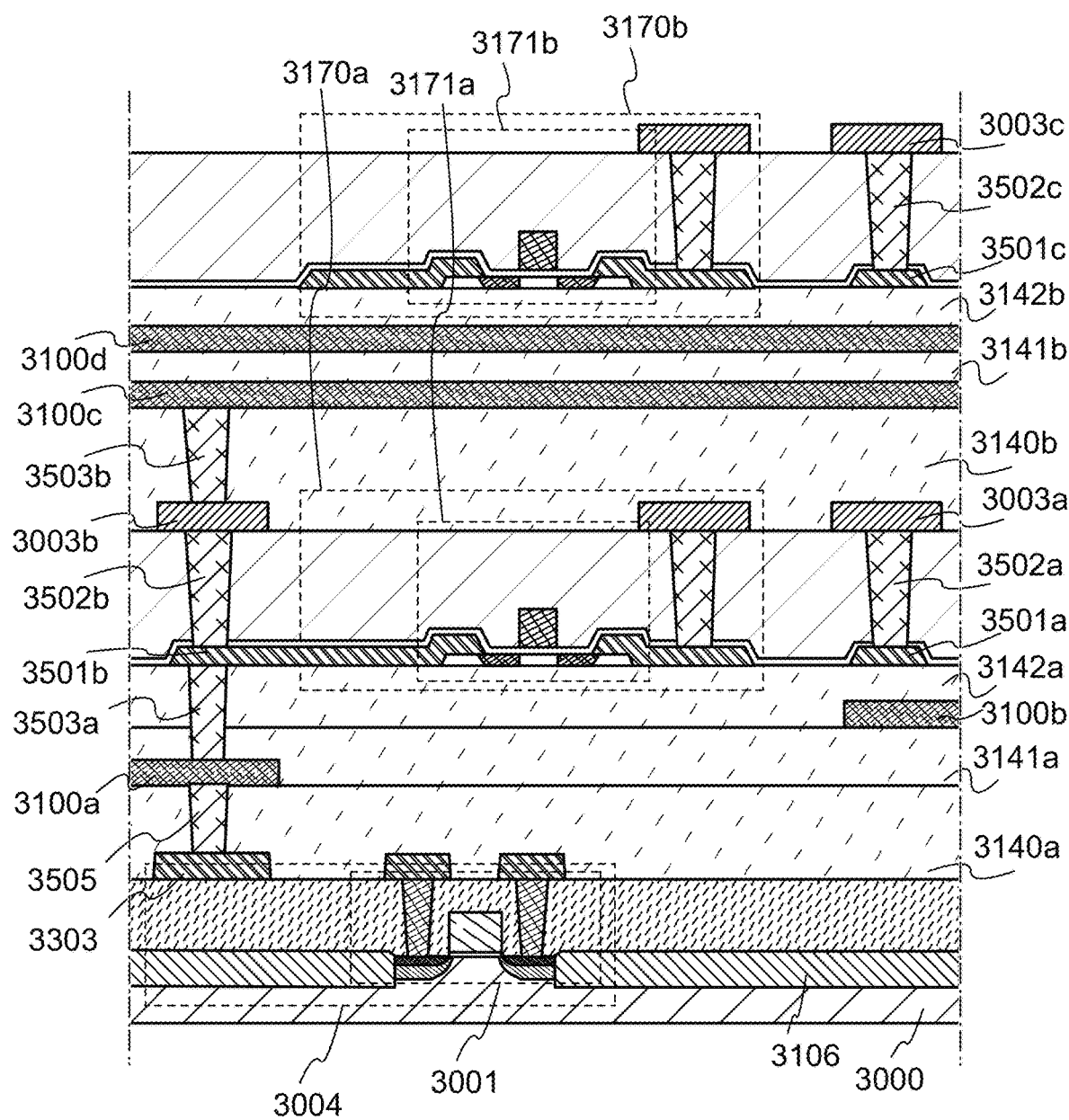
FIG. 20 is a cross-sectional view illustrating one embodiment of a semiconductor device.

Note that a transistor 3171a included in the memory cell 3170a is illustrated in FIG. 20 as a typical example. A transistor 3171b included in the memory cell 3170b is illustrated as a typical example. Each of the transistor 3171a and the transistor 3171b includes an oxide semiconductor film including a channel formation region. The structure of the transistor in which the channel formation region is formed in the oxide semiconductor film is the same as the structure described in any of Embodiments 1 to 3, and thus the description of the structure is omitted.

An electrode 3501a which is formed using the same layer as a gate electrode layer of the transistor 3171a is electrically connected to an electrode 3003a via an electrode 3502a. An electrode 3501c which is formed using the same layer as a gate electrode layer of the transistor 3171b is electrically connected to an electrode 3003c via an electrode 3502c.

The logic circuit 3004 includes a transistor 3001 in which a semiconductor material except an oxide semiconductor is used as a channel formation region. The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a polycrystalline silicon film formed on an insulating surface or in a silicon film of an SOI substrate. Description of the transistor 3001 is omitted because a known structure can be used.

A wiring 3100a and a wiring 3100b are formed between layers in which the transistor 3171a is formed and layers in which the transistor 3001 is formed. An insulating film 3140a is provided between the wiring 3100a and the layer including the transistor 3001. An insulating film 3141a is provided between the wiring 3100a and the wiring 3100b. An insulating film 3142a is provided between the wiring 3100b and the layer including the transistor 3171a.

Similarly, a wiring 3100c and a wiring 3100d are formed between the layers in which the transistor 3171b is formed and the layers in which the transistor 3171a is formed. An insulating film 3140*b* is provided between the wiring 3100*c* and the layer including the transistor 3171*a*. An insulating film 3141*b* is provided between the wiring 3100*c* and the wiring 3100*d*. An insulating film 3142*b* is provided between the wiring 3100*d* and the layer including the transistor 3171*b*.

The insulating films 3140*a*, 3141*a*, 3142*a*, 3140*b*, 3141*b*, and 3142*b* each function as an interlayer insulating film whose surface can be planarized.

The wirings 3100*a*, 3100*b*, 3100*c*, and 3100*d* enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 20, the electrode 3303 can be electrically connected to the wiring 3100*a* via an electrode 3505. The wiring 3100*a* can be electrically connected to an electrode 3501*b* which is formed using the same layer as the gate electrode layer of the transistor 3171*a* via an electrode 3503*a*. In this manner, the wiring 3100*a* and the electrode 3303 can be electrically connected to the source or the drain of the transistor 3171*a*. The electrode 3501*b* can be electrically connected to an electrode 3003*b* via the source or the drain of the transistor 3171*a* and an electrode 3502*b*. The electrode 3003*b* can be electrically connected to the wiring 3100*c* via an electrode 3503*b*.

FIG. 20 illustrates an example in which the electrode 3303 and the transistor 3171*a* are electrically connected to each other via the wiring 3100*a*; however, there is no limitation thereon. The electrode 3303 may be electrically connected to the transistor 3171*a* via either the wiring 3100*b* or the wiring 3100*a* and the wiring 3100*b* or via another electrode without using the wiring 3100*a* or the wiring 3100*b*.

FIG. 20 illustrates an example where two wiring layers, i.e., a wiring layer in which the wiring 3100*a* is formed and a wiring layer in which the wiring 3100*b* is formed are provided between the layers in which the transistor 3171*a* is formed and the layers in which the transistor 3001 is formed; however, the structure is not limited thereto. One wiring layer or three or more wiring layers may be provided between the layer including the transistor 3171*a* and the layer including the transistor 3001.

FIG. 20 illustrates an example where two wiring layers, i.e., a wiring layer in which the wiring 3100*c* is formed and a wiring layer in which the wiring 3100*d* is formed are provided between the layers in which the transistor 3171*b* is formed and the layers in which the transistor 3171*a* is formed; however, the structure is not limited thereto. One wiring layer or three or more wiring layers may be provided between the layer including the transistor 3171*b* and the layer including the transistor 3171*a*.

The method and structure described in this embodiment can be combined as appropriate with any of the methods and structures described in the other embodiments.

Embodiment 7

In this embodiment, a central processing unit (CPU) at least part of which includes the transistor described in any of Embodiments 2 to 4 will be described as an example of a semiconductor device in this embodiment.

Figure 21A:
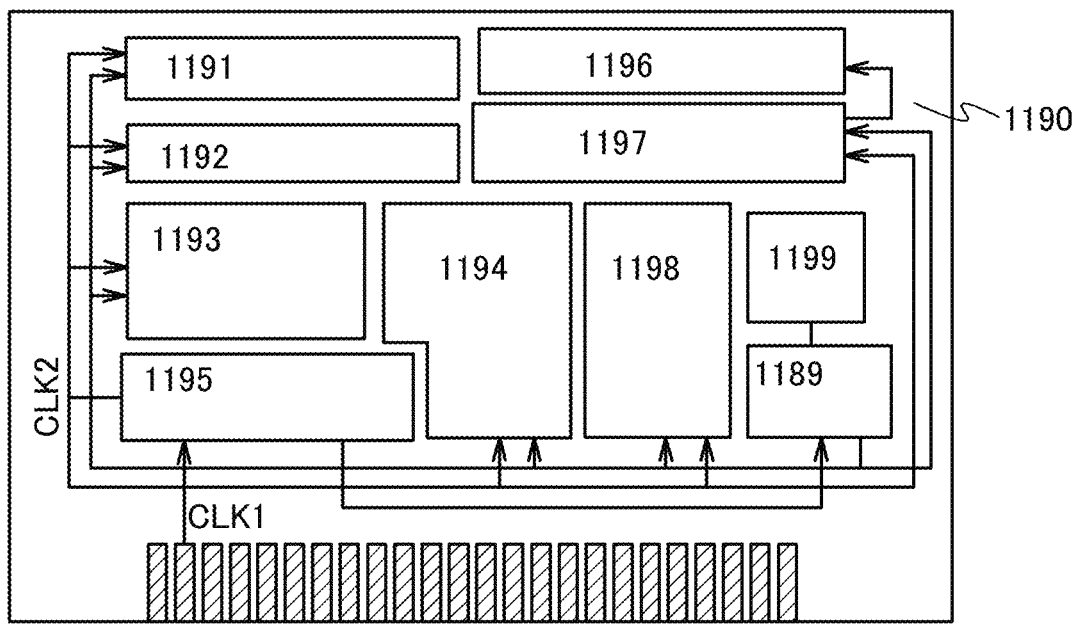
FIGS. 21A to 21C are a block diagram illustrating one embodiment of a semiconductor device and partial circuit diagrams of the block diagram.

FIG. 21A is a block diagram illustrating a specific structure of the CPU. The CPU illustrated in FIG. 21A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU shown in FIG. 21A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 21A, a memory cell is provided in the register 1196. As the memory cell of the register 1196, the memory cell described in Embodiment 5 can be used.

In the CPU illustrated in FIG. 21A, the register controller 1197 selects an operation of holding data in the register 1196 in accordance with an instruction from the ALU 1191. That is, the register controller 1197 selects whether data is held by a logic element which inverts a logic or a capacitor in the memory cell included in the register 1196. When data holding by the logic element which inverts a logic is selected, power supply voltage is supplied to the memory cell in the register 1196. When data holding by the capacitor is selected, the data is rewritten in the capacitor, and supply of power supply voltage to the memory cell in the register 1196 can be stopped.

Figure 21B:
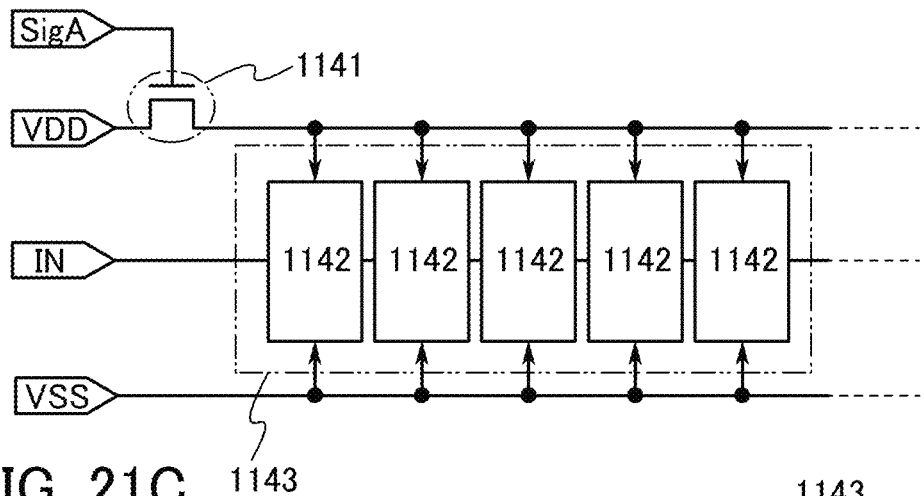
Figure 21C:
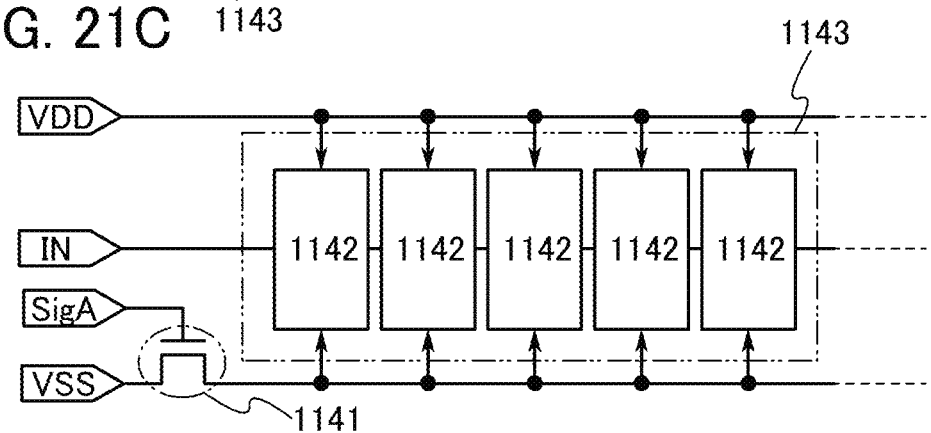

The power supply can be stopped by providing a switching element between a memory cell group and a node to which a power supply potential VDD or a power supply potential VSS is supplied, as illustrated in FIG. 21B or FIG. 21C. Circuits illustrated in FIGS. 21B and 21C are described below.

FIGS. 21B and 21C each illustrate an example of a structure of a memory circuit in which any of the transistors disclosed in Embodiments 2 to 4 is used as a switching element for controlling supply of a power supply potential to a memory cell.

The memory device illustrated in FIG. 21B includes a switching element 1141 and a memory cell group 1143 including a plurality of memory cells 1142. Specifically, as each of the memory cells 1142, the memory cell described in Embodiment 5 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 21B, any of the transistors described in Embodiments 2 to 4 is used as the switching element 1141, and the switching of the transistor is controlled by a signal Sig A supplied to a gate electrode thereof.

Note that FIG. 21B illustrates the structure in which the switching element 1141 includes only one transistor; however, without particular limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 21B, the switching element 1141 may control the supply of the low-level power supply potential VSS.

In FIG. 21C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented by being combined as appropriate with any of the above-described embodiments.

Embodiment 8

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 22A to 22C.

Figure 22A:
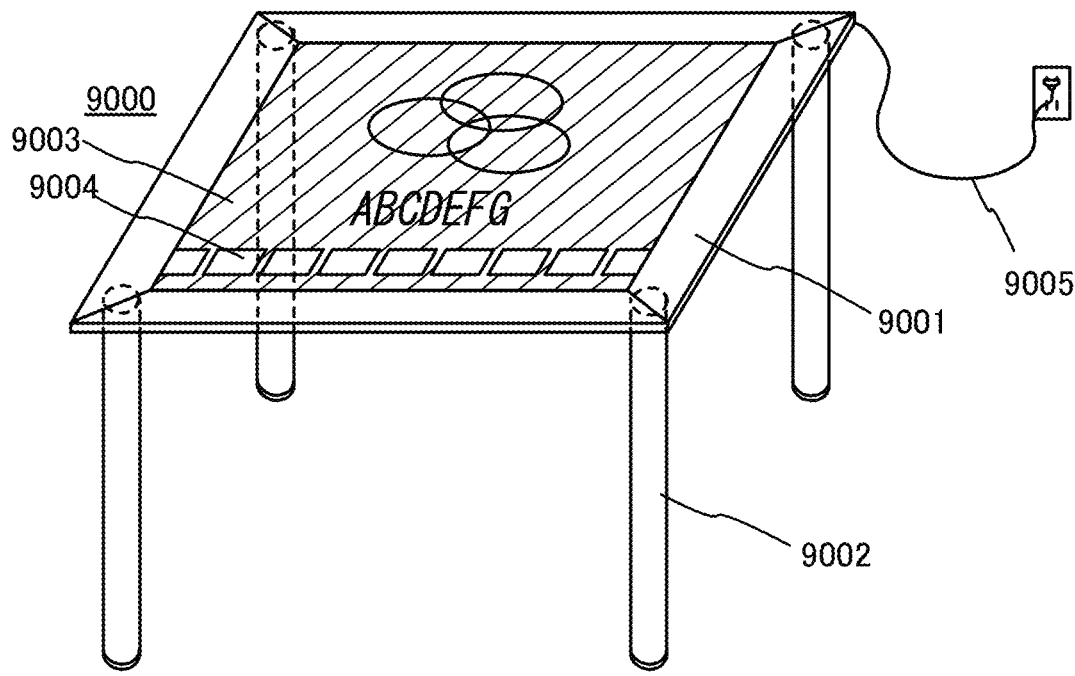
FIGS. 22A to 22C illustrate electronic appliances.
Figure 22B:
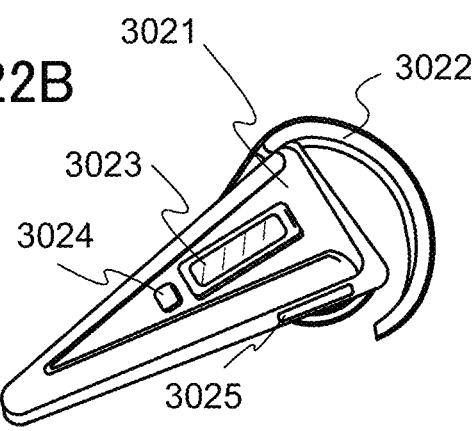
Figure 22C:
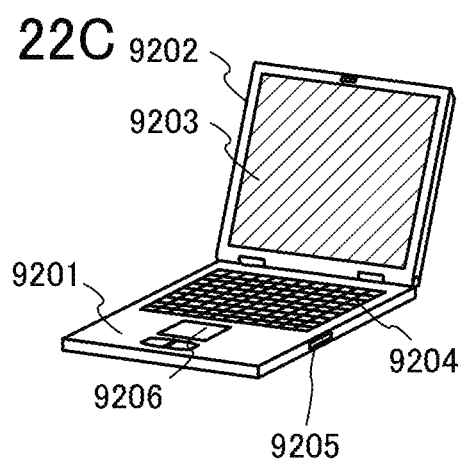

FIG. 22A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in any of Embodiments 1 to 3 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, a semiconductor device having an image sensor can provide the display portion 9003 with a touch input function.

Further, the screen of the display portion 9003 can be placed perpendicular to a floor with a hinge provided for the housing 9001; thus, the table 9000 can also be used as a television device. A television set with a large screen takes up too much space that is available in a small room. However, with a table having a display portion therein, it is possible to make the use of the space in the room.

FIG. 22B illustrates a portable music player, which includes, in a main body 3021, a display portion 3023, a fixing portion 3022 with which the main body is worn on the ear, a speaker, an operation button 3024, an external memory slot 3025, and the like. The transistor described in any of Embodiments 1 to 3 can be used in the display portion 3023. When the transistor described in any of Embodiment 2 to 4 or the memory described in Embodiment 5 is used in a memory or a CPU incorporated in the main body 3021, power consumption of the portable music player can be further reduced.

Furthermore, when the portable music player illustrated in FIG. 22B has an antenna, a microphone function, or a wireless communication function and is used with a mobile phone, a user can talk on the phone wirelessly in a hands-free way while driving a car or the like.

FIG. 22C illustrates a computer which includes a main body 9201 including a CPU, a housing 9202, a display portion 9203, a keyboard 9204, an external connection port 9205, a pointing device 9206, and the like. The computer is manufactured using a transistor manufactured according to one embodiment of the present invention for the display portion 9203. When the CPU described in Embodiment 7, power consumption of the computer can be reduced.

Figure 23A:
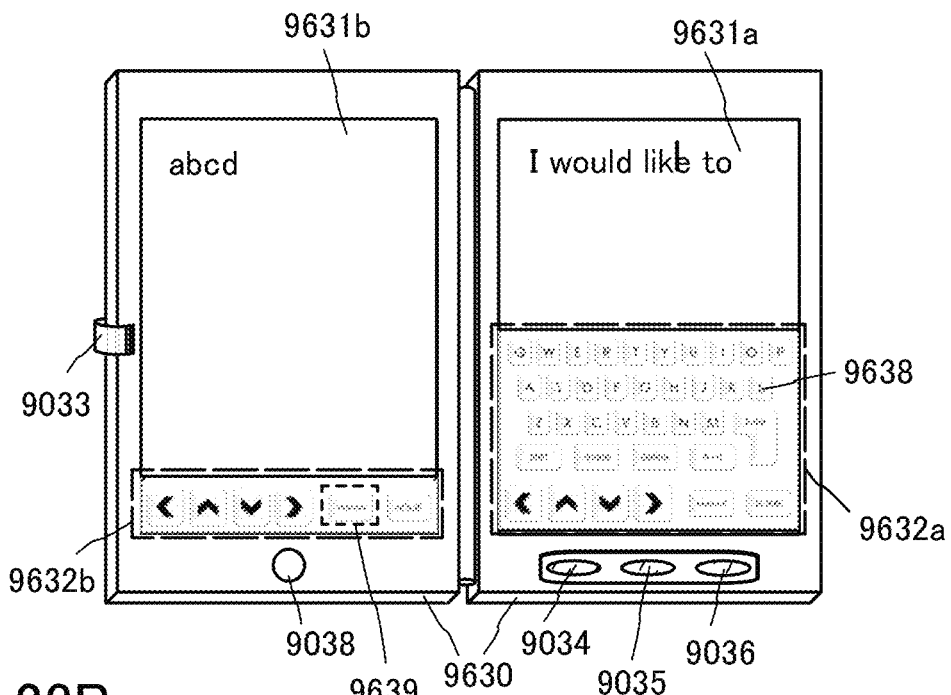
FIGS. 23A to 23C illustrate an electronic appliance.
Figure 23B:
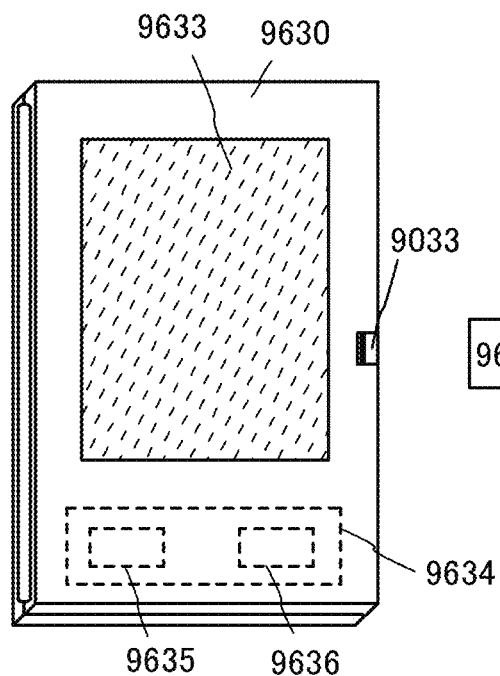

FIGS. 23A and 23B illustrate a tablet terminal that can be folded. In FIG. 23A, the tablet terminal is open (unfolded) and includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 23A and 23B, an SRAM or a DRAM is used as a memory element for temporarily storing image data. For example, the semiconductor device described in Embodiment 5 or Embodiment 6 can be used as a memory element. The use of the semiconductor device described in the above embodiment for the memory element enables writing and reading of data to be performed at high speed, enables data to be held for a long time, and enables power consumption to be sufficiently reduced.

A touch panel area 9632a can be provided in a part of the display portion 9631a, in which data can be input by touching displayed operation keys 9638. The transistor described in any of Embodiments 1 to 3 can be used in the display portion 9631a and the display portion 9631b. Note that FIG. 23A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 23A, one embodiment of the present invention is not limited to this example. The display portion 9631a and the display portion 9631b may have different areas or different display quality. For example, one of them may be a display panel that can display higher-definition images than the other.

FIG. 23B illustrates the tablet terminal closed (folded), which includes the housing 9630, a solar battery 9633, a charge/discharge control circuit 9634, a battery 9635, and a DCDC converter 9636. Note that FIG. 23B shows an example of a structure of the charge/discharge control circuit 9634 that includes the battery 9635, the DCDC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 23A and 23B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, supplies electric power to a touch panel, a display portion, an image signal processor, and the like. The solar battery 9633 can be provided on one or both surfaces of the housing 9630, so that the battery 9635 can be charged efficiently. When a lithium ion battery is used as the battery 9635, there is an advantage of downsizing or the like.

Figure 23C:
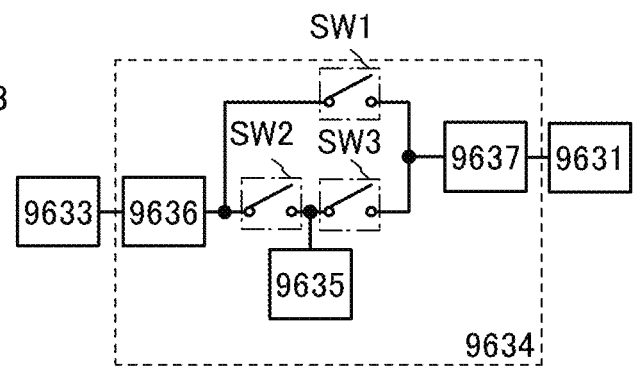

The structure and operation of the charge/discharge control circuit 9634 illustrated in FIG. 23B are described with reference to a block diagram in FIG. 23C. The solar battery 9633, the battery 9635, the DCDC converter 9636, a converter 9637, switches SW1 to SW3, and the display portion 9631 are illustrated in FIG. 23C, and the battery 9635, the DCDC converter 9636, the converter 9637, and the switches SW1 to SW3 correspond to the charge/discharge control circuit 9634 illustrated in FIG. 23B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and the switch SW2 is turned on so that charge of the battery 9635 may be performed.

Here, the solar battery 9633 is described as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Figure 24A:
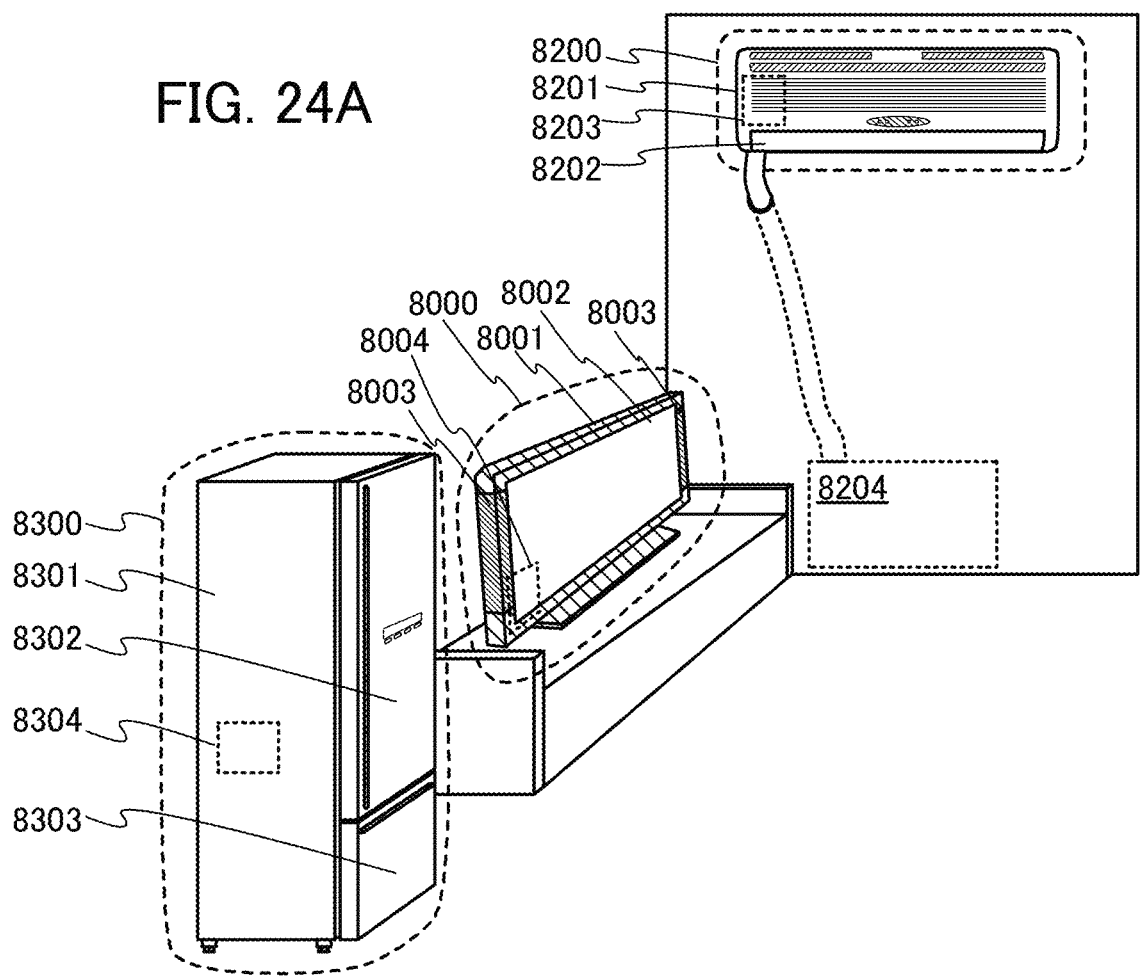
FIGS. 24A to 24C illustrate electronic appliances.

In a television set 8000 in FIG. 24A, a display portion 8002 is incorporated in a housing 8001. The display portion 8002 displays an image and a speaker portion 8003 can output sound. Any of the transistors described in Embodiments 1 to 4 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. Any of the memories and the CPU described in Embodiments 5 to 7 can be used for the television set 8000.

In FIG. 24A, an air conditioner which includes an indoor unit 8200 and an outdoor unit 8204 is an example of an electric appliance in which the CPU of Embodiment 7 is used. Specifically, the indoor unit 8200 includes a housing 8201, an air outlet 8202, a CPU 8203, and the like. Although the CPU 8203 is provided in the indoor unit 8200 in FIG. 24A, the CPU 8203 may be provided in the outdoor unit 8204. Alternatively, the CPU 8203 may be provided in both the indoor unit 8200 and the outdoor unit 8204. Since the CPU of Embodiment 7 is formed using an oxide semiconductor, an air conditioner which has excellent heat resistance property and high reliability can be provided with the use of the CPU.

In FIG. 24A, an electric refrigerator-freezer 8300 is an example of an electric appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 24A, the CPU 8304 is provided in the housing 8301. When the CPU described in Embodiment 7 is used as the CPU 8304 of the electric refrigerator-freezer 8300, power saving can be achieved.

Figure 24B:
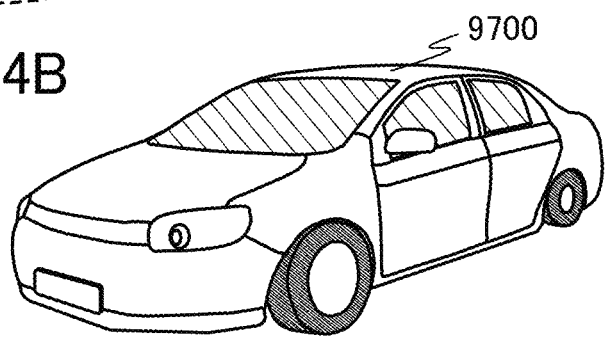
Figure 24C:
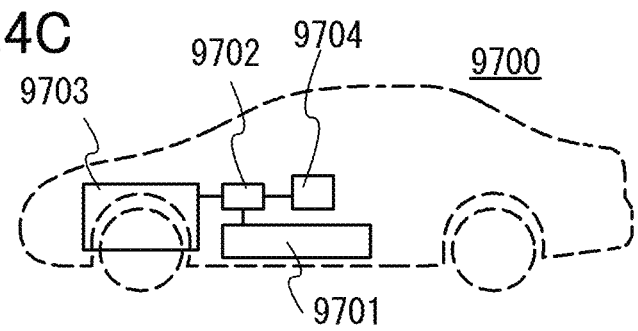

FIG. 24B illustrates an example of an electric vehicle which is an example of an electric appliance. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the CPU described in Embodiment 7 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented by being combined as appropriate with any of the other embodiments.

This application is based on Japanese Patent Application serial no. 2012-013730 filed with Japan Patent Office on Jan. 26, 2012, and Japanese Patent Application serial no. 2012-014507 filed with Japan Patent Office on Jan. 26, 2012, the entire contents of which are hereby incorporated by reference.

What is claimed is:

1. A light-emitting device comprising a pixel, the pixel comprising:
    a transistor comprising:
        a gate electrode;
        a first oxide semiconductor layer;
        a source electrode in contact with the first oxide semiconductor layer; and
        a drain electrode in contact with the first oxide semiconductor layer;
    a capacitor comprising:
        a first conductive layer; and
        a second oxide semiconductor layer over the first conductive layer;
    a first insulating layer over the second oxide semiconductor layer;
    a second conductive layer over the first insulating layer, the second conductive layer being electrically connected to the second oxide semiconductor layer through an opening in the first insulating layer;
    an interlayer insulating layer covering the transistor, the capacitor, and the second conductive layer;
    a planarization insulating layer over the interlayer insulating layer;
    a light-emitting element comprising a pixel electrode; and
    a color filter layer between the interlayer insulating layer and the planarization insulating layer,
    wherein the pixel electrode is electrically connected to the transistor through an opening in the interlayer insulating layer and the planarization insulating layer,
    wherein the color filter layer does not overlap with the gate electrode and the second oxide semiconductor layer, and
    wherein the pixel electrode is isolated from the second conductive layer.

2. The light-emitting device according to claim 1, wherein each of the first oxide semiconductor layer and the second oxide semiconductor layer comprises indium, gallium, and zinc.

3. The light-emitting device according to claim 1,
    wherein the first oxide semiconductor layer comprises a first region and a second region,
    wherein a channel formation region of the transistor is between the first region and the second region, and
    wherein the first region and the second region have lower resistance than the channel formation region.

4. The light-emitting device according to claim 1, wherein the color filter layer is in direct contact with the interlayer insulating layer and the planarization insulating layer.

5. The light-emitting device according to claim 1, wherein a concentration of chlorine in the first oxide semiconductor layer is lower than or equal to $2 \times 10^{18}$ atoms/cm$^3$.

6. A light-emitting device comprising a pixel, the pixel comprising:
    a transistor comprising:
        a gate electrode;
        a first oxide semiconductor layer;
        a source electrode in contact with the first oxide semiconductor layer; and
        a drain electrode in contact with the first oxide semiconductor layer;

a capacitor comprising:
  a first conductive layer; and
  a second oxide semiconductor layer over the first conductive layer;
a first insulating layer over the second oxide semiconductor layer;
a second conductive layer over the first insulating layer, the second conductive layer being electrically connected to the second oxide semiconductor layer through an opening in the first insulating layer;
an interlayer insulating layer covering the transistor and the capacitor;
a planarization insulating layer over the interlayer insulating layer;
a light-emitting element comprising a pixel electrode; and
a color filter layer between the interlayer insulating layer and the planarization insulating layer,
wherein the pixel electrode is electrically connected to the transistor through an opening in the interlayer insulating layer and the planarization insulating layer,
wherein the color filter layer does not overlap with the gate electrode and the second oxide semiconductor layer, and
wherein the pixel electrode is electrically isolated from the second conductive layer.

7. The light-emitting device according to claim 6, wherein each of the first oxide semiconductor layer and the second oxide semiconductor layer comprises indium, gallium, and zinc.

8. The light-emitting device according to claim 6,
wherein the first oxide semiconductor layer comprises a first region and a second region,
wherein a channel formation region of the transistor is between the first region and the second region, and
wherein the first region and the second region have lower resistance than the channel formation region.

9. The light-emitting device according to claim 6, wherein the color filter layer is in direct contact with the interlayer insulating layer and the planarization insulating layer.

10. The light-emitting device according to claim 6, wherein a concentration of chlorine in the first oxide semiconductor layer is lower than or equal to $2\times10^{18}$ atoms/cm$_3$.

* * * * *